United States Patent [19]
Baker et al.

[11] 4,144,589
[45] Mar. 13, 1979

[54] PRECHARGED DATA LINE DRIVER

[75] Inventors: Lamar T. Baker, Manhattan Beach; George K. Tu, Rolling Hills, both of Calif.

[73] Assignee: Xerox Corporation, Stamford, Conn.

[21] Appl. No.: 813,999

[22] Filed: Jul. 8, 1977

[51] Int. Cl.$^2$ ............................................. G11C 11/40
[52] U.S. Cl. ................................... 365/203; 307/238; 365/189
[58] Field of Search ....................... 365/203, 182, 189; 307/238

[56] References Cited

U.S. PATENT DOCUMENTS

| | | | |
|---|---|---|---|
| 3,760,381 | 9/1973 | Yao | 365/203 |
| 3,778,782 | 2/1978 | Kitagawa | 365/203 |
| 4,061,999 | 12/1977 | Proebsting | 365/203 |
| 4,063,118 | 12/1977 | Nishimura | 365/203 |

Primary Examiner—Terrell W. Fears

Attorney, Agent, or Firm—Ronald L. Taylor

[57] ABSTRACT

For use in a microprocessor on a single semiconductor chip, circuitry responsive to a timing signal and a data signal for discharging a precharged data line to correspond to the data to be transmitted on the data line. First and second enhancement-type field effect devices are connected in series with the drain of the first device being connected to the data line and the source of the second device being connected to a source voltage. The gate of one of the field effect devices provides an input for the timing signal. The gate of the remaining field effect device provides an input for the data signal. A depletion-type field effect device has its source and gate coupled to the series connection point and its drain connected to a drain voltage source. The depletion-type field effect device prevents a charge redistribution from the data line to the series field effect devices when these devices are not discharging the line.

9 Claims, 93 Drawing Figures

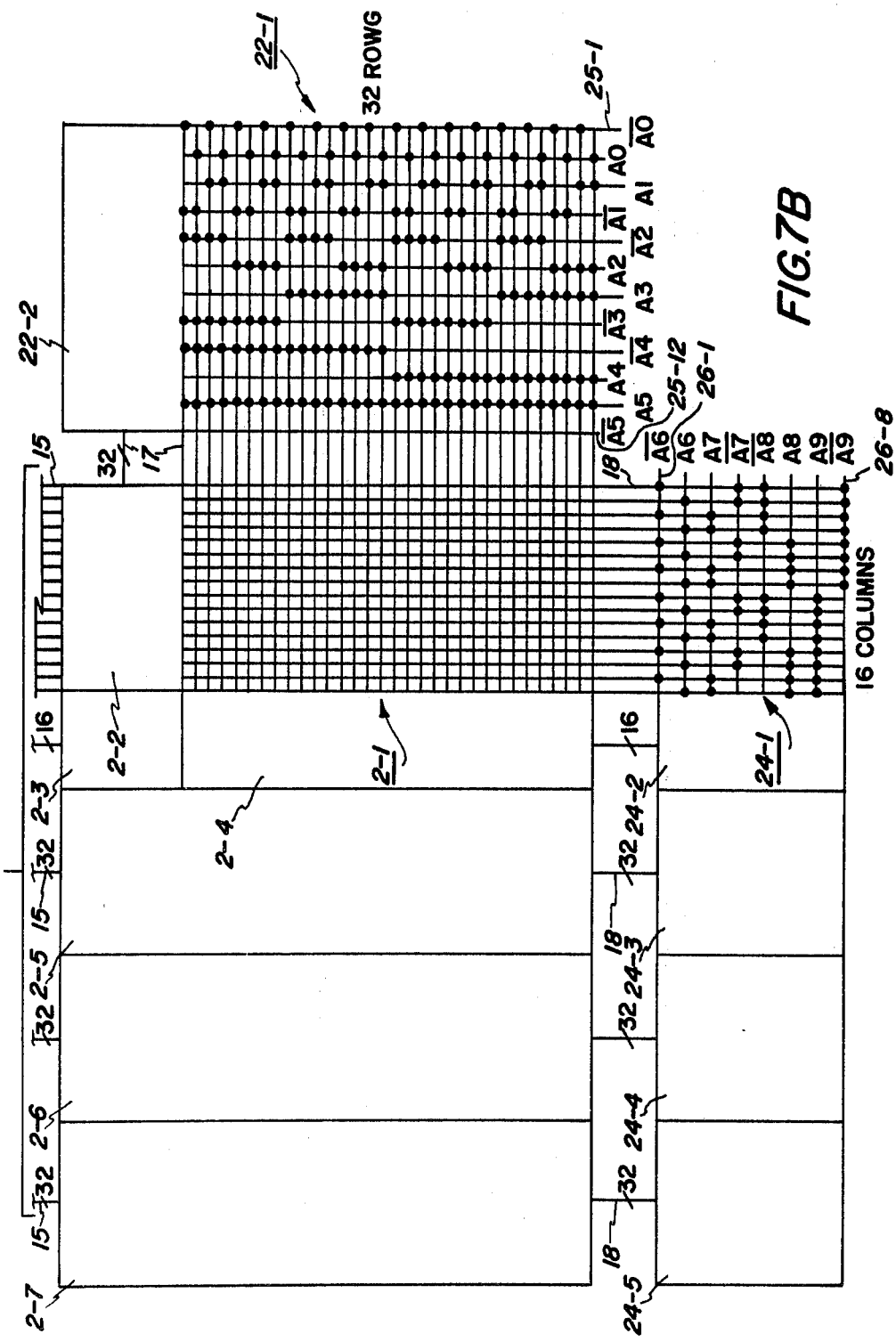

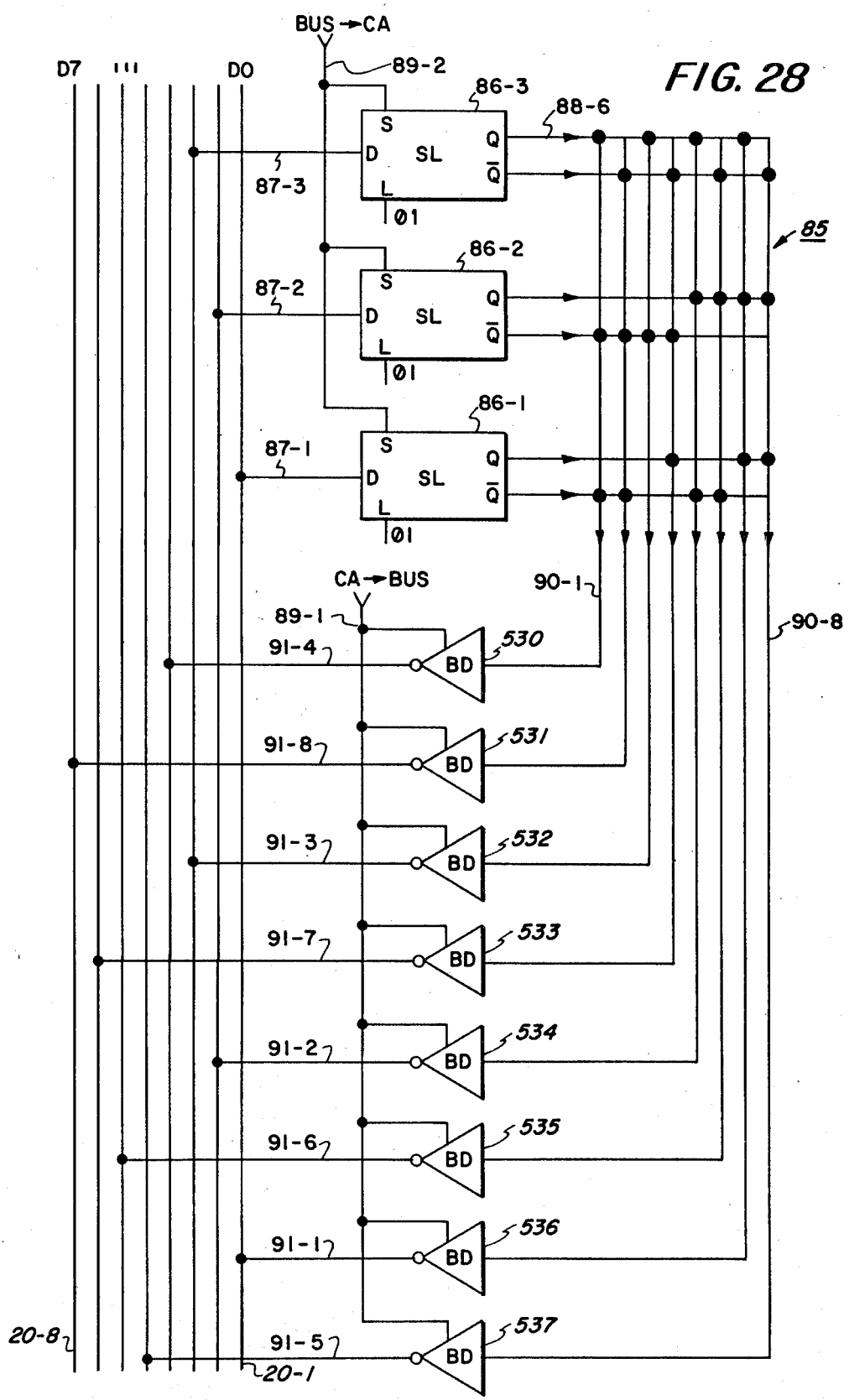

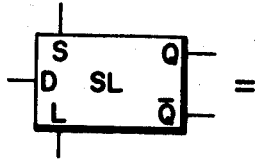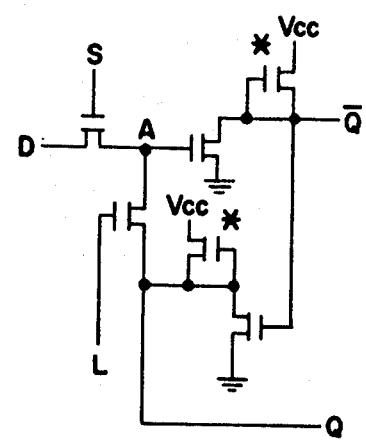
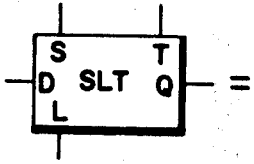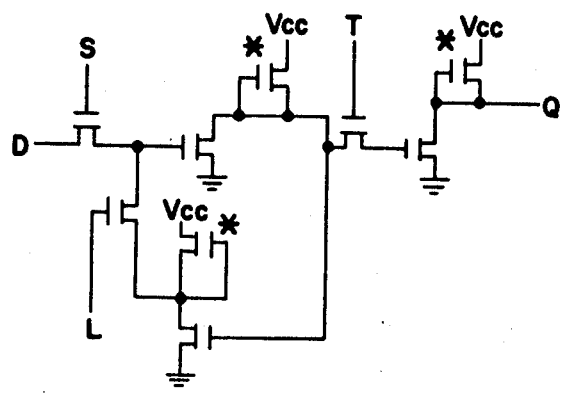
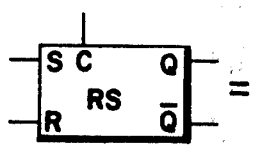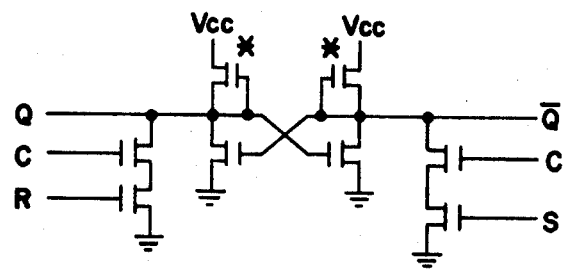
FIG. 46

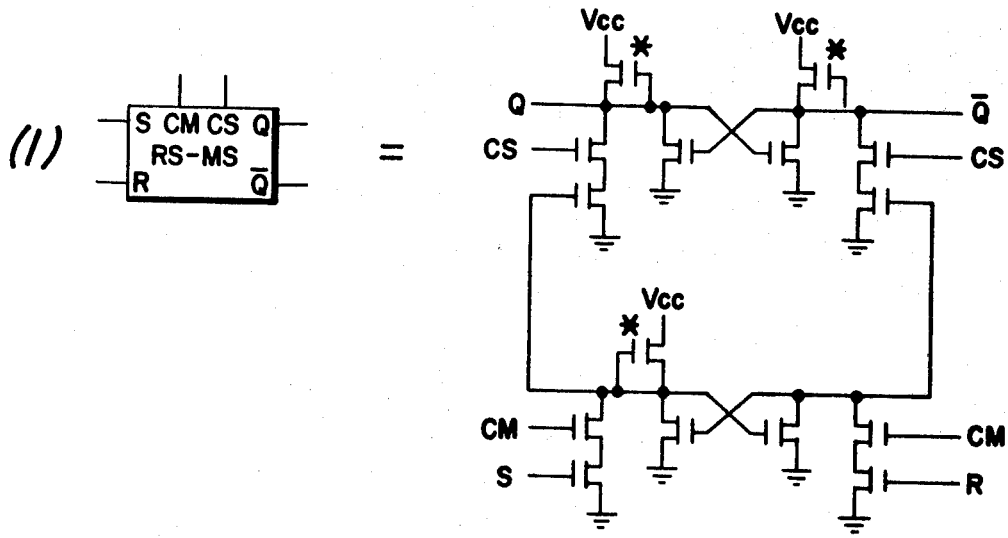
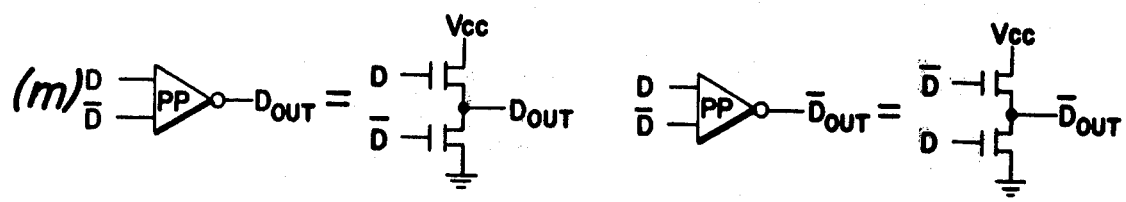
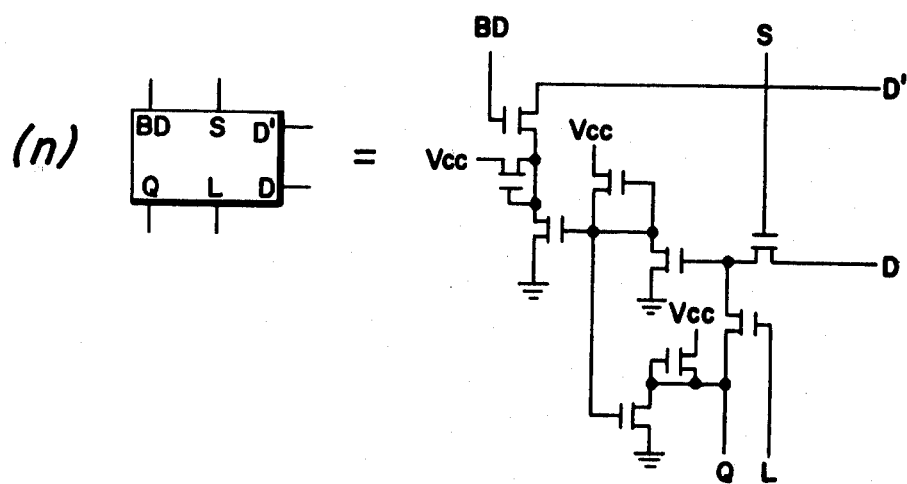
FIG. 46

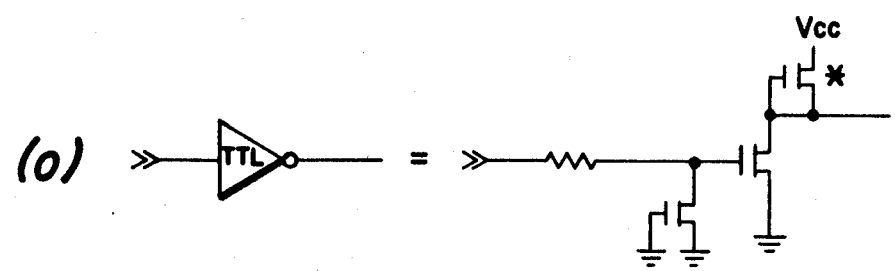
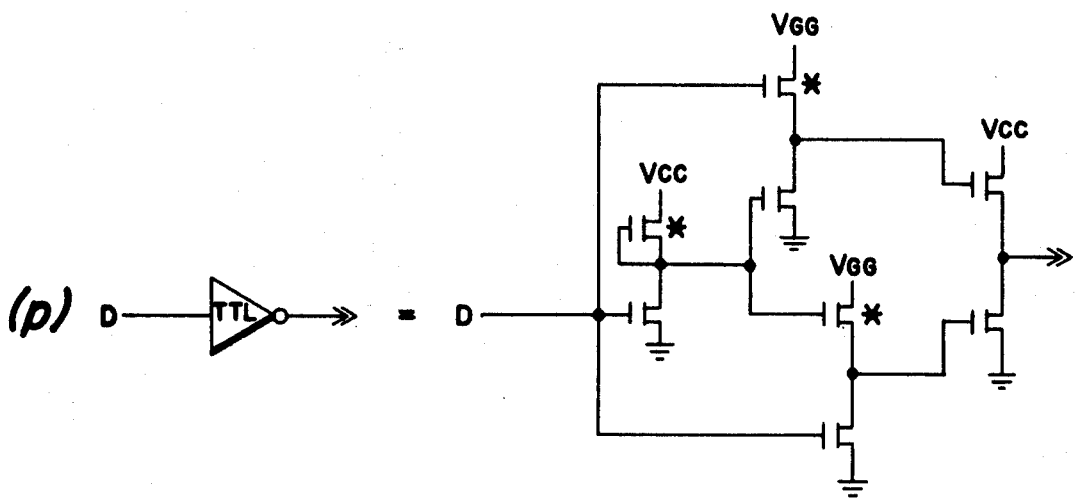
FIG.46

PRECHARGED DATA LINE DRIVER

TABLE OF CONTENTS

Subject
  Background of the Invention
  Summary of the Invention
  Brief Description of the Drawings
  Detailed Description of the Preferred Embodiment
  The System Block Diagram
  Microprocessor Unit Pin Designations
  Clock and Timing Signals
  System Timing
  The ROM
  The Stack Area
  The RAM Area
  Elimination of Race Conditions in the RAM
  The ALU and Control
  Time Slot End Predictor
  The CROM
  Bit Manipulation Scheme
  Data Pad Input/Output
  Precharged Data Line Driver
  Bus Control
  Test Circuitry
  Split PLA Control
  The S-Counter
  Details of Logic Blocks
  The MOS/LSI Chip
  The Chip Test Functions
  The instruction Set

BACKGROUND OF THE INVENTION

A. Field of the Invention

This invention relates to line drivers, in general, and to a line driver which is responsive to a timing signal and a data signal for discharging a precharged data line to correspond to the data to be transmitted on the data line while at the same time preventing a charge redistribution from the data line to the circuitry used to discharge the data line when this circuitry is not discharging the line.

B. Description of the Prior Art

In many prior art microprocessors, use is made or precharged data lines. In one application, a data bus is precharged in some manner during a particular time interval and then selectively discharged in response to a data signal at some other time. In an additional application, bit sense lines in a RAM are precharged and then selectively discharged by data signals to the read-write circuitry.

One of the most pressing problems in implementing a microprocessor on a chip incorporating the precharged bus lines and the precharged bit sense lines is that of charge redistribtuion from these lines to the devices which are used to discharge the lines.

SUMMARY OF THE INVENTION

The subject invention provides circuitry responsive to a timing signal and a data signal discharging a precharged data line to correspond to the data to be transmitted on the data line while at the same time preventing a charge redistribution from the data line to the circuitry used for discharging the line while the circuitry is not discharging the line.

In a preferred embodiment, first and second enhancement-type field effect devices are connected in series with the drain of the first device being connected to the data line and the source of the second device being connected to a source voltage. The gate of one of the devices provides an input for the timing signals and the gate of the remaining device provides an input for the data signal. A depletion-type field effect device has its source and gate coupled to the series connection of the first and second devices and its drain connected to a drain voltage. The depletion device prevents a charge redistribution from the data line to the first and second field effect devices when these devices are not discharging the data line.

It is an object of the present invention to provide circuitry responsive to a timing signal and a data signal for discharging a precharged data line to correspond to the data to be transmitted on the data line while at the same time preventing a charge redistribution from the data line to the means used to discharge the line when the discharging means is not discharging the line.

It is another object of the present invention to provide a precharged data line driver, as described and claimed herein, for use with a precharged data bus.

It is still another object of the present invention to provide a precharged data line driver as described and claimed herein for use with bit sense lines of a RAM.

It is yet another object of the present invention to provide precharged data line drivers as described and claimed herein for use in a microprocessor or a semiconductor chip and having a precharged data bus and precharged bit sense lines.

These and other objects, features, and advantages of the present invention will be more fully realized and understood from the following detailed description, when taken in conjunction with the accompanying drawings.

BRIEF DESCRIPTION OF THE DRAWINGS

The novel features believed characteristic of the invention are set forth in the appended claims. The invention itself, however, as well as other features and advantages thereof, will best be understood by reference to the detailed description which follows, read in conjunction with the accompanying drawings wherein;

FIG. 28 is a detailed logic diagram of the CROM area.

DESCRIPTION OF THE PREFERRED EMBODIMENT

THE SYSTEM BLOCK DIAGRAM

Figure 1:
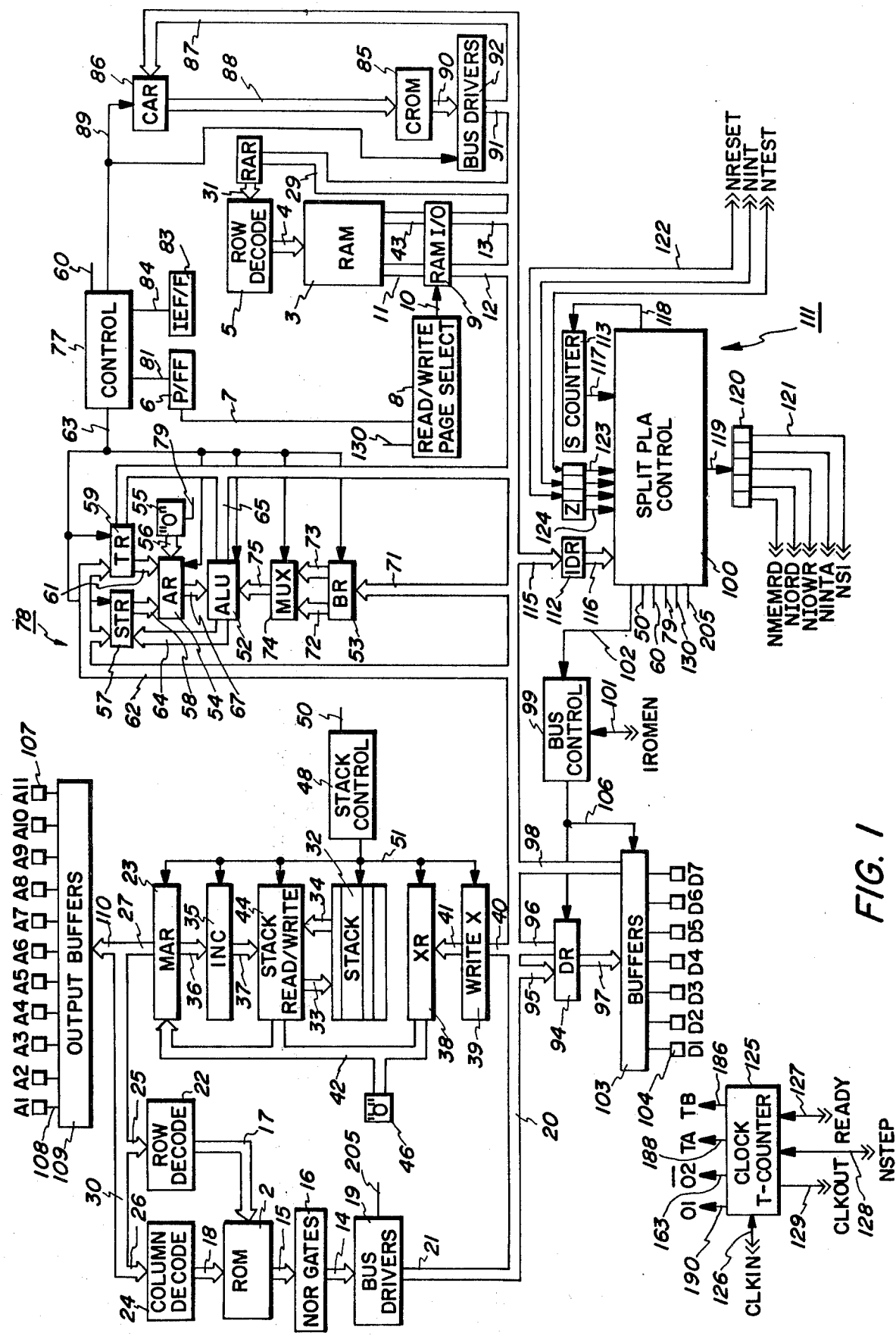
FIG. 1 is a partial block diagram of a preferred embodiment of the invention.

A block diagram of the microcomputer system implemented on the chip is shown in FIG. 1. The data processing system is centered around a ROM (read-only-memory) 2 and a RAM (random-access-memory) 3. The ROM 2 contains 1024 instruction words of 8 bits per word, and is used to store all or part of the application programs which operates the system. The RAM 3 contains 256 memory cells software organized as two 16-digit groups with 8 bits per digit. Thus, in the preferred embodiment each digit is equal to a byte. The RAM functions as the working registers of the system, although it is not organized in the hardware sense as separate registers as would be true if shift registers or the like were used for this purpose. The RAM is addressed by a word address on lines 4, i.e., one out of 16 word lines in the RAM is selected, by means of a RAM row decodd circuit 5. One of 2 "pages," P0 or P1, of the RAM is selected by a page select flip/flop (P F/F) 6 which produces a page select signal or leads 7. This signal is applied to combined read/write page select circuitry 8. RAM input/output circuitry (RAMI/O) 9 responds to a signal on lines 10 to carry out the page select operation. For a given word address on lines 4 and page address on lines 10, eight specific bits are accessed and read out on RAM I/O lines 11 (for page p0) and 43 (for page P1), via input/output circuitry 9, to RAM read lines 12 and 13 respectively. Alternatively, data is written into the RAM 3 from the data bus 20 on lines 12 and 13 via the input/output circuitry 9 and the lines 11 and 43 respectively.

The ROM 2 produces an 8-bit instruction word on NOR output lines 14 as the instruction word passes out of the ROM along leads 15 and through NOR gate array 16 (the bits of the instruction word being labeled D0–D7, D7 being the most significant bit) during each instruction cycle. The instruction is selected from 8192 bit locations in the ROM, organized into 1024 words containing 8 bits each. The ROM is divided into eight 16-bit columns with each column being dedicated to producing one of the eight bits (D0–D7) of the instruction word. To address an instruction in the ROM requires a one-of-64 ROM row address on the lines 17 and a one-of-16 ROM column address on lines 18 to each of the eight columns. On lines 15 the output of each column is directed into one of eight dedicated 16-to-1 NOR gates 16. The outputs of the NOR gates produce the instruction word on lines 14. The instruction word is then placed on the data bus 20 by bus drivers 19 along lines 21. The ROM row address on lines 17 is generated in a row decoder 22. The ROM row address is a 12 bit address produced in a memory address register (MAR) 23. The ROM column address on lines 18 is generated in a column decoder 24. The ROM column address is an 8-bit address produced in the MAR 23. The ROM row decoder 22 and the ROM column decoder 24 receives a 12-bit and an 8-bit encoded address respectively on lines 25 and 26 from MAR lines 27 via the address bus 30.

A RAM address register (RAR) 28, containing 4 sample and latch devices, receives from the data bus 20 a 4-bit encoded address comprising the least 4 significant bits of an instruction word on line 29. The 4-bit encoded address is then put into the RAM row decode 5 via lines 31.

A stack 32, having four 12-bit registers organized as a push-down stack, is associated with the MAR 23 to serve as temporary storage for the return word address during subroutine and interrupt operations. A 12-bit address is stored in the stack 32, via lines 33 when a call address is stored in the stack 32, via lines 33 when a call instruction is initiated so that this same address may be loaded back into the MAR 23 via lines 34 when execution of the subroutine or the interrupt which begins at the call location has been completed.

A 12bit incrementer (INC) 35 takes a present address on lines 36 from MAR 23 and increments it to generate a next address on lines 37. A 12-bit transfer register (X REG) 38 is used to transfer information from the data bus 20 to the address bus 30 via the MAR 23. Write circuitry (WRITE X) 39 is provided to transfer data from the data bus 20 on lines 40 to the X REG 38 on lines 41. The information in the X REG 38 is transferred to the MAR 23 via lines 42. Stack read/write circuitry 44 is provided to transfer data between the INC 35, on lines 37 to STACK 44 on lines 33 and 34, and the MAR 23 on lines 42. A reset signal 46 is provided to the MAR 23 via lines 42 in order to start memory address generation from the beginning or location "zero". The MAR, INC, STACK read/write, STACK, X REG and WRITE X are all controlled via lines 51 by stack control circuitry 48 which receive input from the Split PLA Control 100 on lines 50. The Stack Control circuitry 48 interprets commands from the PLA control 100 which determine whether branch-and-call-on-status, interrupt, or subroutine operations are performed; causes loading of an instruction word into the MAR; controls transfer of bits to the subroutine or buffer registers and back; controls updating of the MAR, etc.

Numerical data and other information is operated upon in the system by an arithmetic and logic unit (ALU) 52. The ALU is an eight-bit parallel logic network used in the execution of the system instructions. Certain other registers are provided as part of the ALU subsystem 78 and will be described in greater detail hereinafter. An A-Register (A-Reg) 54 stores one of the operands for ALU operations. This register may be cleared at any time through the use of a "0" reset 55 whose output enters the A-Reg 54 via lines 56. As will be explained hereinafter the A-Register is always automatically cleared during a machine cycle time slot-X1. The A-Reg receives its input from either a status register (ST Ref) 57 via lines 58 or a temporary register (Temp-Reg) 59 via lines 61. The ST-Reg 57 stores the status indications resulting from an arithmetic or logic operation. The ST-Reg 57 also contains the interrupt enable (IE) and page (P) flip/flop status indicators. The ST-Reg receives its information either from the data bus 20 via lines 62 or from the ALU 52 via lines 64. The output of the ST-Reg may be placed on the data bus via lines 58, the A-Reg, lines 67, the ALU, line 65, and lines 66. The Temp-Reg 59 holds data to aid in accomplishing ALU operations. The Temp-Reg receives data from the data bus via lines 62 and outputs data to the data bus via lines 66. The B-Register 53 is the second operand for the ALU and receives information from the data bus via lines 71. The B-Reg outputs its contents via lines 72 and the complement of its contents via lines 73 into a multiplexer 74 which selects the state of the contents to be placed into the ALU via lines 75. All the elements of the ALU subsystem 78 receive control signals from a control 77 via lines 76. The control 77 in turn receives control signals from the split PLA control 100 via lines 60. It should be noted however that the "0" reset 55 receives its control signal directly from the PLA control via line 79. The control 77 also provides control signals to the Page F/F via line 81 and an interrupt enable flip/flop (IEF/F) 83 via line 84.

A condition decode ROM (CROM) 85 decodes a condition field of an instruction. This is accomplished in the following manne. A condition code comprising the three least significant bits of an instruction word is received by a CROM address register (CAR) 86 from the data bus 20 via lines 87. The introduction of the condition code into the CROM via lines 88 is controlled by control 77 via lines 89. The CROM generates a condition mask, as an 8-bit word, which is put onto the data bus via lines 90 and 91, and bus drivers 92, which are controlled by control 77 via lines 93.

A data register (D-Reg) 94 is used to capture data during a memory-read via lines 95 or input operation via lines 96 or to store data to be driven off the chip via lines 97 during an output operation. The D-Reg is under the control of a bus control 99 via lines 101. The bus control is in turn controlled by PLA control 100 via lines 102.

Transfer of data onto and off the chip takes place at the data pins 104 which are connected to the I/O buffers 103 via lines 105. During a transfer operation the I/O buffers are controlled by the bus control via lines 106.

The MAR 23, as stated before, can address 4096 memory locations. The internal ROM 2 occupies the address space 0000 to 1023 words. External memory devices occupying the address space 1024 to 4095 words may be employed if required. The external memory receives address words on address pins 107 via lines 108, output buffers 109, and lines 110 from the address bus 30.

The system control 111 consists basically of an instruction decode register (ID-Reg) 112, an S-counter 113, and a PLA control 100. The ID-Reg 112 receives operational code (Op-Code) information during each instruction fetch via lines 115 from the data bus. The S-counter 113 contains the basic machine-state information. The PLA control 100 receives data from the ID Reg via lines 116 and machine-state information from the S-counter via lines 117. The PLA control then performs combinational logic that generates internal control signals, external interface signals, and next state feedback information to the S-counter. The internal control signals appear on control lines 50, 60, 79, 102, 130 and 205. The feedback to the S-counter appears on lines 118.

Output external interface signals eminate from the PLA control on lines 119, are placed into 5 flip-flop output circuits 120. Each one of the flip-flop circuis produces an external interface signal at its output 121. The mnemonics for these five output signals are NMEMRD, NIORD, NIOWR, NINTA, and NSl. The NMEMRD (Not-Memory-Read) signal is used to gate external memory onto the data bus during a memory-read operation. The NIORD (Not-Input/Output-Read) signal is used to gate external input devices onto the data bus during an input operation. The NIOWR (Not-Input/Output-Write) signal is used as a write-strobe to external output devices; that is, it indicates during an output operation, that data is available from the system. The NINTA (Not-Interrupt Acknowledge) signal indicates by NINTA equals logic 0 that an interrupt has been accepted. The NSl (not-Sl-Cycle) signal indicates to a support system that an opcode fetch cycle is commencing. This may be used, for example, in conjunction with IROMEN to force the execution of a support-system supplied instruction. The IROMEN is an input interface signal received on line 101 for receipt by bus control 99. IROMEN=0 disables internal ROM thereby allowing external memory to be substituted in the 0000 to 1023 address range.

Input interface signals are received on lines 122, placed into three input latch circuits 123, for receipt by the PLA control via lines 124. The mnemonics for the input interface signals are NRESET, NINT, and NTEST. When the NRESET (Not-Reset) signal is at logic 0, it forces the data system into a "reset" state.

During "reset" the P F/F 6 is reset to "0" and the IE F/F 83 is reset disabling interrupts. During "reset" all control lines are in the inactive state. When NRESET becomes "1", the data system accesses location X '0000'. The NINT (Not-Interrupt) signal is used to interrupt the normal operation of the data system. An interrupt is accepted only if the following are true: NINT = "0", IE F/F 83 is set, and the data system has completed executing the current instruction. When interrupted, the data system saves the current memory address, disables interrupts (resets the IE F/F), generates an interrupt-acknowledge stroke (NINTA), and forces a jump to memory location X 'OFF'. The NTEST (Not-Test) signal is used to dump the contents of the internal ROM 2 and is used by support systems for test purposes.

Figure 3:
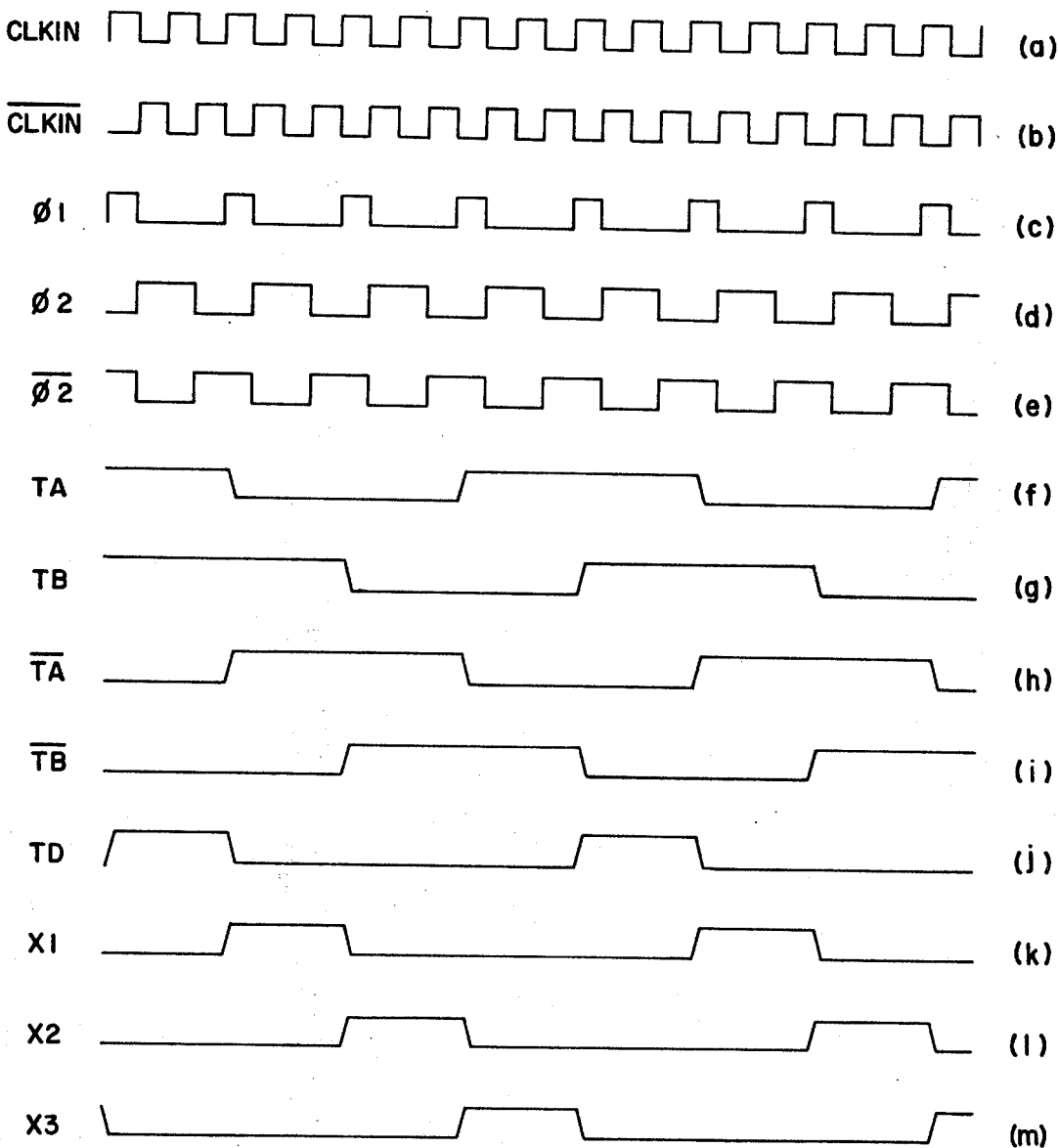
FIG. 3 consisting of 3a through 3m, is a timing diagram showing the clock signals, timing signals, and machine state time slots for the microprocessor.

A clock/T-counter 125 provides the basic clock and timing voltage waveforms used in the data system. The waveforms are shown in FIG. 3 and will be explained hereinafter. The clock/T-counter is operated by a signal CLK-IN (FIG. 3a) received from an external clock (not shown) on line 126. An external READY signal is provided to the clock/T-counter via lead 127. The READY signal is used to synchronize the data system with a slower external memory or I/O devices (not shown). An NSTEP (not-step) signal, provided to the clock/T-counter via line 128, is used by an external support system (not shown) to step the data system through internal machine states. The condition NSTEP=O prevents the data system from proceeding to its next machine state. A CLKOUT (clock output) signal is provided via line 129 as a means to synchronize external circuitry with the operation of the data system. In the preferred embodiment the period of CLKOUT is twice that of CLK-IN.

MICROPROCESSOR UNIT PIN DESIGNATIONS

Figure 2:
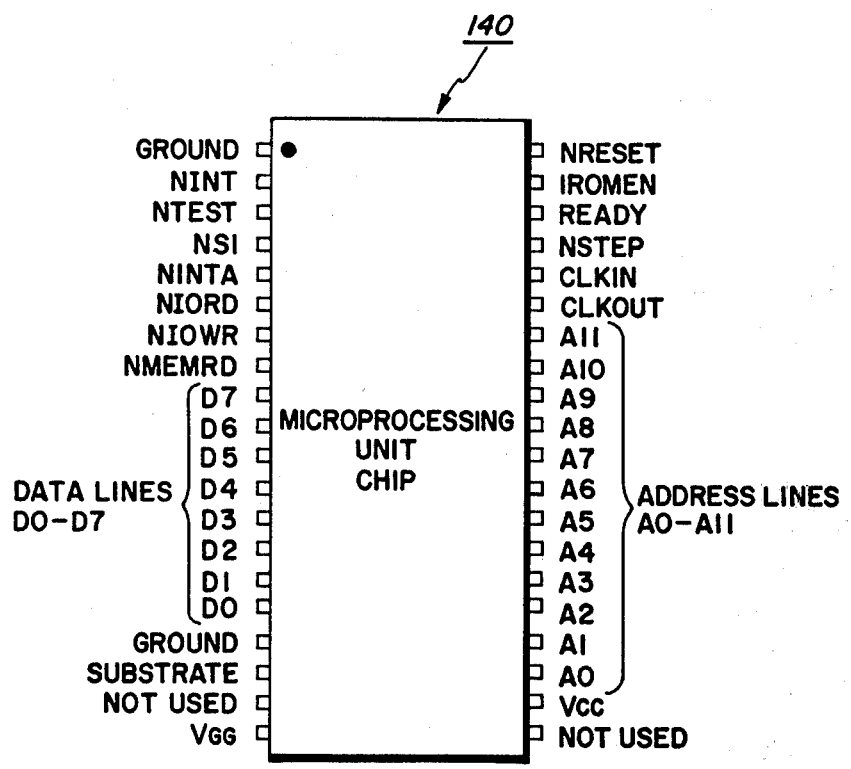
FIG. 2 is a diagram illustrating a dual-in-line semiconductor package for the microprocessor chip indicating the input and output signal connections.

The external signals applied to or generated by the microprocessor unit are illustrated in FIG. 2, which indicates the external lead connections of the forty-pin package housing the microprocessor chip. The dual-inline-package (DIP) is designated by reference numeral 140.

CLOCK AND TIMING SIGNALS

Figure 4:
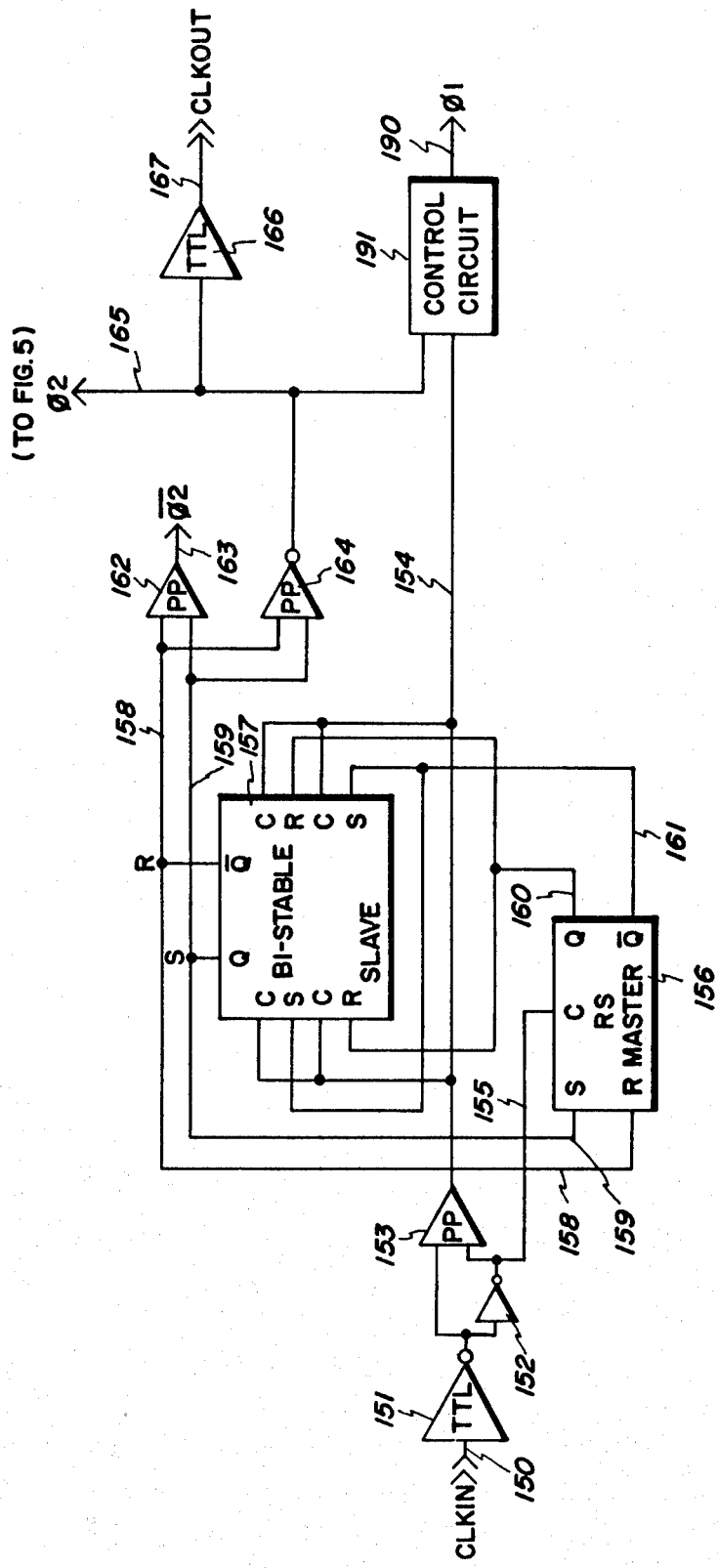
FIG. 4 is a circuit schematic of the clock generator.

An explanation of how the clock and timing signals are generated will be made with reference to FIGS. 3 through 6. With reference to FIG. 4, there is shown circuitry used to generate the clock signals employed by the icroprocessor unit. An external clock signal CLKIN is introduced into the clock system on line 150. It then passes through a TTL input buffer 151 where it is inverted. This signal then passes through an inverter 152 and push/pull driver 153. The output of the push-/pull driver appears on line 154 and the output of the inverter 152 appears on line 155. An RS flip-flop 156 and a bistable latch 157 are connected as follows to produce a clock signal T2. It should be pointed out that the bistable latch 157 has a particular circuit configuration such that the rise time of the Q and $\overline{Q}$ output signals is greater than the rise time of the Q and $\overline{Q}$ output signals of the RS flip-flop 156. Such a circuit is described in detail in copending application, Ser. No. 777,212, filed Mar. 14, 1977. The clock signal to the RS flip-flop 156 is supplied by the signal on line 155. The clock signal to the bistable latch 157 is supplied by the signal on line 154. The set signal to the bistable latch is provided by the $\overline{Q}$ output of the RS flip-flop via line 161. The reset signal is supplied to the bistable latch by the Q output of the RS flip-flop on line 160. The Q output of the bistable latch provides a step signal to the RS flip-flop via line 159. The $\overline{Q}$ output of the bistable latch provides a reset signal to the RS flip-flop via line 158. It should be pointed out that the Q output of the bistable latch is the $\overline{Q2}$ output and the $\overline{Q}$ output of the bistable latch is the Q2 output, as shown by waveformms 3e and 3d, respectively, of FIG. 3. FIG. 6 shows in schematic form the circuit comprising the preferred embodiment of the bistable latch. The clock, set, and reset inputs as well as the Q and $\overline{Q}$ outputs are clearly labeled. The bistable circuit consists of a conventional bistable latch with the addition of four depletion devices Q1 through Q4. In addition, devices Q5 and Q6 are depletion devices and devices Q7 through Q12 are enhancement devices. A detailed explanation of the operation of this circuit is given in the aforementioned copending application, Ser. No. 777,212.

The signals on lines 158 and 159 are fed through a push/pull driver 162 to generate a $\overline{\phi 2}$ signal on line 163. Likewise, the signals on lines 158 and 159 are fed through an inverting push/pull driver 164 to generate a $\phi 2$ signal on line 165. The signal on line 165 is fed through a TTL output buffer 166 to provide an external clock signal CLKOUT on line 167. The signals on lines 154 and 165 are fed into a control circuit 191 to provide a $\phi 1$ output (FIG. 3c) on line 190. In the preferred embodiment, the control circuit 168 is made operative by two voltage signals Vcc and Vgg. Normally, Vcc equals 5 volts and Vgg equals 12 volts. It is a requirement that the control circuit perform an AND logic function on its input signals while at the same time providing an output signal having a magnitude greater than the magnitude of Vcc but less than the magnitude of Vgg. In the preferred embodiment, the output signal on line 190 is approximately nine volts. Such a control circuit is described in detail in copending application, Ser. No. 779,122, filed Mar. 18, 1977.

Figure 5:
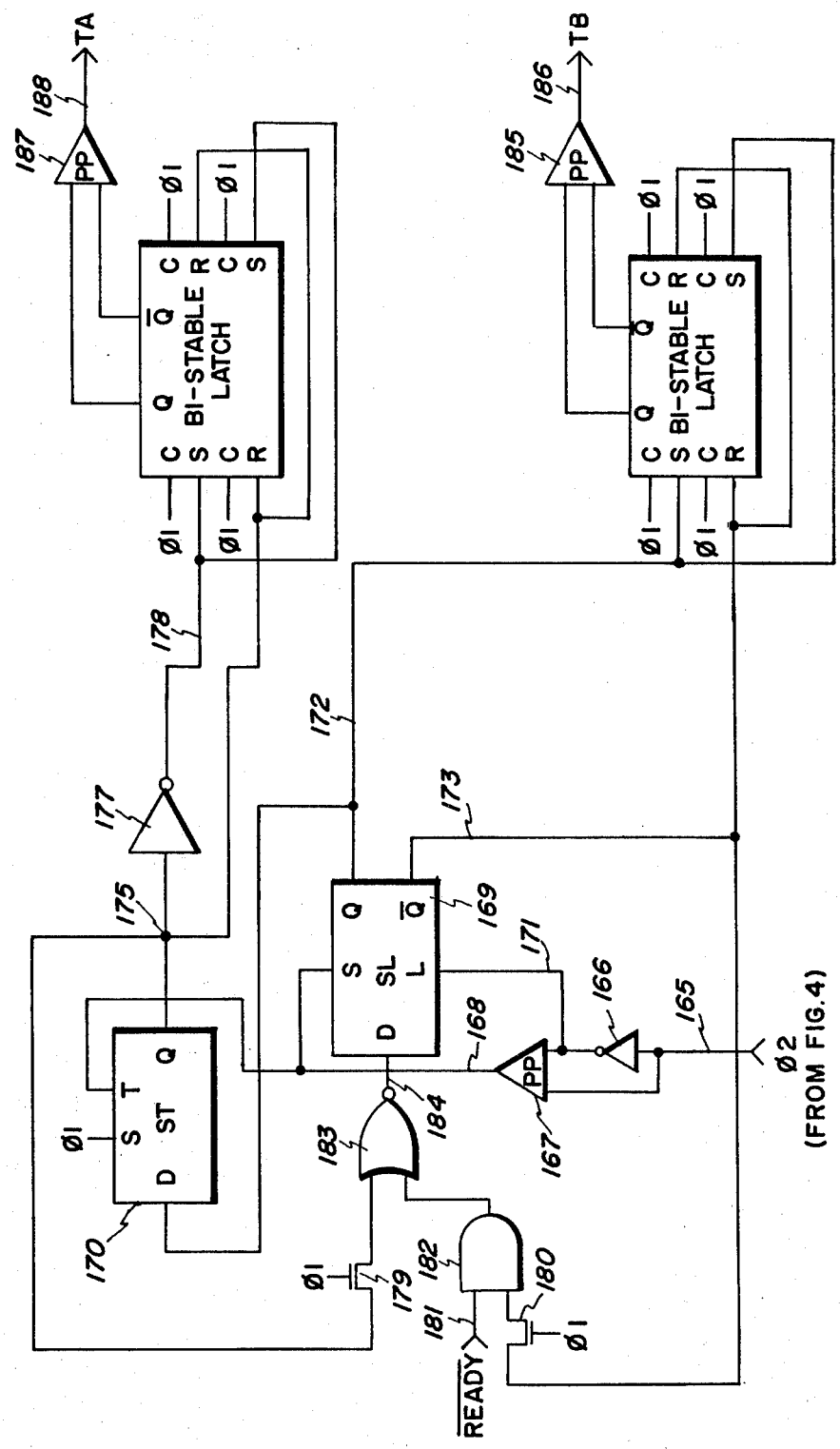
FIG. 5 is a circuit schematic of the timing signal generator.
Figure 6:
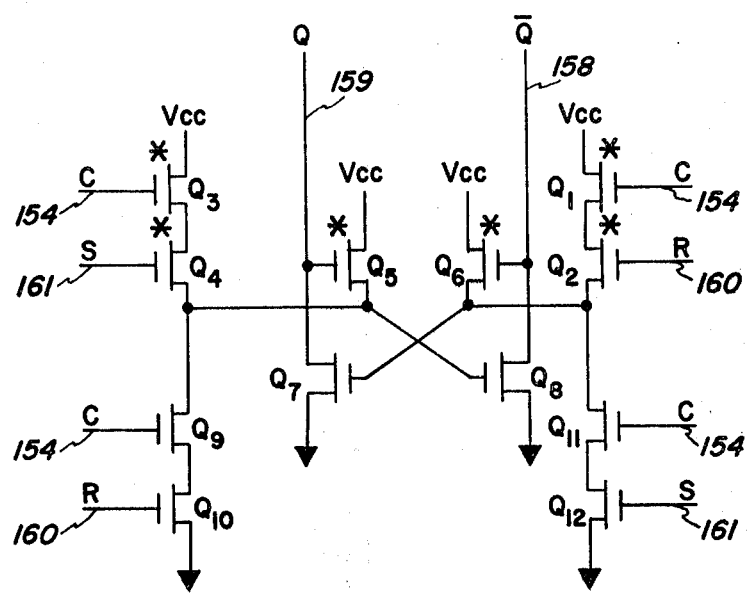
FIG. 6 is a circuit schematic of the preferred embodiment of a bistable latch used in the clock and T-counter.

An explanation of how the timing signals TA and TB are generated is presented with reference to FIG. 5. The $\phi 2$ signal appearing on line 165 of FIG. 4 is fed into an inverter 166 in combination with a push/pull driver 167 to generate a signal on line 168. The signal on line 168 provides the sample signal for the sample and latch 169 and the transfer signal for a sample and transfer device 170. The output of inverter 166 provides a latch signal for the sample and latch device 169 on line 171. The sample and latch device has two outpus; Q appearing on line 172 andd $\overline{Q}$ appearing on line 173. The signal appearing on line 172 provides the data input to the sample and transfer device 170 and the set input to a bistable latch 174. In the preferred embodiment, the bistable latch 174 has the same configuration as bistable latch 157 (FIG. 4). The signal on line 173 provides the reset signal to the bistable latch 174. The signal on line 172 provides the data input signal to the sample and transfer device 170. The sample signal for this device is $\phi 1$ and is obtained from the output of the control circuit on line 190. The output of the sample and transfer device 170 appears on line 175. The signal on line 175 provides the reset signal to a bistable latch 176. This latch has the same configuration as bistable latch 174. The signal on line 175 passes through an inverter 177 and provides the set signal to the bistable latch 176 via line 178. In the preferred embodiment, the stable latch 176 has the same configuration as bistable latch 157. The signal on line 173 is received by an AND gate 182. It is clocked into this AND gate at a rate $\phi 1$, which is determined by field effect device 180. A $\overline{\text{READY}}$ signal, derived from an external READY signal as explained hereinafter, is also placed into the AND gate 182 on line 181. The output of the AND gate is fed into an OR gate 183. The signal on line 175 is also fed into the OR gate 183 at a rate $\phi_1$ determined by field effect device 179. Devices 179 and 180 are turned on at the rate $\phi_1$, which is obtained from the output of control circuit 191 via line 190. The two bistable latches 174 and 175 are clocked at a rate $\phi_1$. The $\phi_1$ signal is obtained from the output of control circuit 191 via line 190. The outputs of bistable latch 174 are fed into a push/pull driver 185 to provide the output waveform TB, as shown in FIG. 3g, on line 186. The outputs of the bistable latch 176 are fed into a push/pull driver 187 to provide the output waveform TA, as shown in FIG. 3f, on line 188.

Thus, the following clock and timing signals are provided for use by the microprocessor unit; $\phi_1$ (FIG. 3c) on line 190, $\overline{\phi_2}$ (FIG. 3e) on line 163, TA (FIG. 3f) on line 188, and TB (FIG. 3g) on line 186.

SYSTEM TIMING

This section describes the internal timing of the microprocessor unit with reference to FIG. 3. Each instruction to be carried out by the microprocessor unit requires from one to three machine states for its fetching and execution. These machine states are called S1, S2, and S3. Each machine state, in turn, is divided into four T-cycles. These cycles are called; TD (instruction decode cycle), X1 (first execution cycle and beginning of fetch of next instruction), X2 (second execution cycle), and X3 (third execution cycle). In the preferred embodiment, each T-cycle has a time slot which is equal to the duration of one clock-out period.

The two clock signals $\phi_1$ and $\overline{\phi_2}$ as well as the timing signals TA and TB are bussed around the chip on clock lines for use by the various elements (ALU, A register, stack contro, etc.) to carry out the internal timing of the microprocessor unit. The clock and timing signals are then locally decoded by logic circuitry located at the site of each element in a manner determined by the needs of that particular element. The type of circuitry used to develop the timing signals for each of the elements will be explained hereinafter. Suffice it to say at this point that a local decoder develops one of the T-cycles, namely TD, X1, X2 or X3, as determined by the need of the particular element being timed. The T-cycles are developd by the local decoder in the following manner. All of the T-cycles are implemented through the use of inverters and NOR gates. TD (FIG. 3j) equals $\overline{TA}+\overline{TB}$; X1 (FIG. 3k) equals $TA+\overline{TB}$; X2 (FIG. 3l) equals $\overline{TA}+TB$; and X3 (FIG. 3m) equals $TA+TB$. By use of DeMorgan's theorem TD equals $\overline{TA}\cdot\overline{TB}$; X1 equals $TA\cdot\overline{TB}$; X2 equals $\overline{TA}\cdot TB$; and X3 equals $TA\cdot TB$. Waveform $\overline{TA}$ is shown in FIG. 3h and waveform $\overline{TB}$ is shown in FIG. 3i.

In general, all one-byte instructions require one machine state (S1). All two-byte non-input/output instructions require two machine states (S1 followed by S2). All three-byte instructions and two-byte input/output instructions require three machine states (S1 followed by S2 followed by S3).

As stated before, a ready signal $\overline{\text{READY}}$ derived from an external READY signal is received by the clock and timing system on line 181. The ready signal is used to synchronize the microprocessor unit with slower external memory or input/output devices. Therefore, the X3 T-cycle is repeated until the external READY signal is a logic 1. Thus, by controlling the ready line, an external memory or input/output device can force the microprocessor unit to wait in increments of one clock-out cycle. While waiting, the controller maintains the integrity of the address bus, the data bus and the appropriate read-write control lines. There is no limitation on the length of time that the microprocessor unit can be kept waiting for a READY equals "1" response.

The S1, S2, and S3 machine states are the normal machine states. Two other machine states, namely S4 and S5 are provided. S4 serves three purposes. It is an intermediate state between the reset state and the first op-code decode and execution. When NRESET becomes 1, the microprocessor unit enters machine state S4. During S4, an access to application program location 0 is initiated. S4 is also the intermediate state between an interrupt machine state and the decode and execution of the first op-code in the interrupt routine. When the microprocessor unit is interrupted, it goes to S4. During S4, interrupts are disabled and an access to the first location in the interrupt routine is initiated. Finally, the S4 state is the intermediate state between the reset state and the test state.

The S5 machine state is the reset state. It is unconditionally entered whenever the $\overline{\text{RESET}}$ line goes to logic 0. All control lines are in the inactive state when the microprocessor unit is in the S5 machine state.

THE ROM

Figure 7A:
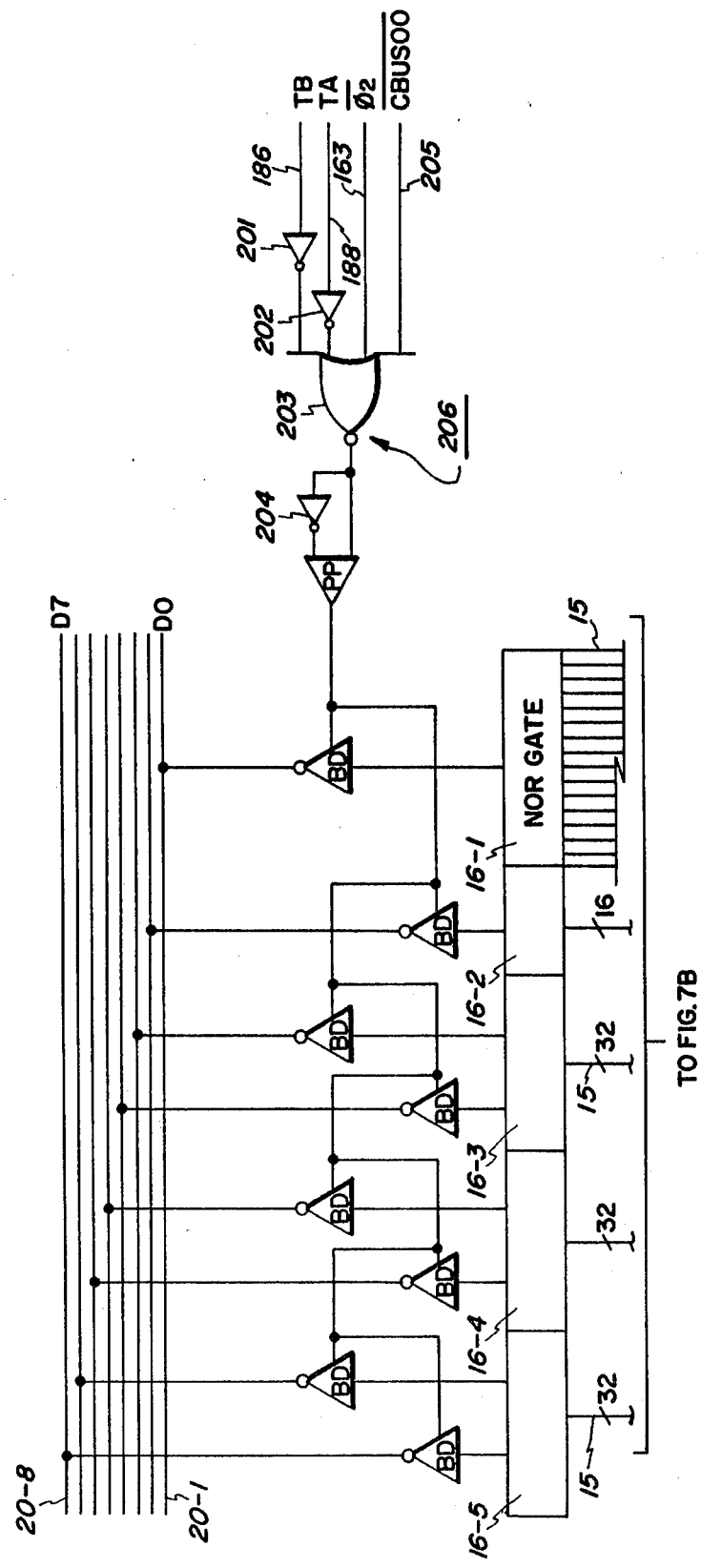
FIG. 7, consisting of 7a and 7b, is a detailed logic diagram of the ROM.
Figure 8A:
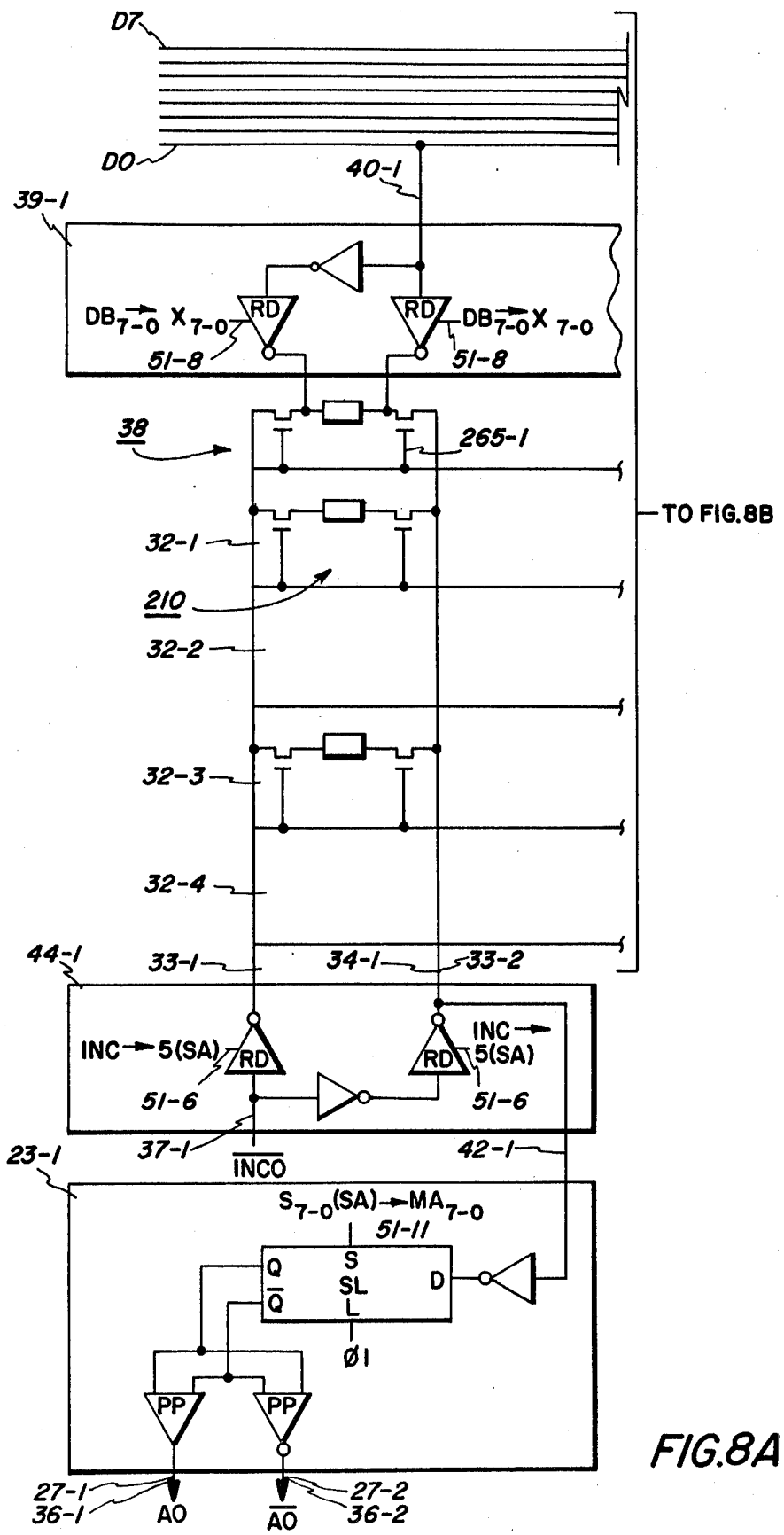
FIG. 8, consisting of 8a through 8c, is a detailed logic diagram of the stack.
Figure 8B:
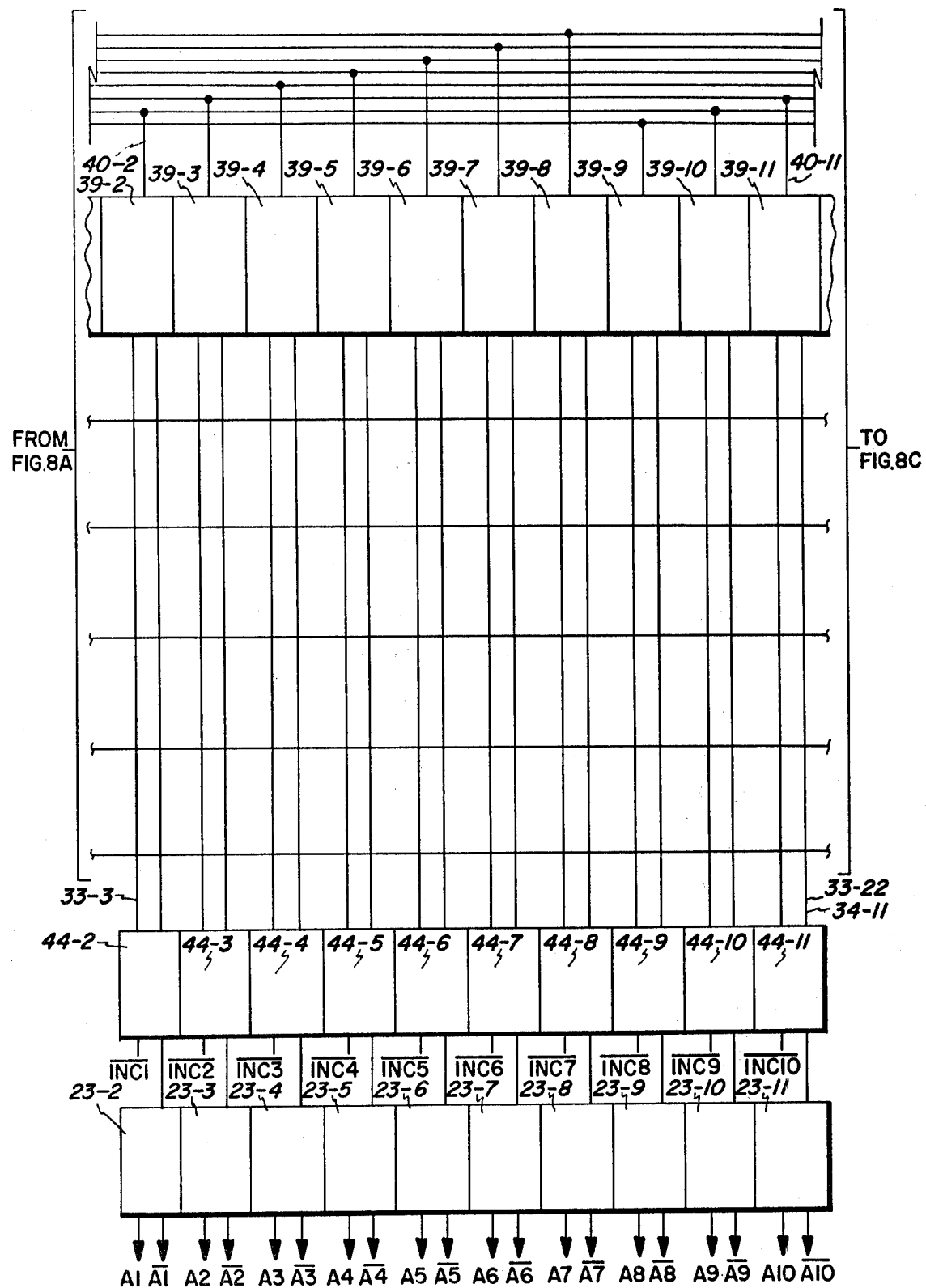
Figure 8C:
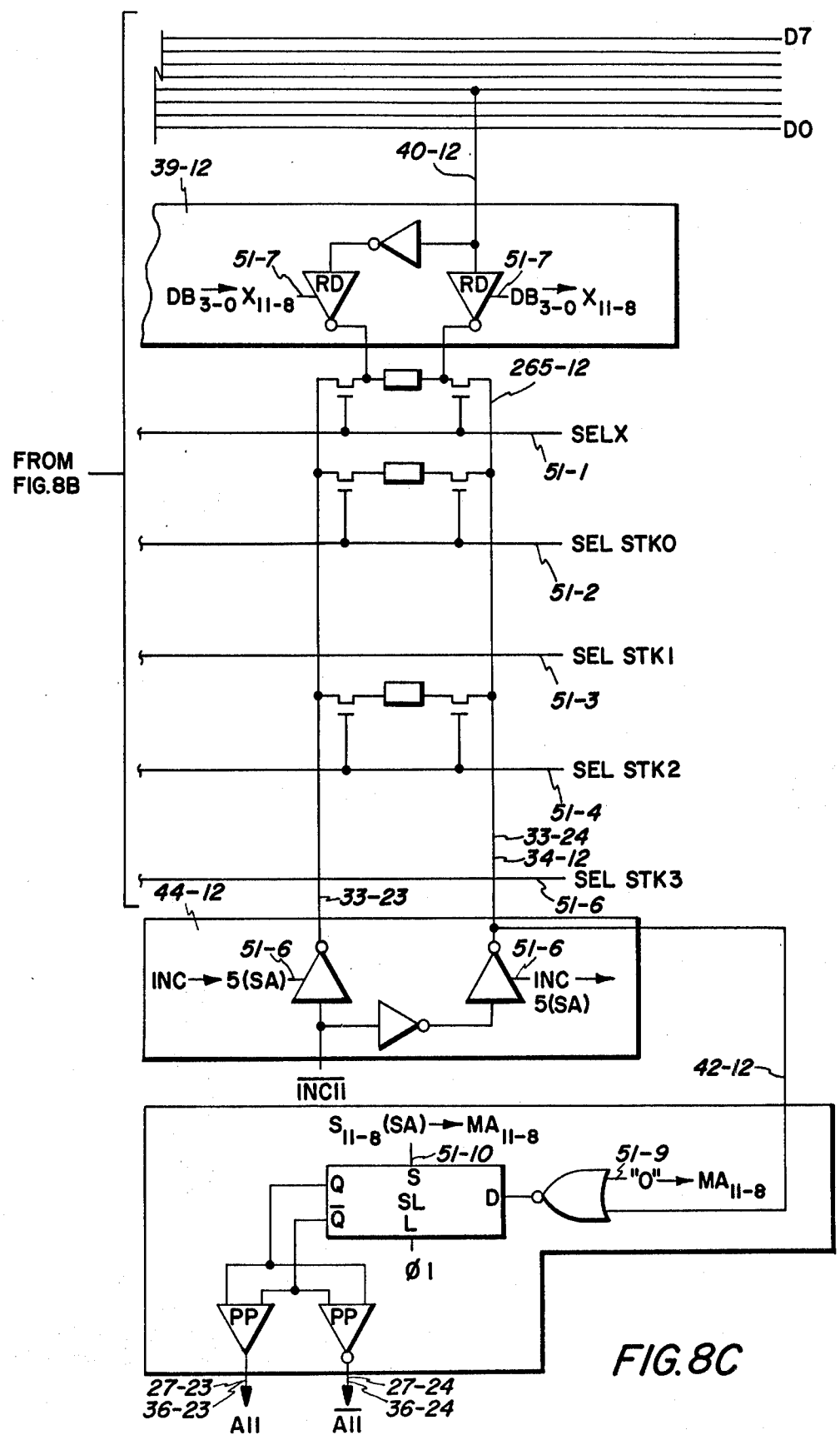

Referring now to FIG. 7, the organization of the ROM and associated circuitry is illustrated in greater detail. The ROM 2 is a typical read-only memory well known in the prior art. The ROM comprises a multiplicity of cells arranged in groups, which cells store binary digits (0 or 1). Each group of cells store a unique binary number. These binary numbers are programmed into the ROM during the manufacture by means of a custom masking process step.

In FIG. 7, the ROM consists of seven sections, 2-1, through 2-7. It can be pointed out that this division is made for explanation purposes only and does not exist in the ROM as actually implemented on the chip of the microprocessor unit. Section 2-1 contains 16 columns and 32 rows thus providing storage for 512 bits of memory. Sections 2-2 through 2-4 each have the same structure as section 2-1. Sections 2-5 through 2-7 each have the same structure as the combined structure of sections 2-1 through 2-4. Thus it can be seen that the ROM contains space for 8,192 bits.

Each one of the ROM memory bytes or words may be uniques addressed through the use of a row decode 22 and a column decode 24. The decode matrix for the first 32 rows of the ROM carries reference numeral 22-1. This code is carried through for the next 32 lines of the ROM decode matrix in section 22-2. In this way, the row decode comprises a 1- of -64 row address in response to the least six significant bits and their complement of an address word received from the memory address register 23. The first section of the column decode comprises matrix 24-1. This structure is repeated for column section 24-2. Column decode sections 24-3 through 24-5 each contain the same structure as the combined matrix of sections 24-1 and 24-2. Thus at any time, eight columns of ROM may be addressed via lines 18 in response to bits A6 through A9 and their complement of an address word received from the memory address register via lines 26-1 through 26-8. It should be pointed out that the complement of the address bits may be generated through any conventional means. In the preferred embodiment, inverting push-/pull drivers are used to generate the complements. The output of the ROM is fed into a series of 16-to-1 NOR gates via lines 15. Section 16-1 contains one NOR gate. Section 16-2 contains one NOR gate and section 16-3 through 16-5 each contain two NOR gates. The output of these NOR gates is fed into bus drivers 19-1 through 19-8 via lines 14-1 through 14-8. The outputs of these bus drivers are then fed to the data bus lines 20-1 through 20-8 via lines 21-1 through 21-8. Thus, an eight-bit instruction word has been generated and placed on the data bus for use by the microprocessor unit. The gating of the instruction word onto the data bus is controlled by the gating circuitry 206. This circuitry operates in the following manner. The timing signals TA and TB are received on lines 188 and 186 respectively then placed through inverters 201 and 202 into a NOR gate 203. A $\overline{\phi 2}$ clock signal is received on line 163 and placed into the NOR gate. Finally, a control signal $\overline{CBUS00}$ from the PLA control 100 is received via line 205 and placed into the NOR gate. The output of the NOR gate goes through an inverter-push/pull driver combination 204 to provide the driving signals to the bus drivers 19-1 through 19-8.

STACK AREA

Referring now to FIGS. 8–12, the organization of the stack area is illustrated in greater detail. The stack area consists basically of a stack 32 implemented in the preferred embodiments as a 48-bit RAM organized to operate as four 12-bit registers. This arrangement provides a push-down stack to store subroutine and interrupt return addresses. The other basic elements of the stack area are the memory address register (MAR) 23 which is a 12-bit memory address register for generating the memory address word, and incrementer (INC) 35 which is used in generating the next address word, a transfer register (X-Reg) 38 which is used to transfer information from the data bus to the address bus, read and write circuitry 39 associated with the X-Reg and read and write circuitry 44 associated with the stack. In addition, stack control circuitry 48 is provided to control the operations of the elements within the stack area in response to control signals from the PLA control 100 via lines 50.

Figure 46:
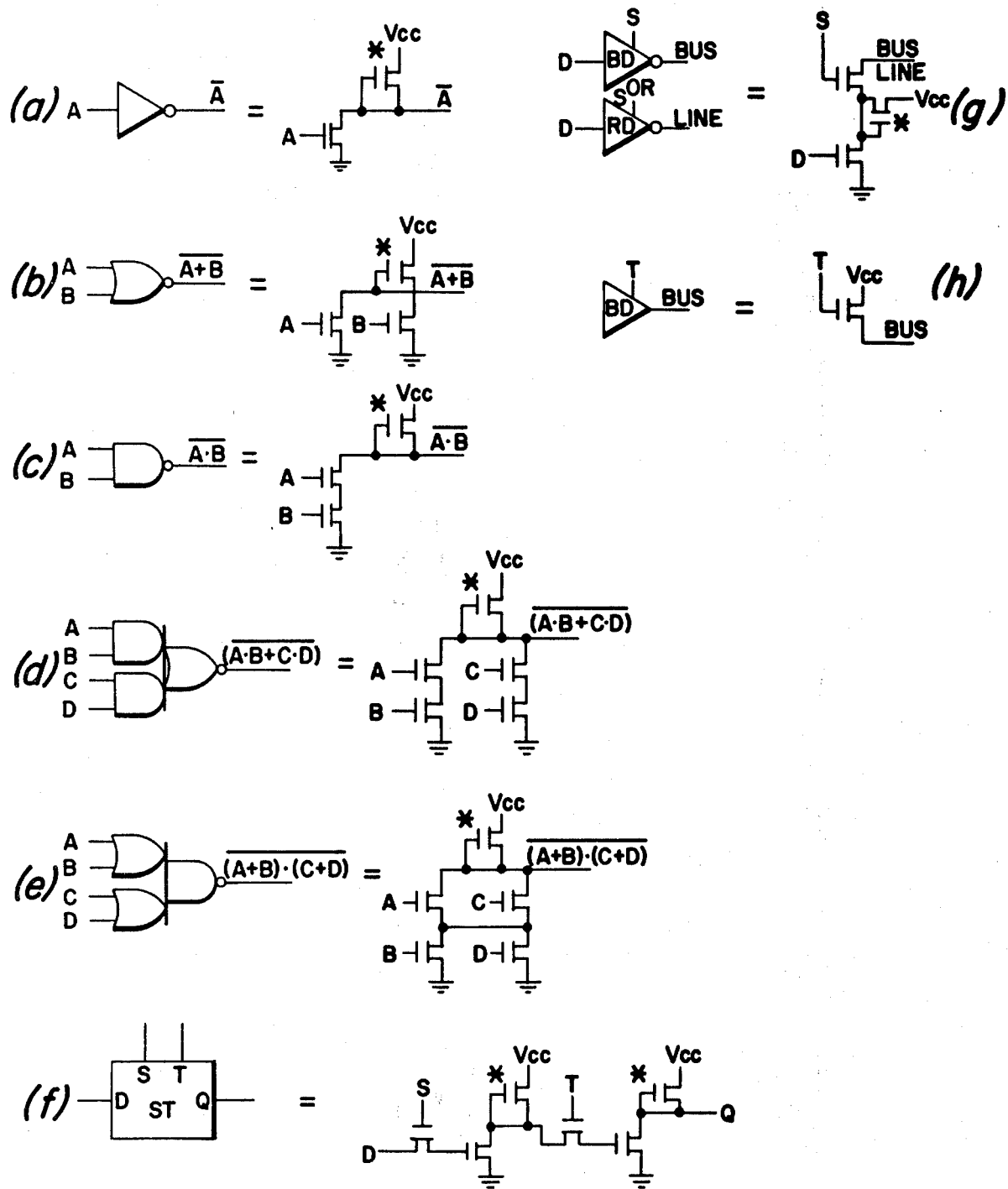
FIGS. 46, consisting of 46a through 46p, are detailed electrical diagrams of logic circuits used in FIGS. 4 through 45.

The transfer or X-Reg 38 consists of 12 RAM memory cells 210 configured to operate as a 12-bit register. The X Reg is addressed for reading by a SELECT X signal from the stack control via line 51-1. Write circuitry 39 provides a means to transfer data from the data bus into the X-Reg. The write circuitry consists basically of 12 circuits, each circuit comprising an input for receiving data from the data bus on any one of lines 40-1 through 40-12. The signals from the data bus are then fed through an inverter and two RAM drivers to provide a means for placing the information into one of the associated RAM cells of the X-register. The RAM drivers (RD) in the preferred embodiment are configured as shown in FIG. 46g. Write X circuits 39-1 through 39-8 gate the information from the data bus into the X-register in response to control signals from the stack control via lines 51-8. Write X circuits 39-9 through 39-12 gate the information from the data bus into the associated X-register cells in response to a control signal from the stack control via lines 51-7. Read lines for the X-register 265-1 through 265-12 are associated with the read lines 42-1 through 42-12 of the stack. Information is written into the stack on write lines 33-1 through 33-24. Information is read from the stack as well as the X-register on lines 34-1 through 34-12.

Figure 10:
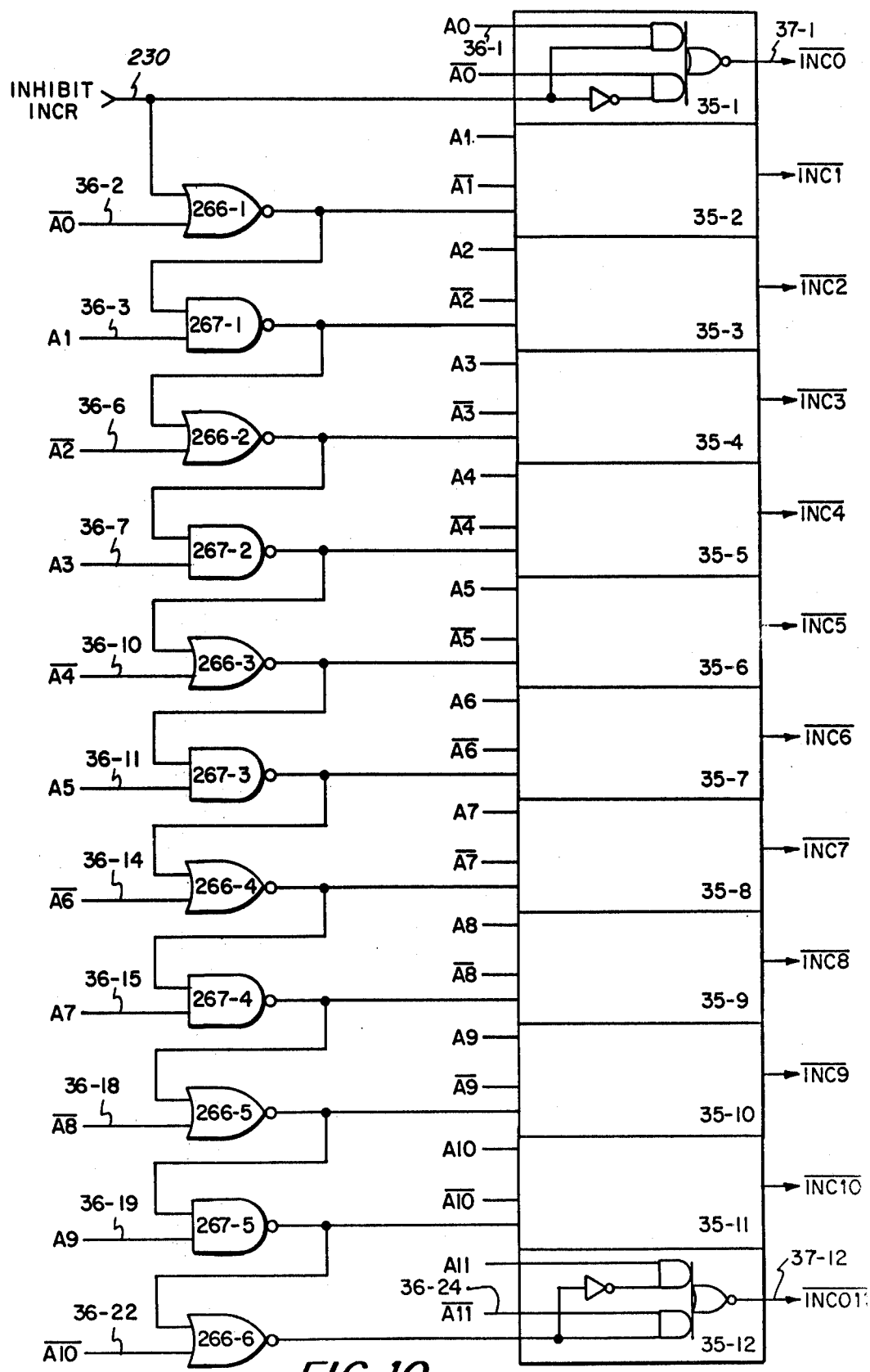
FIG. 10 is a detailed logic diagram of the stack incrementer.

Stack read/write circuitry 44 consists basically of 12 circuits 44-1 through 44-12. Each circuit comprises an input 37-1 through 37-12 for receiving signals from the incrementer 35 (FIG. 10). The information is received and passed through a combination of an inverter and two RAM drivers. The RAM drivers respond to write-read signals generated by the stack control via lines 51-6. Write lines 42-1 through 42-12 are provided from the read-write circuitry to the memory address register 23.

The memory address register 23 contains 12 circuits 23-1 through 23-12. Circuits 23-1 through 23-8 each comprises an input for receiving the write signal on lines 42. The received signal is then passed through an inverter into a sample and latch device, the output of which is passed through a push-pull driver and an inverting push-pull driver to provide signals to the address bus 30 via lines 27-1 through 27-24 and also to provide signals to the incrementer via lines 36-1 through 36-24.

Figure 9:
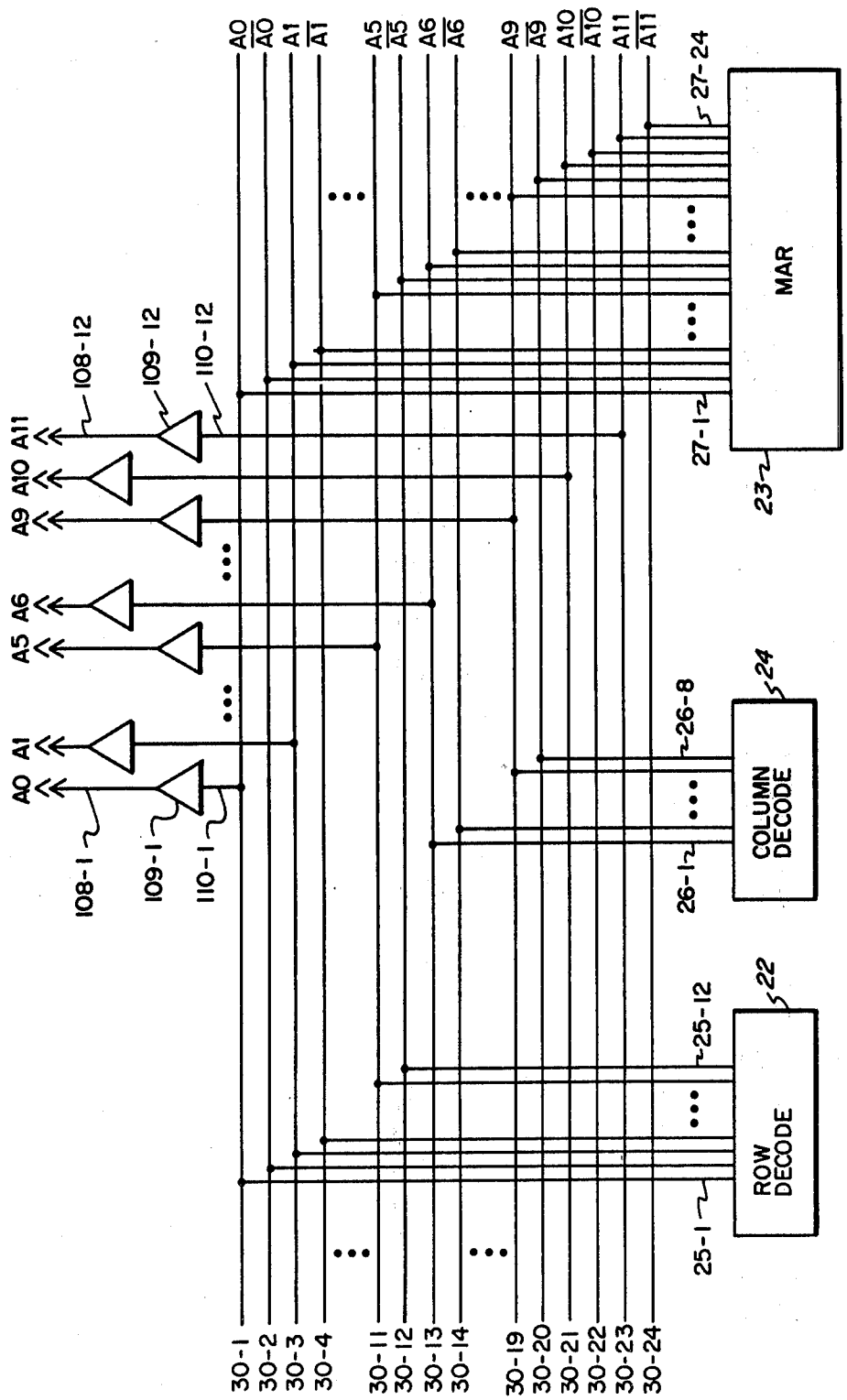
FIG. 9 is a block diagram showing how the memory address register, row decode, and column decode are connected to the address bus.

FIG. 9 shows the address bus comprising lines 30-1 through 30-24. Each line has associated with it an address bit and its complement generated by the memory address register and placed on the address bus via lines 27-1 through 27-24. As can be seen, the least six significant bits and their complement of a memory address word are received by the ROM row decode 22 via lines 25-1 through 25-12. Likewise, the sixth through the ninth bits, and their complements, are received by the ROM column decode 24 via lines 26-1 through 26-8. The output pins A0 through A11 receive the memory address words via lines 108-1 through 102-12 after passing through TTL compatible buffers 109-1 through 109-12 which have received the memory address word from the address bus via lines 110-1 through 110-12. These pins provide the memory address words for use by an external memory or other external I/O devices if such use is desired.

The incrementer which is used in next address generation is configured as shown in FIG. 10 and operates as follows. The incrementer consists basically of 12 complex logic gates 35-1 through 35-12, each gate comprising a NOR gate in combination with two AND gates and an inverter. Logic gates 35-1, 35-3, 35-5, 35-7, 35-9, and 35-11 have the output of the inverter feeding into the right AND gate, while logic gates 35-2, 35-4, 35-6, 35-8, 35-10, and 35-12 have the output of the inverter feeding into the left AND gate. This complex logic provides inputs representing the present memory address word from the memory address register 73 via lines 36-1 through 36-24.

A series of NOR gates 266-1 through 266-6 provide input signals to complex logic gates 35-2, 35-4, 35-6, 35-8, 35-10, and 35-12. A series of NAND gates 267-1 through 267-5 provide input signals to complex logic gates 35-3, 35-5, 35-7, 35-9, and 35-11. An inhibit increment (INHIB INC) signal from the stacks control via line 230 provides an input signal to complex logic gate 35-1. This signal determines whether or not the incrementer is stepped. The inputs to the NOR gates and NAND gates are received from the MAR on lines 36 and elsewhere as follows. NOR gate 266-1 has as its inputs $\overline{A0}$ on line 36-2 and INHIB INC on line 230.

AND gate 267-1 has as its inputs A1 on line 36-3 and the output of NOR gate 266-1. NOR gate 266-2 has as its inputs $\overline{A2}$ on line 36-6 and the output of NAND gate 267-1. NAND gate 267-2 has as its inputs A3 on line 36-7 and the output of NOR gate 266-2. NOR gate 266-3 has as its inputs $\overline{A4}$ on line 36-10 and the output of NAND gate 267-2. NAND gate 267-3 has as its inputs A5 on line 36-11 and the output of NOR gate 266-3. NOR gate 266-4 has as its inputs $\overline{A6}$ on line 36-14 and the output of NAND gate 267-3. NAND gate 267-4 has as its inputs A7 on line 36-15 and the output of NOR gate 266-4. NOR gate 266-5 has as its inputs $\overline{A8}$ on line 36-18 and the output of NAND gate 267-4. NAND gate 267-5 has as its inputs A9 on line 36-19 and the output of NOR gate 266-5. NOR gate 266-6 has as its inputs $\overline{A10}$ on line 36-22 and the output of NAND gate 267-5.

Figure 11:
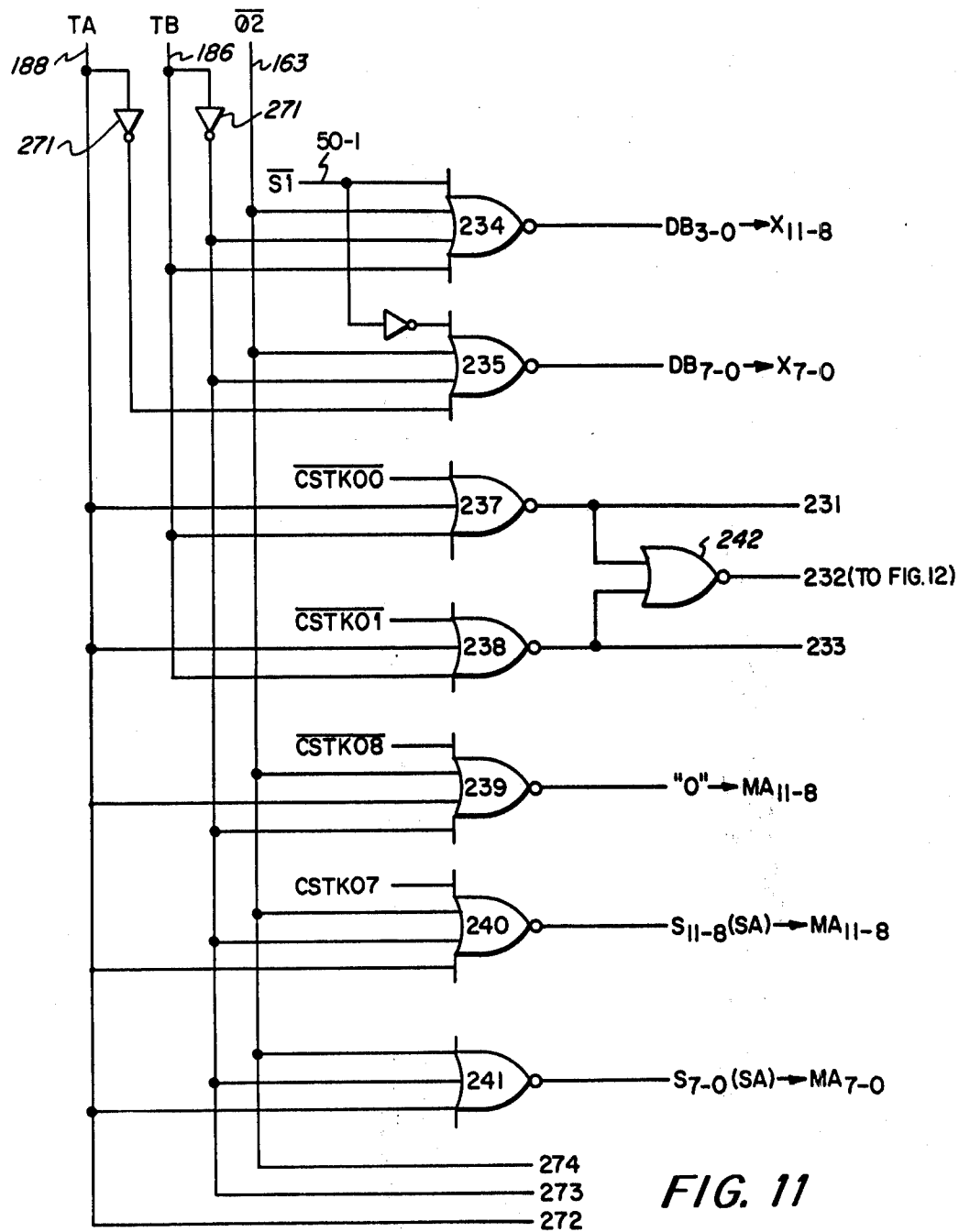
Figure 12:
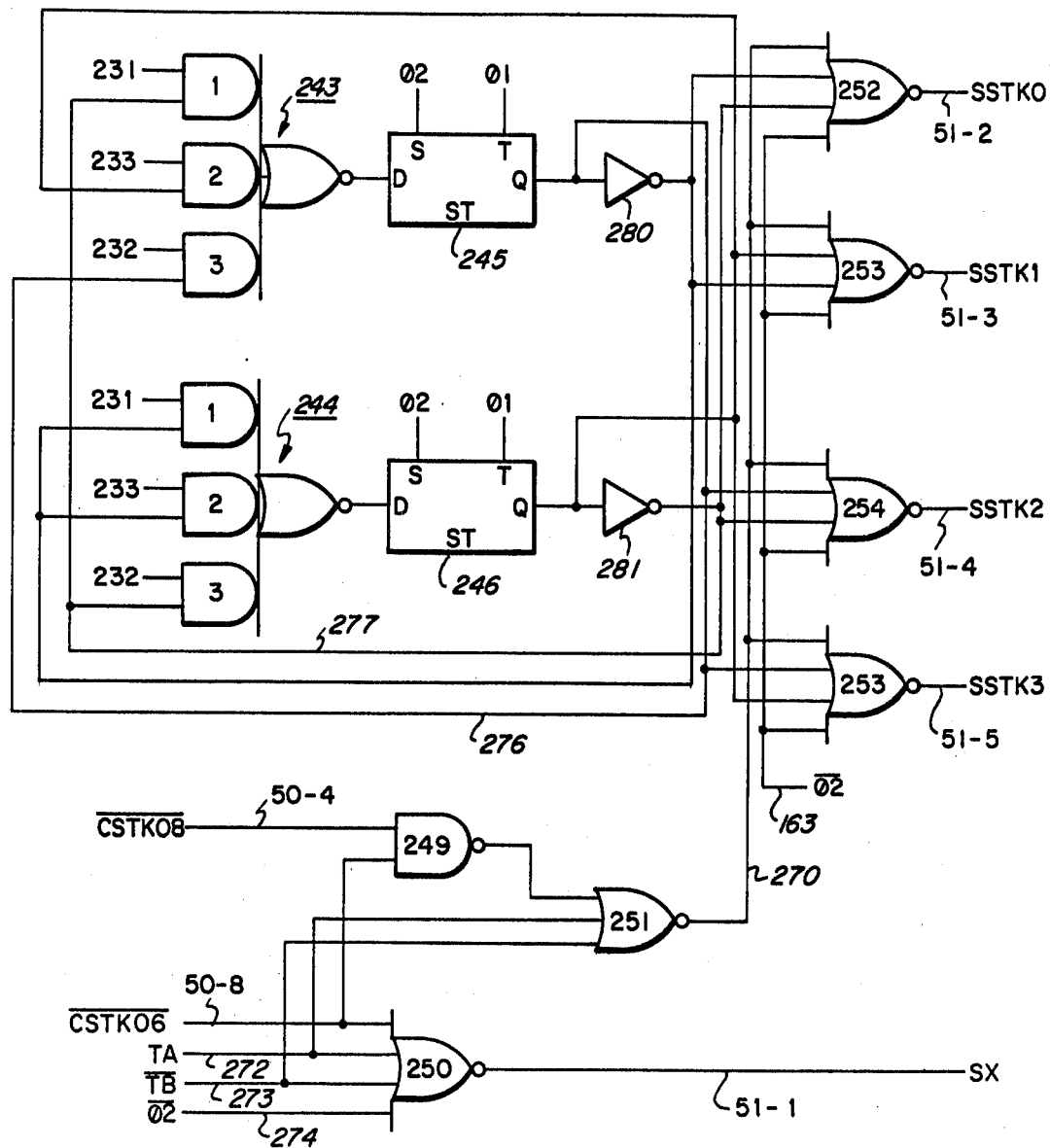

The stack control 48 will now be described with reference to FIGS. 11 through 13. FIGS. 11 and 12 show the circuitry used to develop the stack control signals previously mentioned with respect to lines 51-1 through 51-11. With reference to FIG. 11, a series of timing signals TA, $\overline{TA}$, TB, $\overline{TB}$, and $\overline{\phi 2}$ provide input signals which are locally decoded by a series of NOR gates, 234 through 241, to generate the stack control signals. $\overline{TA}$ and $\overline{TB}$ are generated by locally putting the TA and TB signals received on lines 188 and 186, through inverters 271. In addition, each of the NOR gates 234 through 240 receive a control signal from the PLA control 100 via lines 50-1 through 50-5. In particular, NOR gate 234 has an output $DB_{3-0} \rightarrow X_{11-8}$ in response to the following inputs $\overline{S1}$, $\overline{TA}$, $\overline{TB}$, and $\overline{\phi 2}$. Nor gate 235 has an output $DB_{7-0} \rightarrow X_{7-0}$ in response to the inputs S1, $\overline{TA}$, $\overline{TB}$, and $\overline{\phi 2}$. S1 is generated by passing the $\overline{S1}$ signal through an inverter 236. NOR gate 239 has an output "0" $MA_{11-8}$ in response to TA, $\overline{TB}$, $\overline{\phi 2}$, and $\overline{CSTK08}$. NOR gate 240 has an output $S_{11-8} \rightarrow MA_{11-8}$ in response to the input TA, $\overline{TB}$, $\overline{\phi 2}$ and $\overline{CSTK07}$. NOR gate 241 has the output $S_{7-0}\, MA_{7-0}$ in response to the input TA, $\overline{TB}$, and $\overline{\phi 2}$. NOR gate 237 provides an output on line 231 in response to the inputs TA, TB, and $\overline{CSTK00}$ while NOR gate 238 provides an output on line 233 in response to the inputs TA, TB, and $\overline{CSTK01}$. The signals on lines 231 and 233 are then put through a NOR gate 242 to generate a signal on line 232. The signals on lines 231 through 233 will be described with reference to FIG. 12.

Logic arrays 243 and 244 provide inputs for the signals appearing on lines 231 through 233. Line 231 carries the input signal to AND gate No. 1 of arrays 243 and 244. Line 233 carries the input signal to AND gate 2 of arrays 243 and 244, and line 232 carries to AND gate 3. The output of the logic array 243 provides the data input to a sample and transfer device 245. Likewise, the output of logic array 244 provides the data input to a sample and transfer device 246. Both of the sample and transfer devices sample the incoming data at a rate determined by $\phi 2$ (FIG. 3d). The signal $\phi 2$ is obtained by passing the $\overline{\phi 2}$ signal through an inverter (not shown). The transfer to the outputs of the sample and transfer devices takes place at a rate determined by $\phi 1$ (FIG. 3c). The output of sample and transfer device 245 appears on line 276 and the complement of that signal appears on line 275 after passing through an inverter 246. The output of sample and transfer device 246 appears on line 278 and its complement appears on line 276 after passing through an inverter 281. The signal on line 275 is provided as an input into AND gate 3 of array 243 and AND gate 2 of array 244. The signal on line 276 is provided as an input into AND gate 1 of array 244. The signal on line 277 is provided as an input into AND gate 1 of array 243 and AND gate 3 of array 244. The signal on line 278 is provided as an input into AND gate 2 of array 243.

In FIG. 11, certain timing signals appear on lines 272 through 274. These timing signals also appear in FIG. 12 as inputs to NOR gate 250. In like manner, the timing signals on lines 272 and 273 appear as inputs to NOR gate 251. In addition, NOR gate 250 has an input control signal $\overline{CSTK06}$ provided by the PLA control 100 via line 50-8. This control signal when combined with the input timing signals into the NOR gate generates a control signal for the X register on line 51-1. NAND gate 249 receives two control signals — $\overline{CSTK06}$ via line 50-8 and $\overline{CSTK08}$ via line 50-4 from the PLA control 100. The output of NAND gate 249 provides a control signal to NOR gate 251, which when combined with the timing signals, TA and $\overline{TB}$, provides a control signal on line 270 which is then placed into each one of NOR gate 252 through 255. The $\overline{\phi 2}$ timing signal on line 163 provides an addtional input signal into these NOR gates. NOR gate 252 has additional inputs comprising the signals on lines 275 and 277. The output of this NOR gate provides a control signal SEL STK0 (meaning select stack line 0) to the first stack register row via line 51-2. Nor gate 253 has additional inputs comprising signals on lines 275 and 278 to provide a control output SEL STK 1 to the second stack register row on line 51-3. NOR gate 254 has additional input signals from lines 276 and 277 to provide a control signal SEL STK 2 to the third stack register row via line 51-4. NOR gate 255 has additional inputs on lines 276 and 278 to provide a control signal SEL STK 3 to the forth stack register row via line 51-5.

Figure 13:
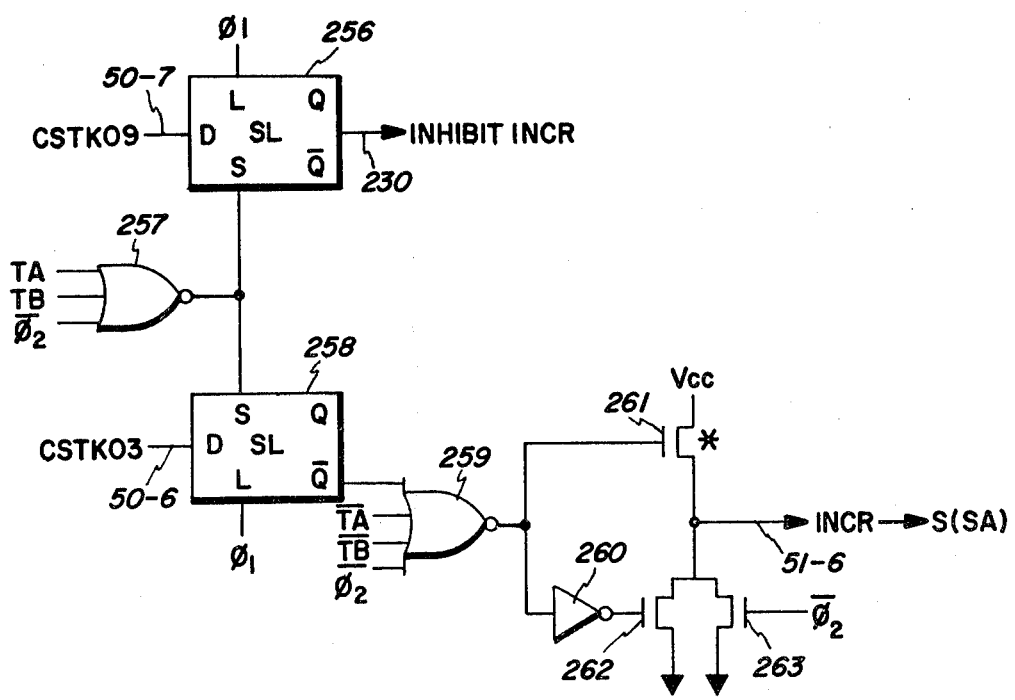
FIGS. 11-13 constitute a detailed logic diagram of the stack control.

The signals which inhibit the incrementer and transfer data from the incrementer 35 to the stack 32 are developed by the circuitry illustrated in FIG. 13. Timing signals TA, TB, and $\overline{\phi 2}$ are input signals into NOR gate 257 whose output provides a sample signal for two sample and latch devices 256 and 258. The data sampled in the first sample and latch device 256 is obtained on line 50-7 and represents a control signal $\overline{CSTK09}$ from the PLA control 100. The data sampled in the second sample and latch device 258 is a control signal $\overline{CSTK03}$ received on line 50-6 from the PLA Control 100. The latch operation in each sample and latch takes place at a rate $\phi 1$. The $\overline{Q}$ output of sample and latch device 256 appears on line 230 and represents the inhibit increment signal to the incrementer 35. The $\overline{Q}$ output of sample and latch device 258 is one of the input signals applied to NOR gate 259. The other input signals are $\overline{TA}$, $\overline{TB}$, and $\overline{\phi 2}$. The output of NOR gate 259 provides a gate voltage to a depletion device 261. The depletion device has one of its regions connected to power source Vcc which, in the preferred embodiment, is five volts. The output of the NOR gate 259 is inverted by inverter 260 and applied to the gate of an enhancement device 262. An additional enhancement device 263 is configured in parallel with device 262. Device 263 receives a $\overline{\phi 2}$ signal on its gate. The parallel connection of device 262 and 263 are tied to the other region of device 261 to provide an output on line 51-6. The signal appearing on this line is used to transfer the data from the incrementer to the stack. This signal is called INCR→S(SA).

THE RAM AREA

Figure 14:
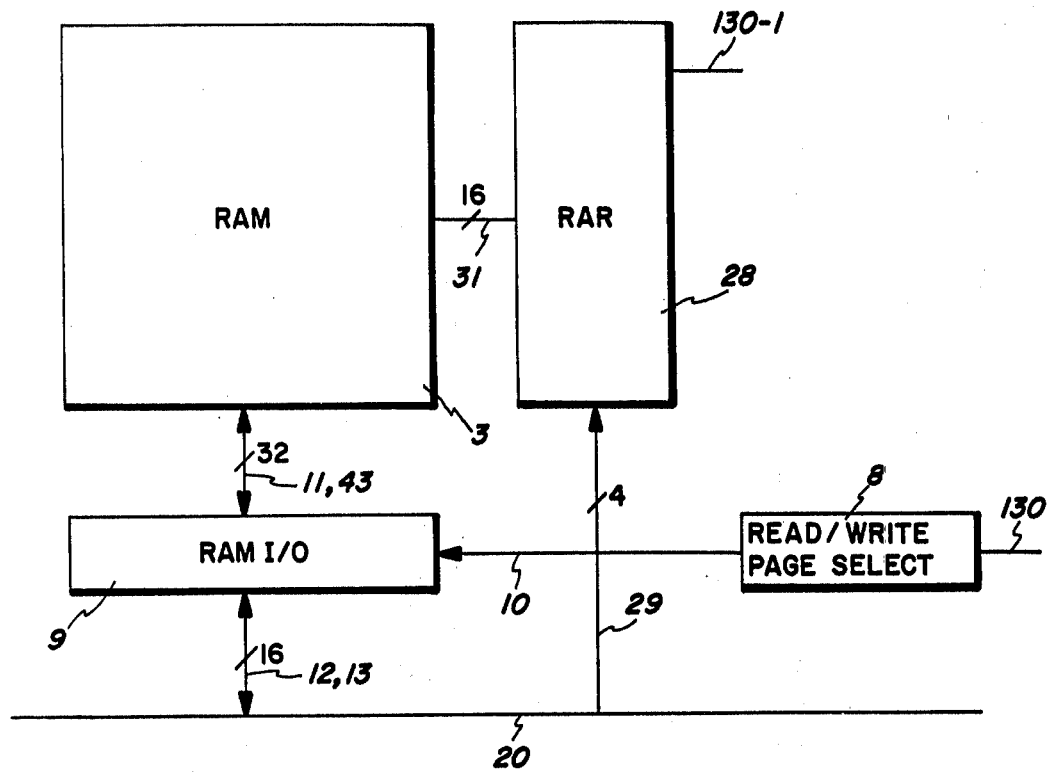
FIG. 14 is a block diagram of the RAM memory area.

The block diagram of the RAM memory area is shown in FIG. 14. The RAM memory area is centered around a RAM (Random Access Memory). The RAM contains 256 memory cells software organized as two pages, P0 and P1, each page contains 16 8-bit wide working registers. The RAM is addressed by a word address on lines 31, i.e. one out of 16 word lines in the RAM is selected by means of a RAM address register 28. The RAM address register (RAR) 28, containing four sample and latch devices, receives from the data bus 20 a 4-bit encoded address comprising the least four significant bits of an instruction word. The RAM address register 28 decodes the encoded address to provide the word address signal on lines 31 to the RAM. The operations within the RAM address register are timed by signals developed by circuitry shown in FIGS. 4 and 5. The RAR 28 is controlled by a signal received from the PLA control 100 via line 130-1.

Read/write and page select circuitry 8 provides signals via lines 10 to RAM input/output circuitry 9 in order to carry out the page select and read/write operations. The read/write page select circuitry receives its timing and control signals from circuitry shown in FIGS. 4 and 5. For a read operation, the RAM is addressed on lines 31 and then read/write and page select signals are delivered to the RMA I/O 9 via lines 10. In this way eight specific bits are accessed and read out of the RAM on RAM I/O lines 11 (for P0) and 43 (for P1) via the RAM I/O 9 to RAM read/write lines 12 and 13 respectively. Alternatively, data is written into the RAM from the data bus 30 via lines 12 and 13 and transferred by the RAM I/O in response to write and page select signals from the read/write page select 8 into the RAM at the address locations via lines 11 and 43 respectively.

Figure 15:
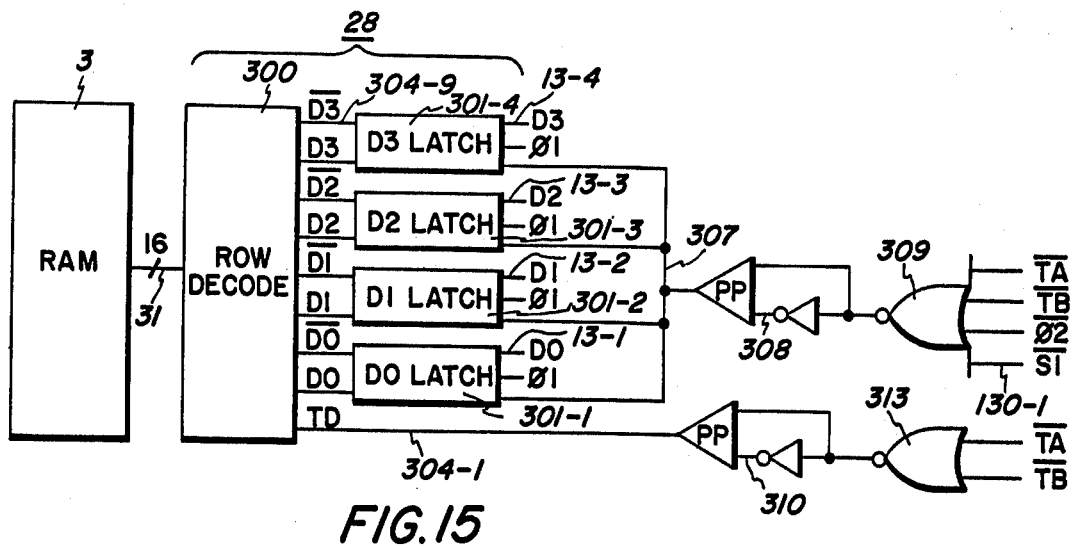
FIG. 15 is a logic diagram of the RAM address register.

FIG. 15 discloses in diagram form the elements comprising the RAM address register 28. In describing the RAM address register, reference will be made to FIG. 3 which shows the waveforms representing the various timing signals utilized in sequencing the memory system. The RAR 28, for the most part, consists of a ROW decode 300 described in detail hereinafter and a latch array 301 comprising four latches 301-1 through 301-4.

Figure 16:
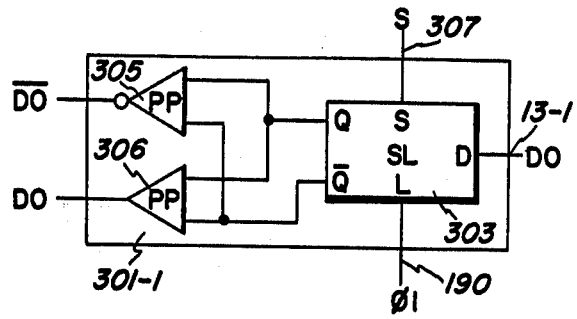
FIG. 16 is a detailed logic diagram of a sample and latch device used in the RAM address register.

An embodiment of one of the latches 301-1 is shown in FIG. 16. The latch 301-1 consists of a sample and latch device 303 whose outputs Q and $\bar{Q}$ are inputs to a push/pull driver 306 and an inverting push/pull driver 305 to produce signals on lines 304-2 and 304-3 which are the driving signals to the row decode array 300. Data is received by the sample and latch device 303 via line 13-1 from the data bus 20. For this particular latch, the data consists of the least significant bit of an instruction word taken from the data bus. The sampling of the data is determined by a signal received on line 307. The data is latched at a rate $\phi 1$ as received on line 190.

The generation of the sampling signal on line 307 can be described with reference to FIG. 15. A NOR gate 309 has three timing inputs $\overline{TA}$, $\overline{TB}$, and $\bar{\phi}2$. TA and TB are generated by locally putting signals TA and TB through inverters (not shown). A control signal input $\overline{S1}$ is received by the NOR gate 309 via line 130-1 from the PLA control 100. The output of NOR gate 309 passes through an inverter-push/pull driver combination 308 to produce the sampling signal at the output of the push/pull driver on line 307.

Each of the latches 301-1 through 301-4 operates in the same manner as the sample and latch device described in FIG. 16. Each of the latches samples data at a rate determined by a signal on line 307 and each of the sample and latch device latches data at a rate $\phi 1$. As each sample and device is latched, it produces two output signals on lines 304. The first output signal has the same waveform logic as the data input signal (on line 13) to the device 301, while the second output signal has a waveform logic which is the complement of the data input signal.

A TD signal, whose use will be described hereinafter, is produced on line 304-1 in the following manner. A NOR gate receives two timing signals $\overline{TA}$, $\overline{TB}$—generated by locally inverting signals TA and TB. The output of NOR gate 313 passes through an inverter-push/pull driver combination 310 to produce the output signal TD on line 304-1. This signal, as well as the other signals 304-2 through 304-9 are used to address the row decode array 300 to access a particular row in the RAM.

Figure 17:
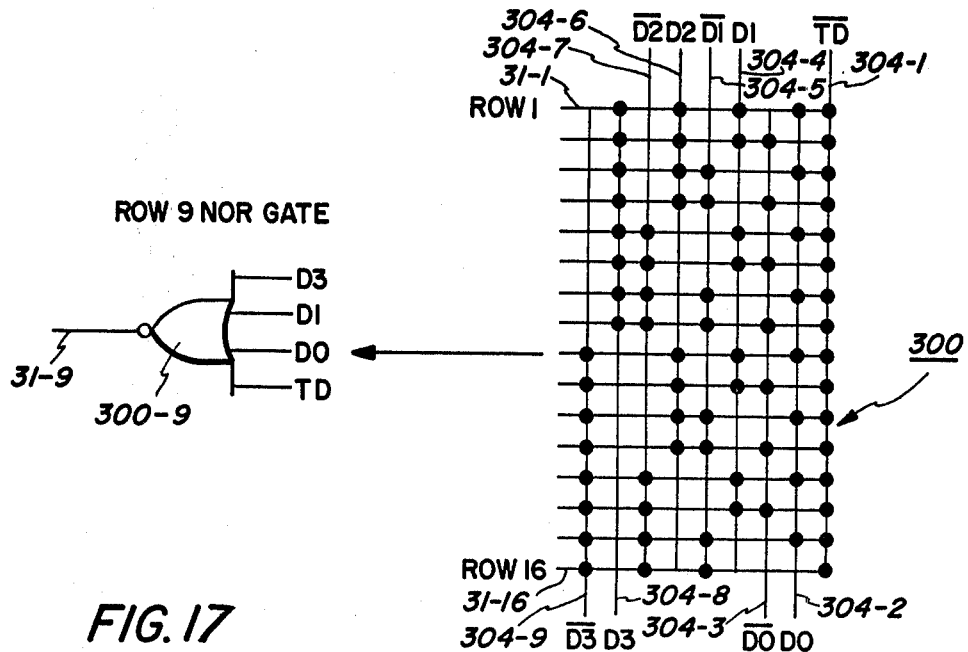
FIG. 17 illustrates the NOR array used in the row decode of the RAM.

How the row decode array operates will be described with reference to FIG. 17. The row decode 300 consists of 16 NOR gates. A representative NOR gate 300-9 is shown in FIG. 17. Rather than showing the other 15 NOR gates, a matrix has been constructed to illustrate the connection of input lines 304-1 through 304-9 to the 16 NOR gates and their associated output lines 31-1 through 31-16. For example, line 302 is equivalent to the NOR gate 300-9. In the matrix, each one of the dots 377 represent an input point for an input line 304. The lines 31-1 through 31-16 represent the outputs of the NOR gates. Thus, line 302 shows the NOR gate 300-9 having inputs TD, D0, D1 and D3, with an output on line 31-9. The output lines 31 show the particular row to be addressed in the RAM by the signal developed in the matrix 300. The array 300 may be implemented by using a programmable logic array.

Figure 20:
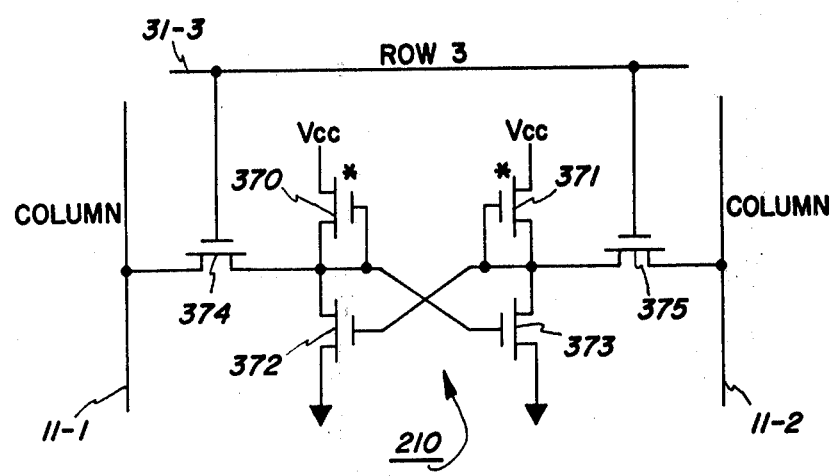
FIG. 20 is a detailed circuit schematic of a preferred RAM memory cell.
Figure 18A:
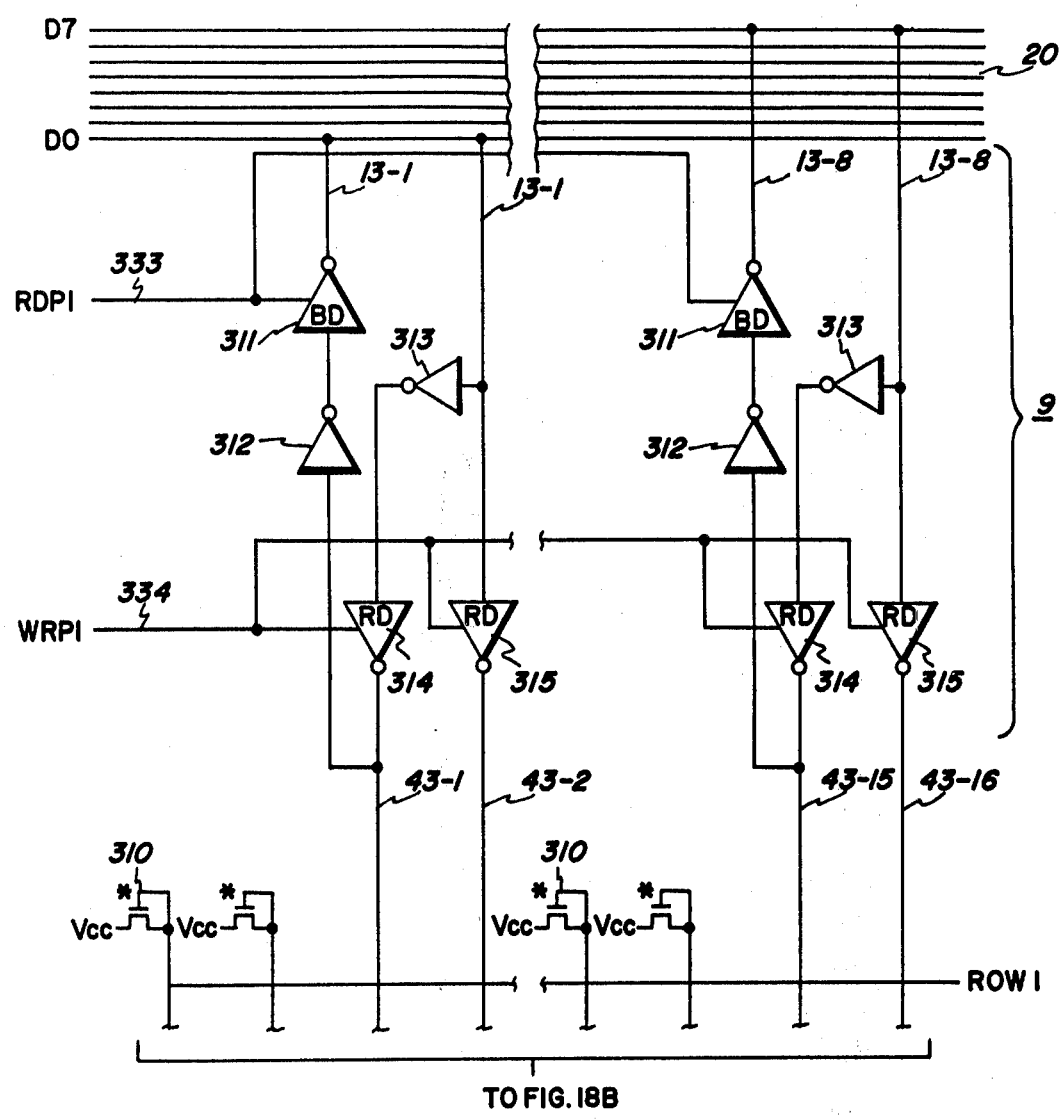
FIG. 18, consisting of 18a Although 18c, is a detailed logic diagram of the RAM and read/write circuitry.
Figure 18B:
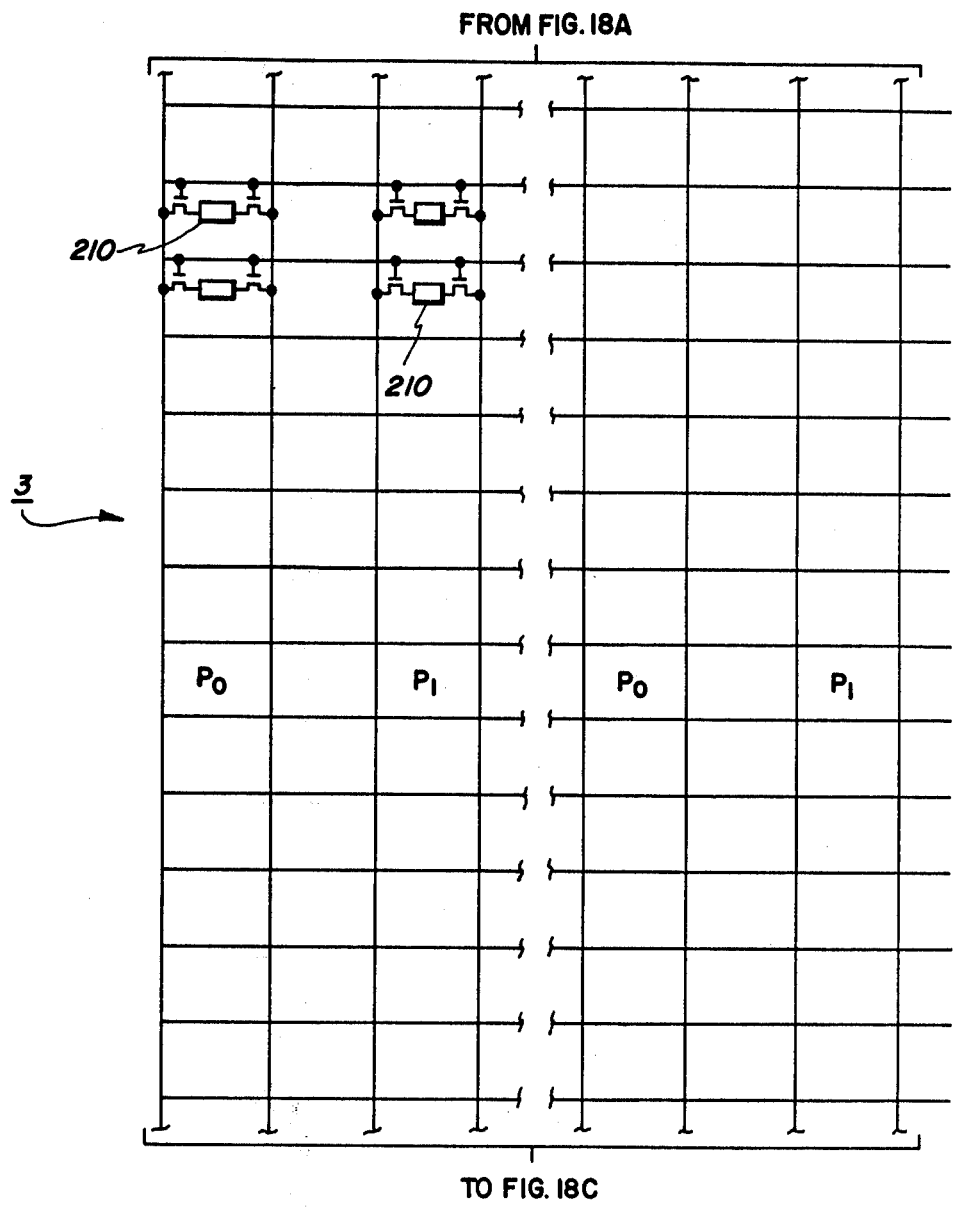
Figure 18C:
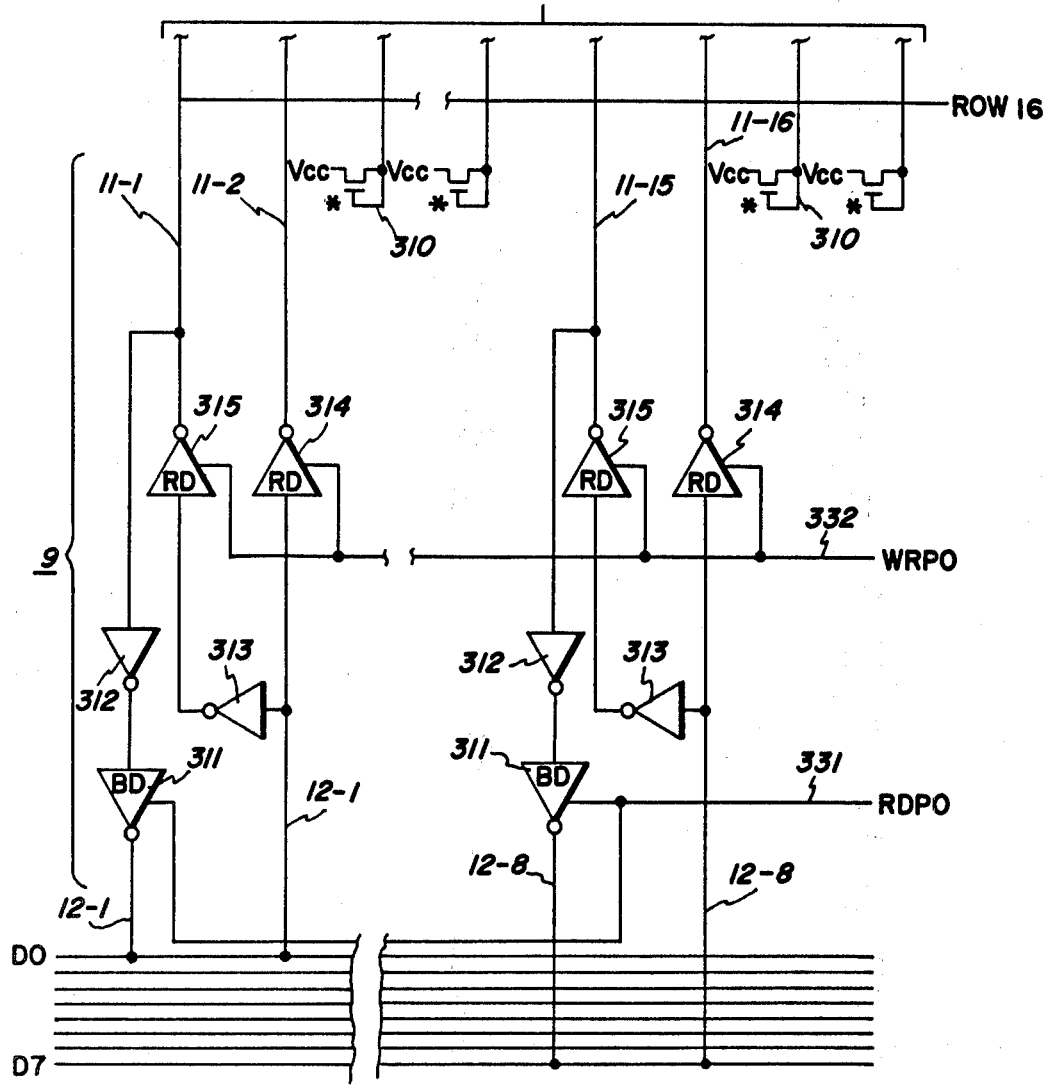

FIG. 18 illustrates the organization of the RAM and the RAM input/output circuitry 9. The RAM is composed of an array of 256 cells 210. Although any static or dynamic memory cells could be used, the preferred embodiment employs a six transistor static RAM cell as illustrated in FIG. 20. Double rail transfer of data is employed. Row or word select lines 31-1 through 31-16 receive word select signals from the RAM address register 28.

With reference to FIGS. 18 and 20, the memory cells 210 operate in the following manner. Transistor 372 and 373 serve as memory storage elements. Transistors 374 and 375 are devices that connect or isolate a given storage cell from the sense bit lines 11. The word select lines 31 control the on or off condition of transistors 374 and 375. Transistors 370 and 371 act as pull-up devices. In the preferred embodiment devices 370 and 371 are depletion-type field effect devices while the remaining transistors 372–375 are enhancement-type field effect devices.

In the storage mode, the memory cell maintains one of its two stable states. The word select line is held low and transistors 374 and 375 are thereof "off." The cell is then isolated from its sense bit lines 11. To change the information stored in the cell, that is to write data in, the sense bit lines are connected to the memory cell by applying a signal to the gates of transistors 374 and 375. Then, for example, if bit line 11-1 is high and 11-2 is low, transistor 372 will turn "off" and transistor 373 will turn "on." This memory state is locked into the memory cell at the completion of the write operation when the signal is removed from the word select line.

To read the contents of a cell, at least one of the sense bit lines 11 must contain sensing circuitry capable of determining the state of the storage cell. The sensing circuitry in the preferred embodiment is an inverter which senses the contents of the cell when the word select line is activated.

The RAM is organized into two pages, P0 and P1, each containing 16 words of eight bits. Each pair of bit lines has associated with it RAM input/output circuitry 9. This circuitry is designed to pass data from the data bus into a particular memory cell during a write operation and from a particular memory cell to the data bus during a read operation. The write circuitry receives data from the data bus on lines 12-1 through 12-8 for RAM page 0 and on lines 13-1 through 13-8 for RAM page 1. These signals pass through an inverter 313 and two precharged data line drivers 314 and 315 to the bit lines 11-1 through 11-16 for page 0 and 43-1 through 43-16 for page 1. All of the bit lines have associated with it pull-up transistors 310 to precharge the bit lines. The data line drivers 314 and 315 are driven by write signals from the read-write page select circuitry 8. For RAM page 0, these signals are received on line 332 and for RAM page 1, these signals are received on line 334. Sensing circuitry 312 is used in a read operation. Each inverter 312 receives a signal from an odd-numbered bit line. The inverted signal is passed through a precharged data line driver 311 and then to the data bus via lines 12-1 through 12-8 for page 0 and 13-1 through 13-8 for page 1. The bus drivers 311 are driven by read signals from the read-write page select circuitry 8. The bus drivers associated with RAM page 0 receive read signals on line 331 and the bus drivers associated with RAM page 1 receive read signals on line 333. The precharged data line drivers 311, 314 and 315 are illustrated in FIG. 46g and will be explained in greater detail hereinafter.

Note that for simplicity only some of the cells 210 and the representative input-output lines are shown in FIG. 18. Even so, it may be noted that the RAM is constructed by interleaving the memory cells and bit lines associated with each page. In this way, silicon real estate may be conserved because the RAM input/output circuitry may be distributed on either side of the RAM 3.

Figure 19A:
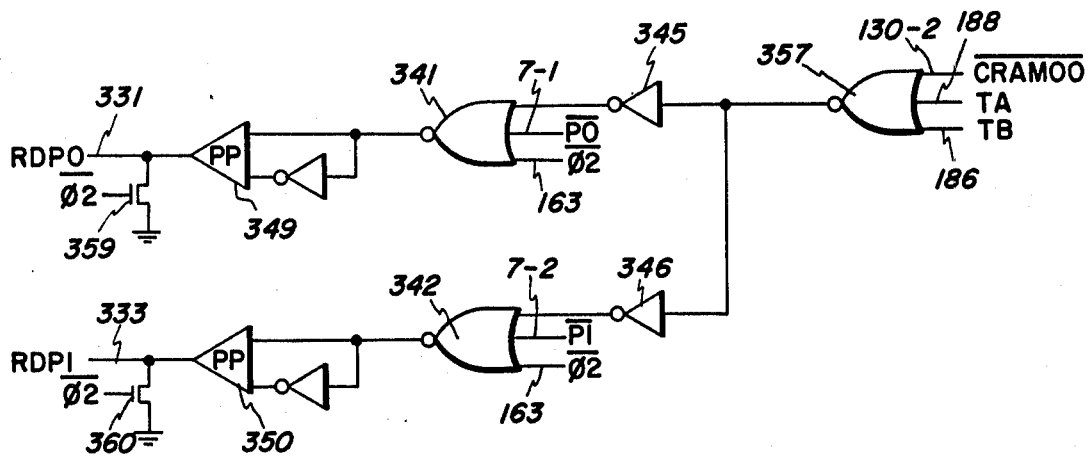
FIGS. 19a and 19b show the read/write and page select control circuitry for the RAM.

The read/write page select circuitry 8 will be described with reference to FIGS. 19a and 19b. FIG. 19a shows the circuitry used to develop the read signals for page 0 and page 1 of the RAM. A NOR gate 357 receives two timing signals TA and TB from the T-counter 125 via lines 188 and 186, as well as a control signal $\overline{CRAM00}$ from the PLA control 100 via line 130-2. The output of the NOR gate 357 is fed through two inverters 345 and 356 into two NOR gates 341 and 342. Each of the NOR gates receive a timing signal $\overline{\phi 2}$ on line 163. NOR gate 341 receives a page select signal $\overline{P0}$ from the page flip-flop 6 via line 7-1 and NOR gate 342 receives a page select signal $\overline{P1}$ from the page flip-flop 6 via line 7-2. The output of NOR gate 341 passes through an inverter-push/pull driver combination 349 to provide the output signal 331 which is the read signal for the circuitry associated with page 0. The output of NOR gate 342 passes through an inverter-push/pull driver combination 350 to provide the read signal on line 333 for page 1 of the RAM. The pull-down transistors 359 and 360 are clocked by $\phi 2$ received on line 163.

Figure 19B:
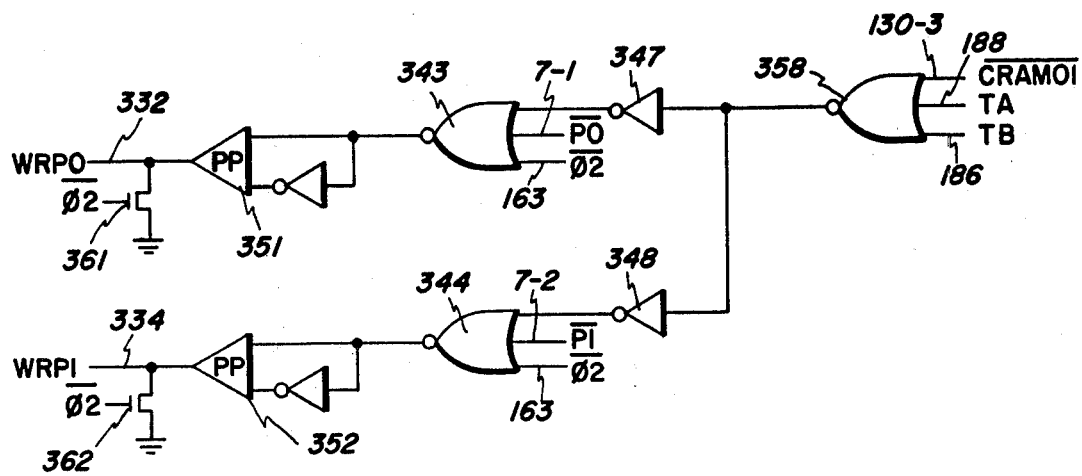
Figure 21A:
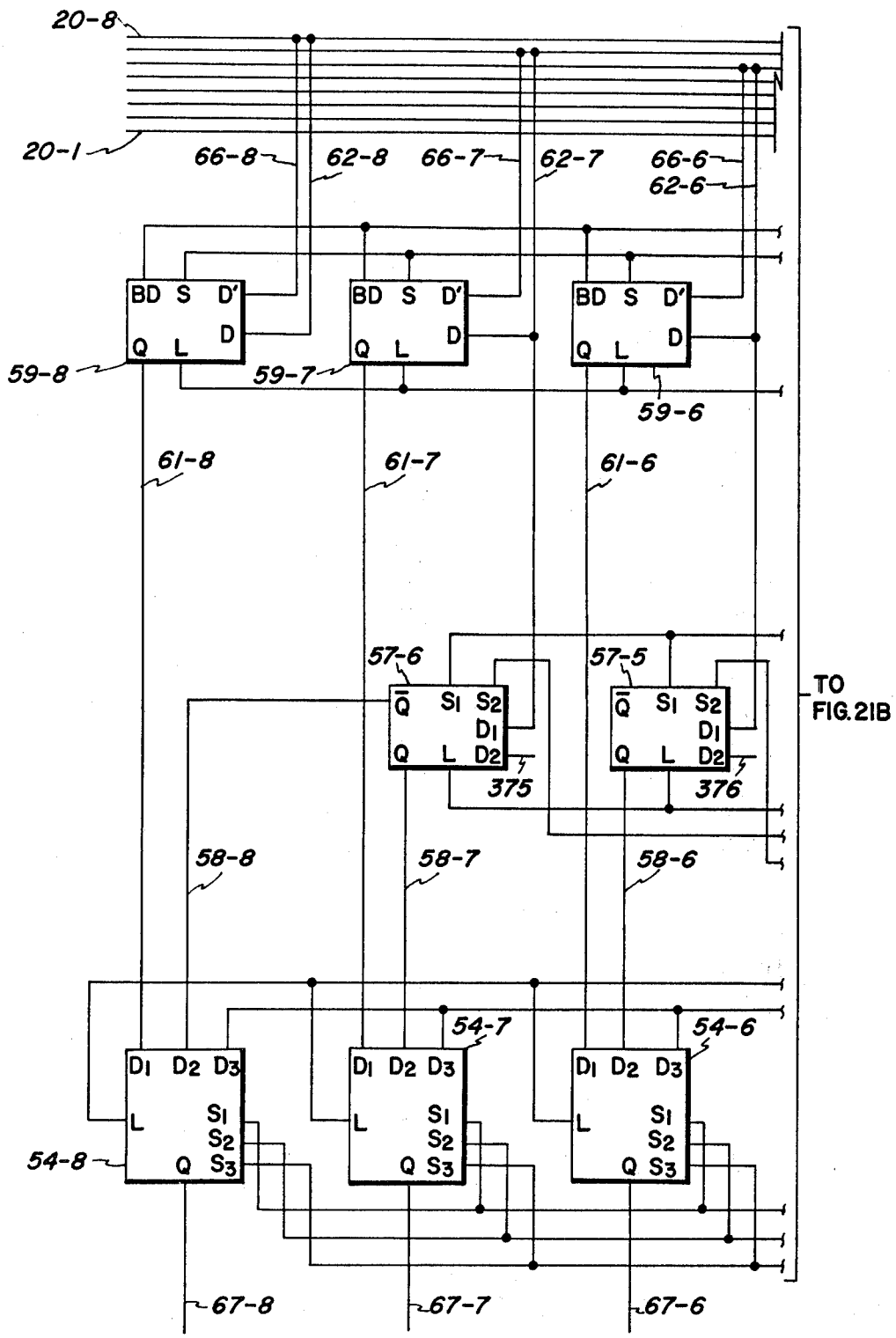
FIG. 21, consisting of 21a through 21c, is a detailed logic diagram showing the T register, status register, and A register of the ALU.
Figure 21B:
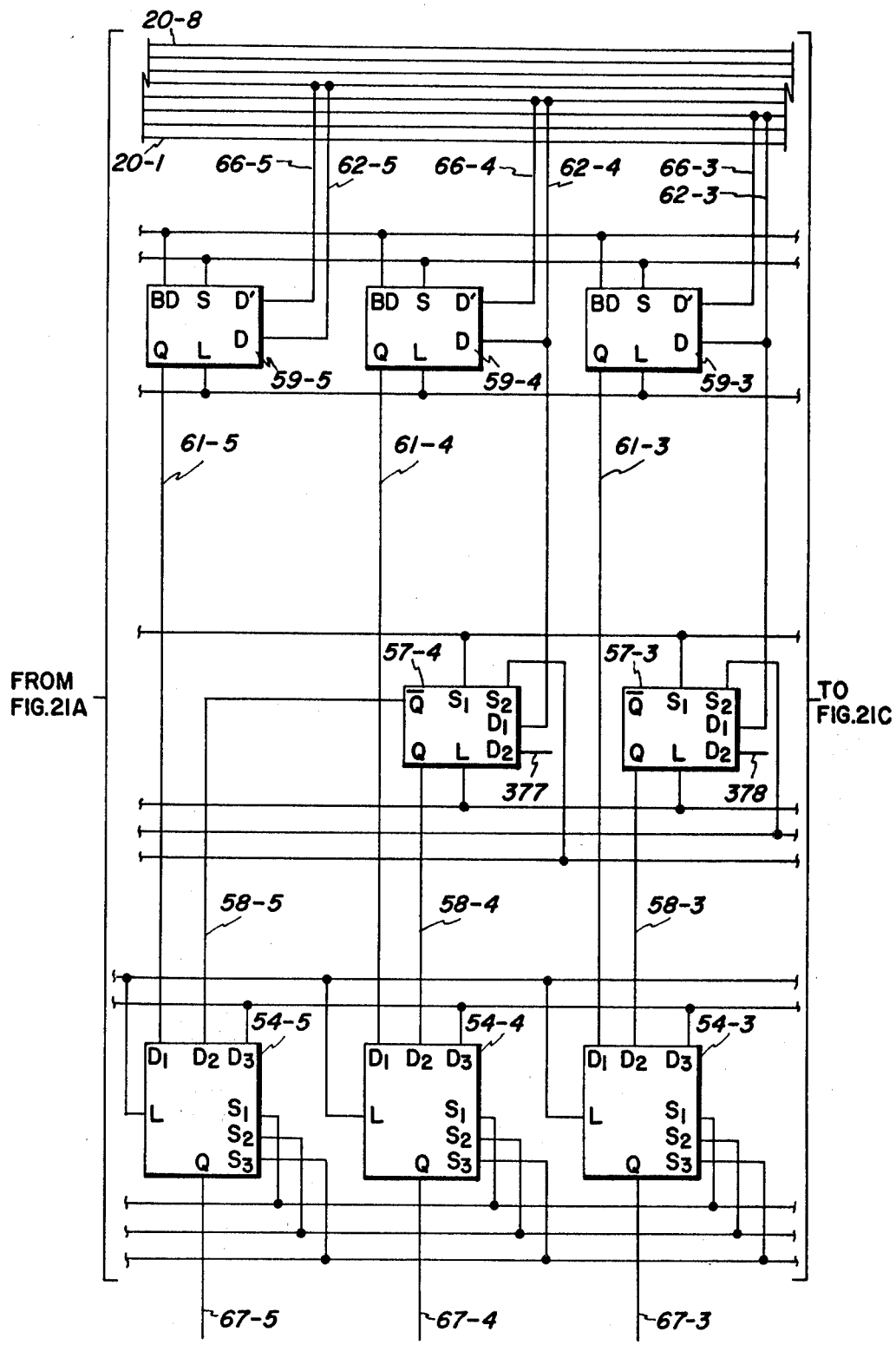
Figure 21C:
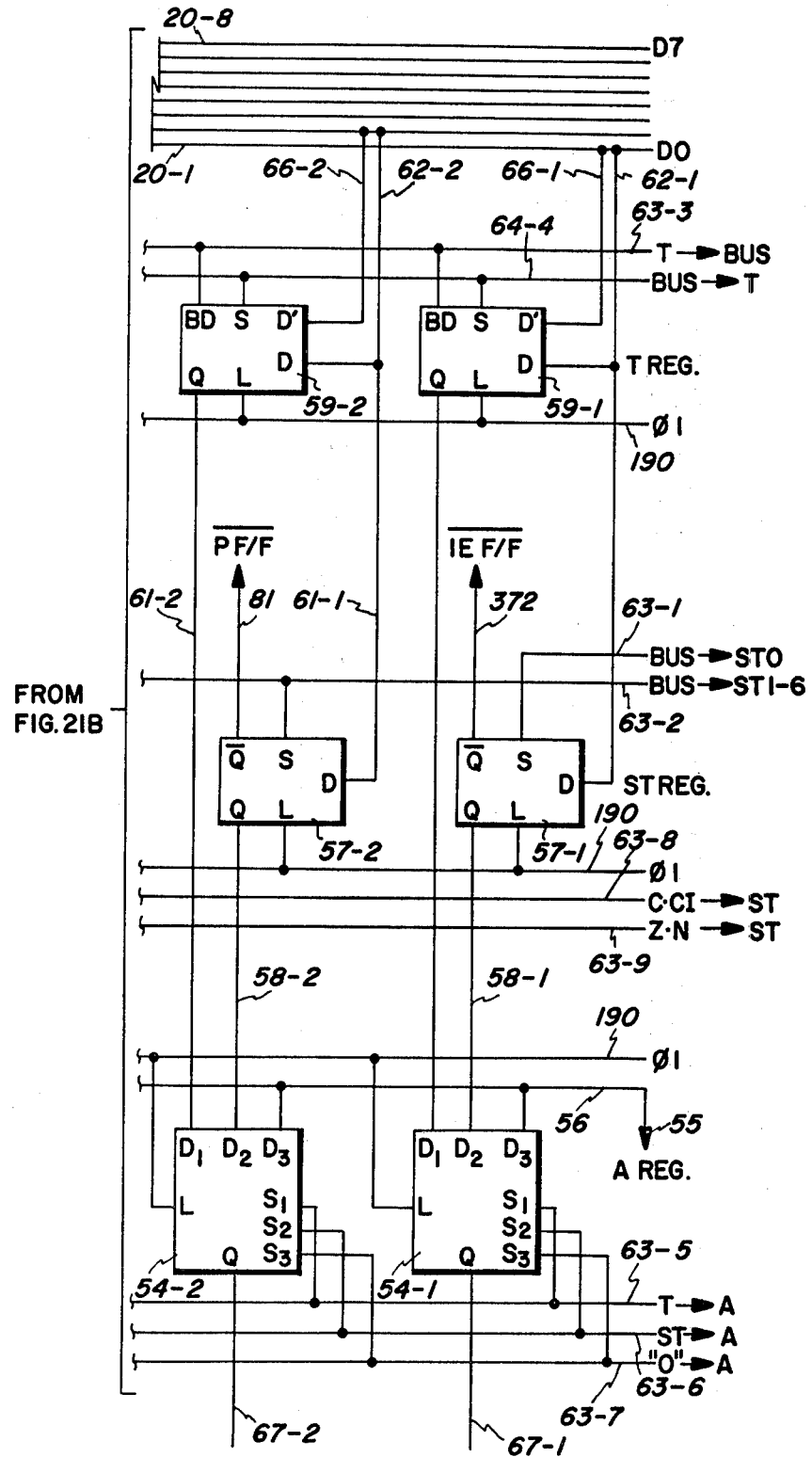
Figure 22A:
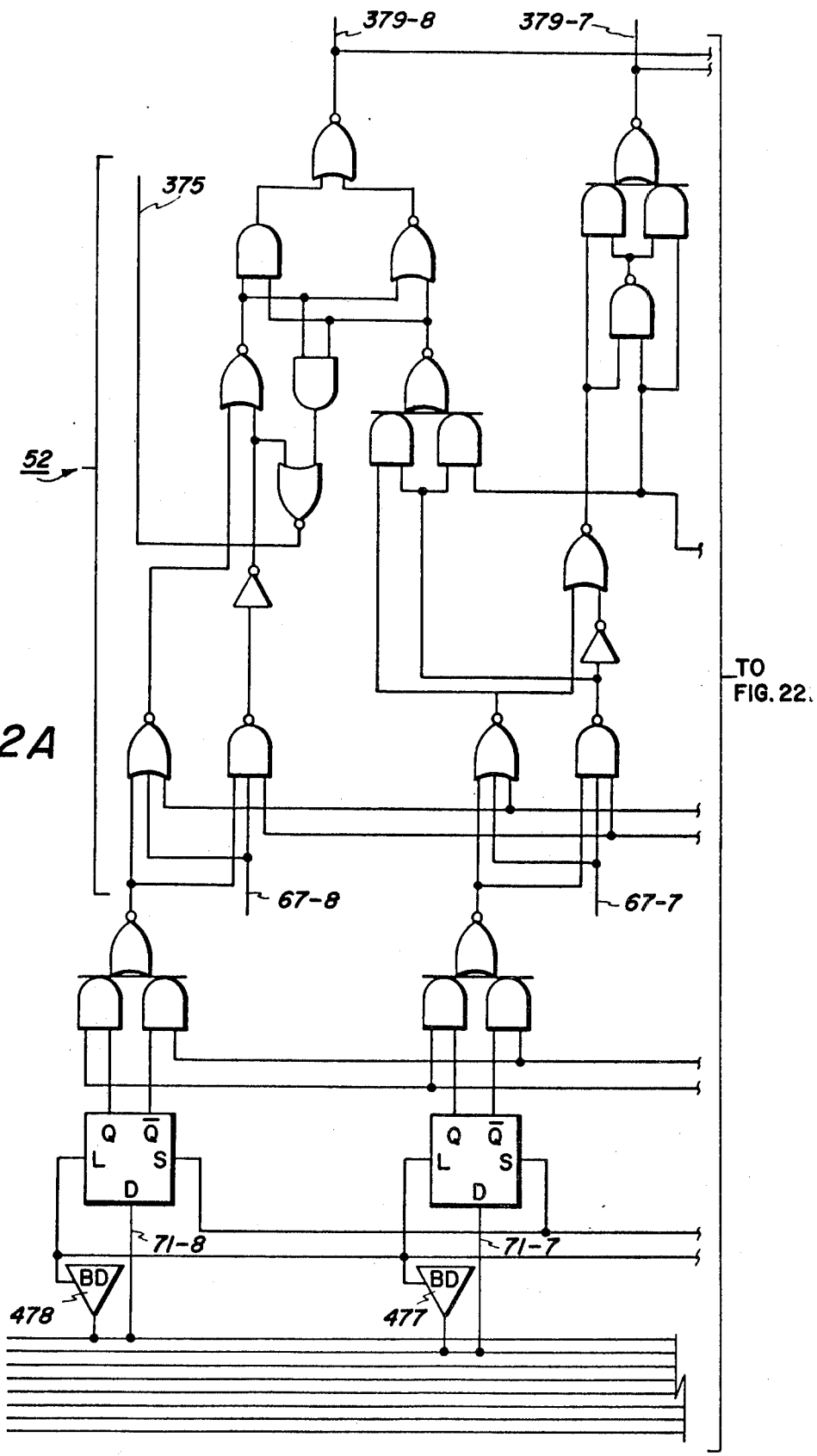
FIG. 22, consisting of 22a through 22d, shows the logic and arithmetic portion of the ALU.
Figure 22B:
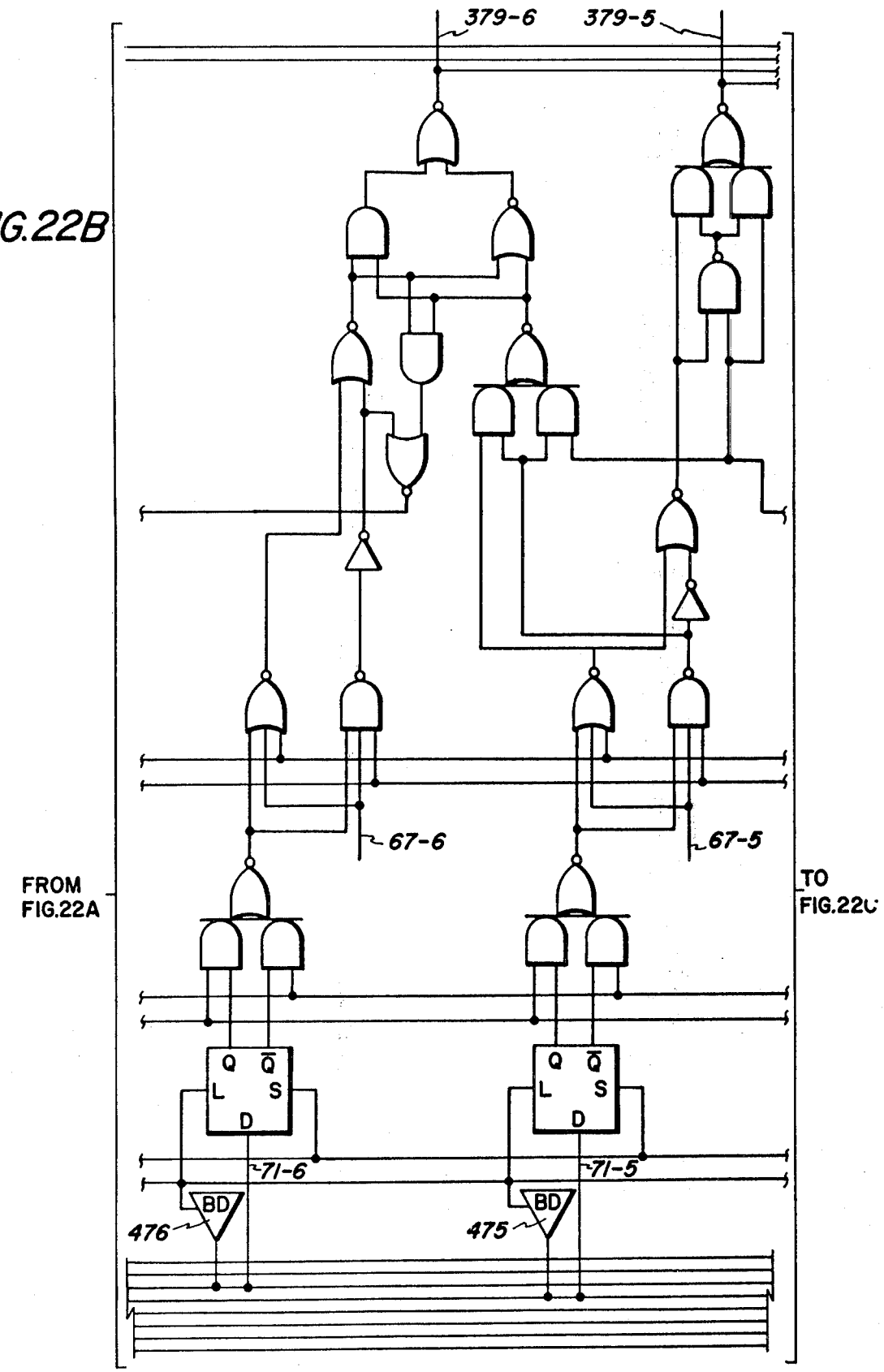
Figure 22C:
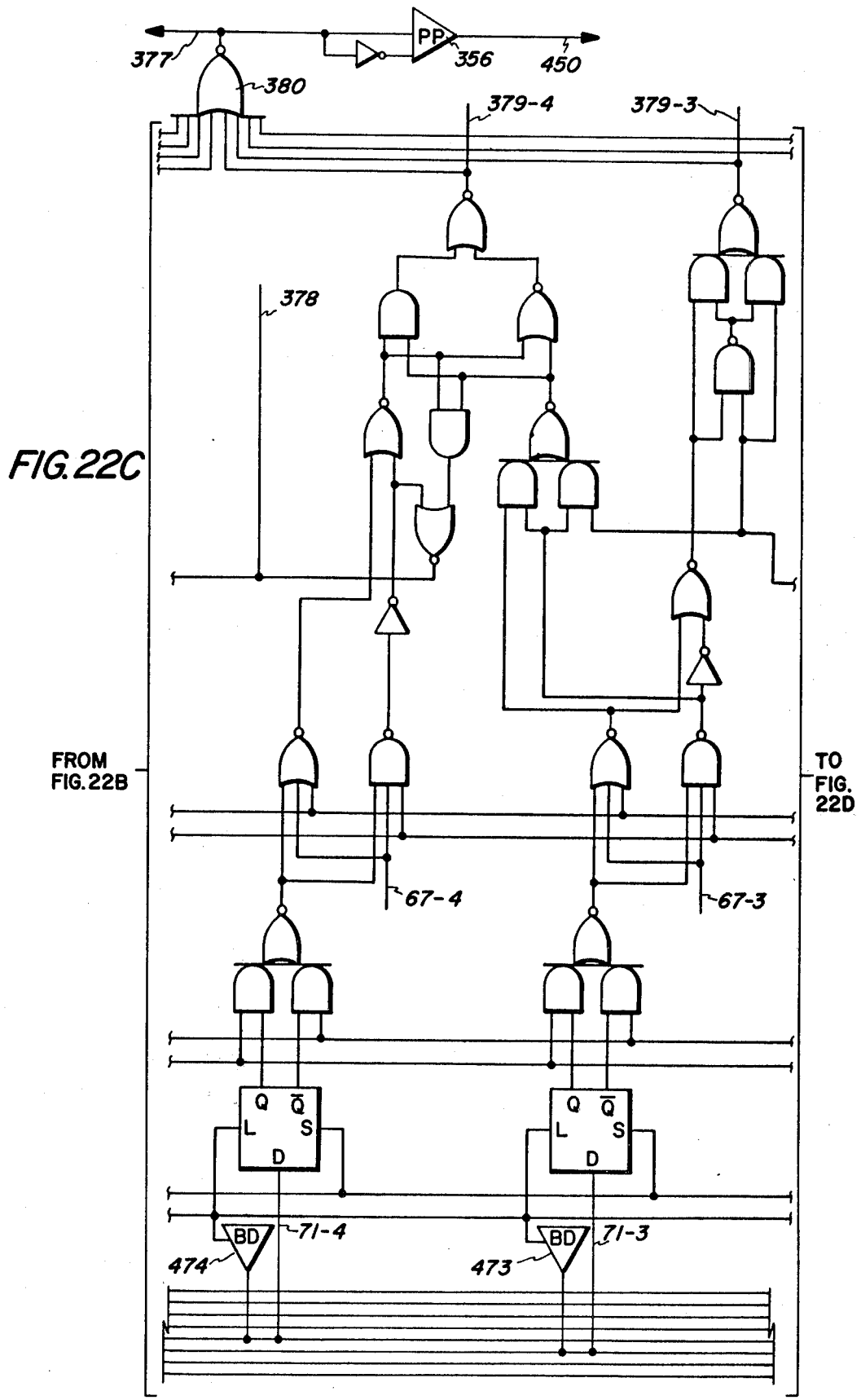
Figure 22D:
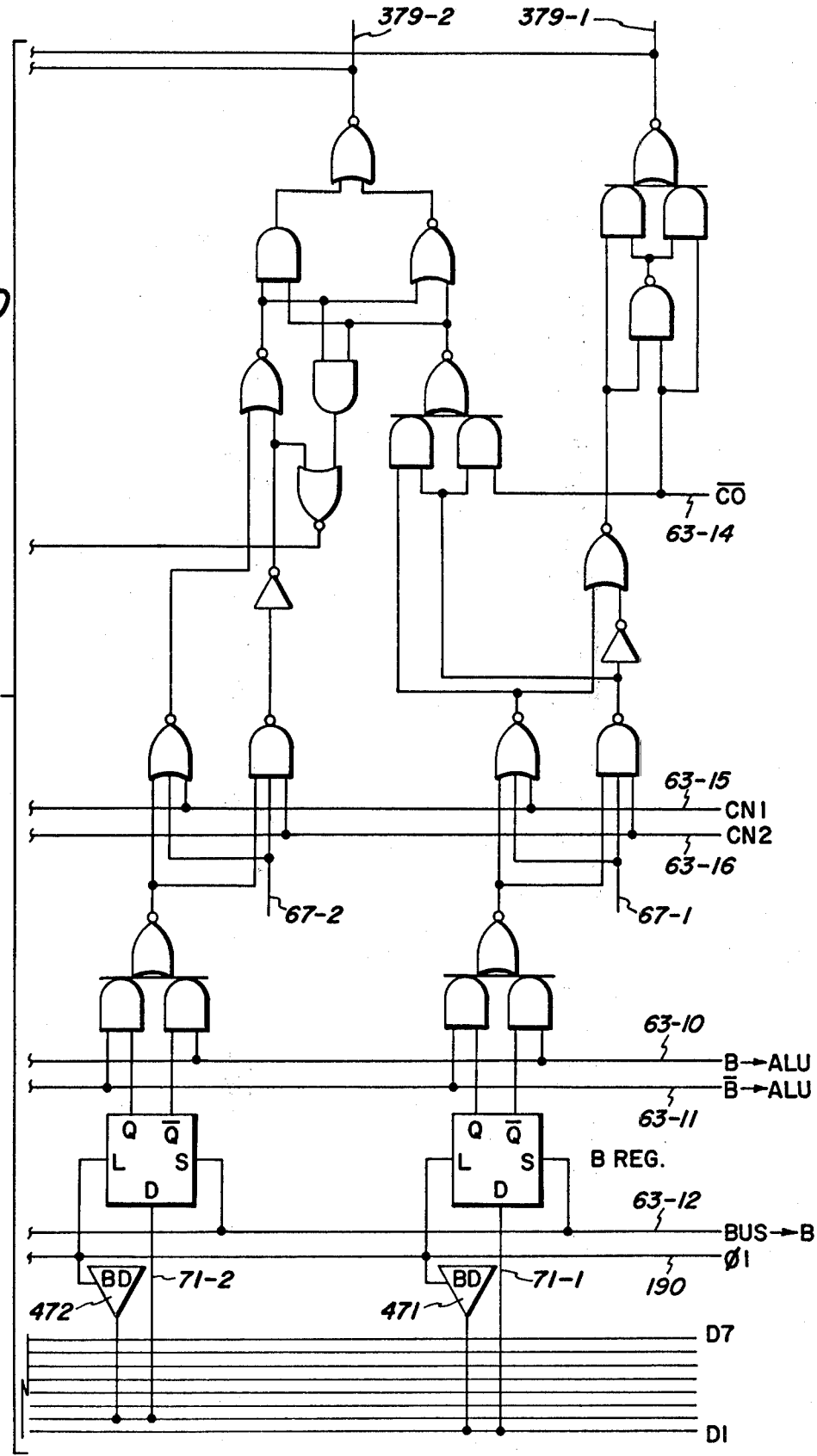

FIG. 19b shows the circuitry used to develop the write signals for page 0 and page 1 of the RAM. A NOR gate 358 receives two timing signals TA and TB from the T-counter 125 via lines 188 and 186 as well as a control signal $\overline{CRAM01}$ from the PLA control 100 via line 130-3. The output of the NOR gate 358 is fed through two inverters 347 and 348 into two NOR gates 343 and 344. Each of the NOR gates receive a timing signal $\overline{\phi 2}$ on line 163. NOR gate 343 receives a page select signal $\overline{P0}$ from the page flip-flop 6 via line 7-1 and NOR gate 344 receives a page select signal $\overline{P1}$ from the page flip-flop 6 via line 7-2. The output of NOR gate 343 passes through an inverter-push/pull driver combination 351 to provide the output signal 332 which is the write signal for the circuitry associated with page 0. The output of NOR gate 344, passes through an inverter-push/pull driver combination 352 to provide the write signal on line 334 for page 1 of the RAM. The pull-down transistors 361 and 362 are clocked by $\overline{\phi 2}$ received on line 163.

ELIMINATION OF RACE CONDITIONS IN THE RAM

As is known in the art, for static cells, the column lines or bit lines are charged prior to the time that information is read from the cell. This charging is accomplished by the depletion-type field effect devices 310 from the Vcc potential during "dead" time, this time generally being the time when the control signal $\overline{S1}$ is high indicating that the memory is not selected.

A problem that is encountered in memories, particularly as access time is decreased, is that of multiple selection. Often address buffers are utilized to generate a complement of an address, thus for each address bit its complement is also used in the decoders. However, if the complement bits are delayed from the "true" address bits (because of delays in the address buffers) multiple selection can occur.

Multiple address conditions in the RAM row decoder 300 are avoided by the use of the TD signal as a fifth input to the row decode NOR gates. The TD signal unselects all rows while the RAM address latch 301 is being loaded with the address of the next row to be selected during TD·$\phi 2$. After TD goes low, the selected row is allowed to go high. This gives a time gap between the deselecting of the previous row and the selecting of the presently addressed row (which is about as wide as time slot TD), making it impossible to address two rows simultaneously.

ALU AND CONTROL

The arithmetic and logic unit (ALU) 52 as well as associated registers define the area of the microprocessor unit which carries out both arithmetic and logic operations. In particular, the ALU 52 with its associated registers, the RAM 3 and CROM 85 in the preferred embodiment is programmed to perform eight-bit add, increment, twos complement compare, twos complement negate, logic-OR logic-AND, ones complement, single-bit setting/resetting, and testing. The ALU area 78 may be further programmed to perform other functions, or variants of these functions. The basic ALU hardware 52 by itself can only perform four operations; ADD, ADD with carry, logic-OR, and logic-AND. The ALU subsystem 78 will be described with reference to FIGS. 21 through 26. The A Register (A-Reg) 54 stores one of the operands for ALU operations. The A-Reg 54 comprises eight multiple input unitary output sample and latch devices 54-1 through 54-8. Each sample and latch device is latched by a signal φ1 received on line 190. The A-Reg 54 may receive data from any one of three sources. Data may be received from the T-Register 59 on lines 61-1 through 61-8 and sampled by the A-Reg when an appropriate control signal is received on line 63-5 (how this as well as other control signals are developed will be explained hereinafter). Data may be received from the status register (ST-Reg) 57 via lines 58-1 through 58-8 and sampled when an appropriate control signal is received on line 63-6. The A-Reg may be cleared by connecting one of its inputs to ground 55 via line 56 when an appropriate control signal is received on line 63-7. The contents of the A-Reg appears as an output signal on lines 67-1 through 67-8.

The status register 57 stores the status indications resulting from an arithmetic or logic operation as well as the status indications of the page and interrupt enable flip/flops. The ST-Reg comprises six sample and latch devices 57-1 through 57-6. All of the devices 57-1 through 57-6 are latched by a φ1 signal received on line 190. Devices 57-1 through 57-4 receives data from the data bus via lines 62-1 through 62-4. The sample rate for device 57-1 is determined by a signal received on line 63-1 while the sample rate for devices 57-2 through 57-4 is determined by the signal received on line 63-2. Devices 57-5 and 57-6 receive data from the data bus via lines 62-6 and 62-7 at a sampling rate determined by the signal to be received on line 63-2. Each of the sample and latch devices 57-1 through 57-6 has associated with it a particular status bit. Device 57-1 contains the Interrupt Enable (IE) signal the status of which is received from the data bus. The $\overline{Q}$ output of device 57-1 provides the control signal via line 372 to operate the Interrupt Enable flip-flop 83. Device 57-2 contains the page (P) signal the status of which is received from the data bus. The $\overline{Q}$ output of device 57-2 provides on line 371 the control signal to operate the Page flip-flop 6. Device 57-3 contains the Carry Intermediate flag (CI) the status of which may be received either on line 62-3 or from the ALU on line 378. Device 57-4 contains the Zero (Z) flag, the status of which may be obtained from the data bus on line 62-6 or from the ALU on line 376. Device 57-6 contains the Carry (C) flag, the status of which may be obtained from the data bus on line 62-7 or from the ALU on line 375. The data from the ALU is sampled by devices 57-3 and 57-6 at a rate determined by a control signal received on line 63-8. The data received from the ALU by devices 57-4 and 57-5 is sampled at a rate determined by control signal received on line 63-9.

The temporary register (T-Reg) 59 holds data to aid in accomplishing ALU operations. The T-Reg comprises sample and latch devices 59-1 through 59-8 which receive data from the data bus via lines 62-1 through 62-8 and output data to the data bus via lines 66-1 through 66-8. The temporary register is latched at a rate φ1 as received on line 190. The data received from the data bus is sampled in response to a control signal received on line 63-4. The data is output to the data bus in response to a control signal received on line 63-3. See FIG. 46 for an illustration of the circuitry used in implementing any one of the devices 59-1 through 59-8.

With reference to FIG. 22, the B Register (B-Reg) 53 is a second operand for the ALU and comprises sample and latch devices 53-1 through 53-8 which receives data from the data bus via lines 71-1 through 71-8 after passing through bus drivers 471 through 478. The bus drivers pass data from the data bus to the sample and latch devices at a rate φ1 as received on line 382. Likewise, the devices are latched at a rate φ1 as received on line 190. The data received by each one of the devices 53-1 through 53-8 is sampled at a rate determined by a control signal received on line 63-12. A series of logic gates 74-1 through 74-8 define a multiplexer for receiving the Q and $\overline{Q}$ outputs of each of the sample and latch devices 53-1 through 53-8 respectively. The multiplexer 74 outputs the B-operand or the complement of the B-operand into the ALU on line 75-1 through 75-8 in response to appropriate control signals. To output the contents of the B-Reg, the multiplexer responds to a signal on line 63-10 and to output the complement of B, the multiplexer responds to a signal on line 63-10 and to output the complement of B, the multiplexer responds to a signal on line 63-11.

The output of the A-Reg is received by the ALU on line 67-1 through 67-8. The logic circuitry within the brackets 52 defines the heart of the ALU. As will be recognized by those skilled in the art, all of the arithmetic and logic operations on the operands received from the A and B Registers can be accomplished within the ALU 52 in response to three control signals received on line 63-14, 63-15, and 63-16. The output of the ALU appears as an eight-bit word on lines 379-1 through 379-8 (from the least significant to the most significant bit). The 379 outputs are fed into NOR gate 380 to generate a signal associated with the zero flag. This signal is fed directly into the status register via line 377. The output of NOR gate 380 also appears as a signal, the purpose of which will be explained hereinafter, on line 450 after passing through inverter-push/pull driver combination 356.

Figure 23:
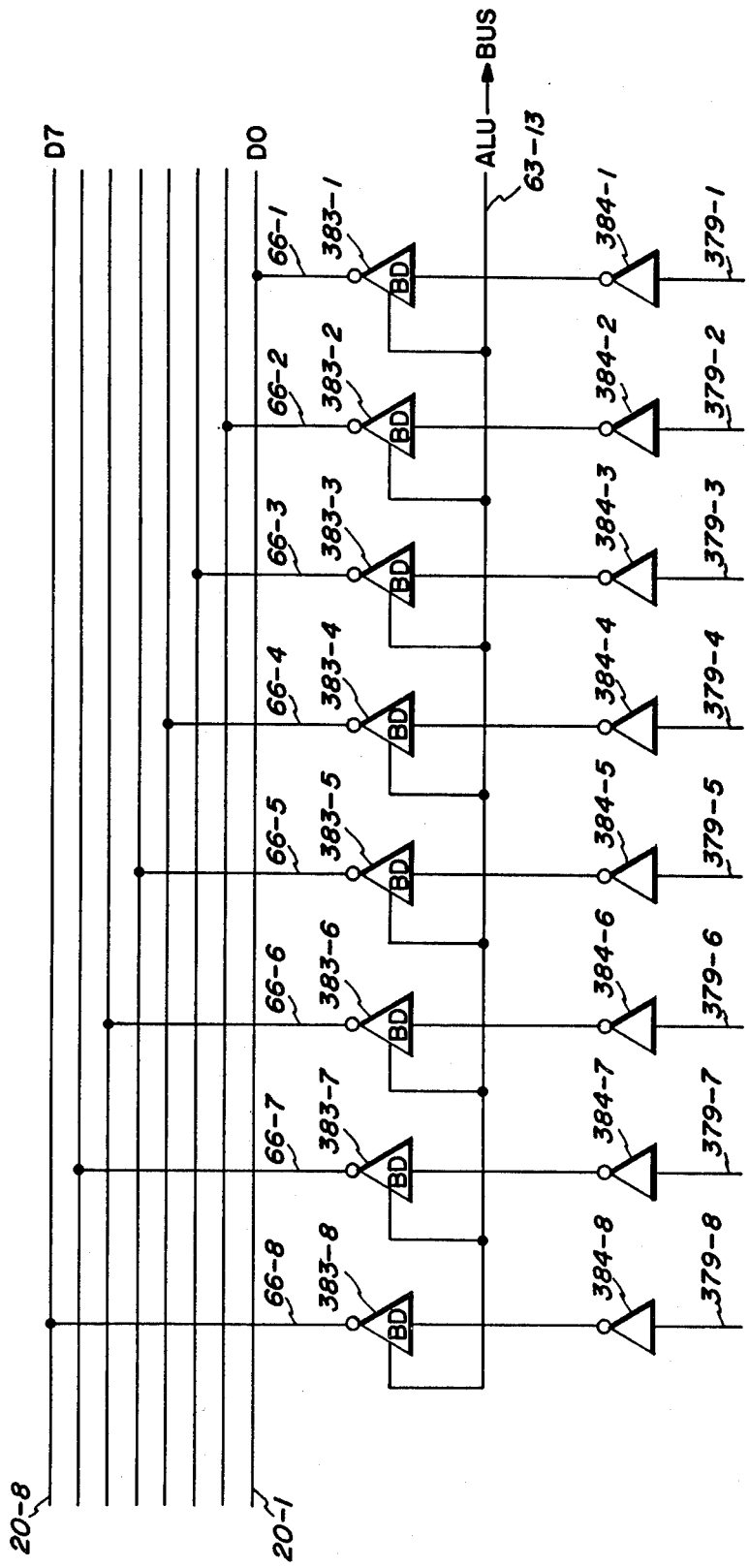
FIG. 23 is a detailed logic diagram of the output circuitry from the ALU to the data bus.

As shown in FIG. 23, the outputs of the ALU on line 379-1 through 379-8 are fed into inverters 384-1 through 384-8 and then into bus drivers 383-1 through 383-8. The outputs of the bus drivers transfer the data to the data bus via lines 66-1 through 66-8 in response to a control signal received on line 63-13.

How the control signals are developed to enable the ALU to carry out its operations will be described with reference to FIGS. 24 through 27.

Figure 24:
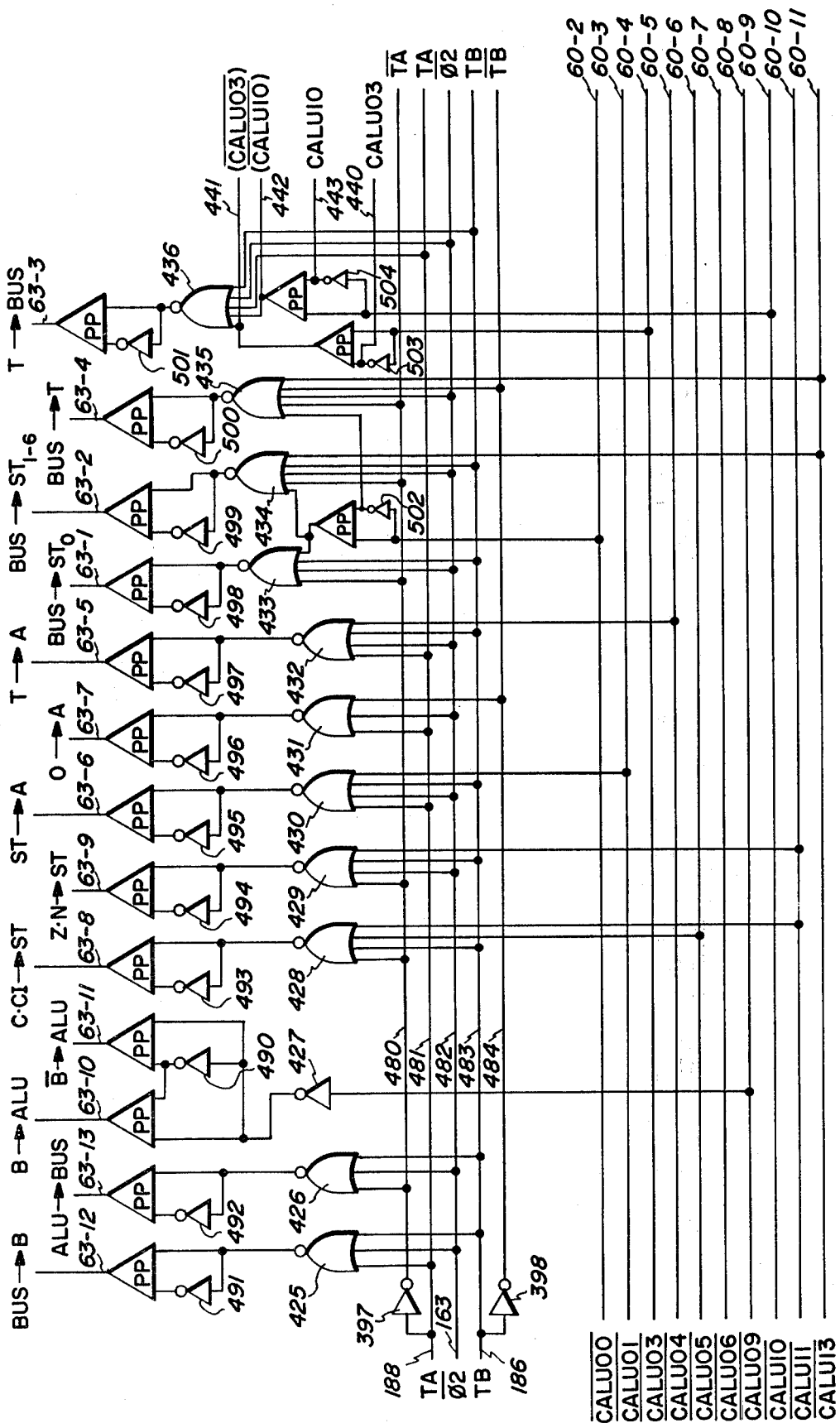
FIGS. 24-25 constitute a detailed logic diagram of a portion of the ALU control circuitry.
Figure 25:
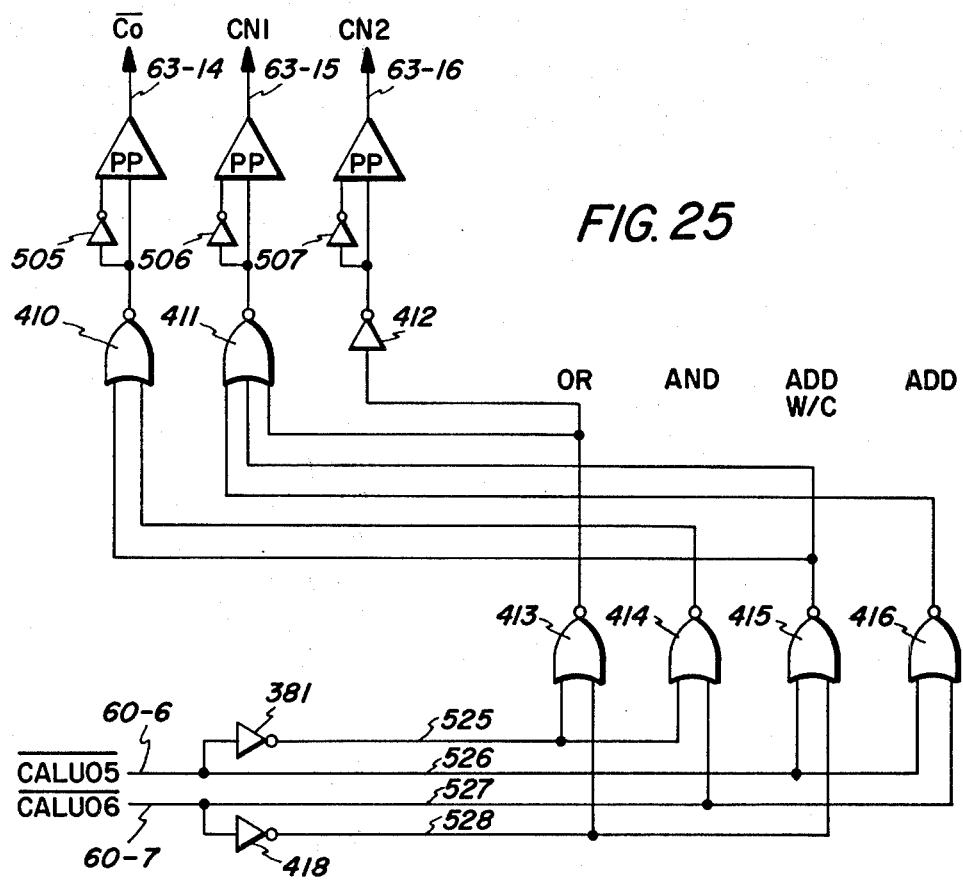

As shown in FIGS. 24 and 25, a set of PLA control signals $\overline{CALU00}$, $\overline{CALU01}$, $\overline{CALU03}$, $\overline{CALU04}$, $\overline{CALU05}$, $\overline{CALU06}$, $\overline{CALU09}$, $\overline{CALU10}$, $\overline{CALU11}$, and $\overline{CALU13}$ are provided to the ALU control 77 from the PLA control 100 via lines 60-2 through 60-11. Three timing signals TA, TB and φ2 are received from the T-counter 125 on lines 188, 186 and 163 respectively. TA and TB are each placed through inverters 397 and 398 to yield their complement. Thus, TA appears on line 480, $\overline{TA}$ appears on line 481, $\overline{\phi 2}$ appears on line 482, TB appears on line 483, and $\overline{TB}$ appears on line 484. These timing signals, as well as the PLA control signals, are the input signals to various logic gates which yield the ALU control signals which appear on lines 63-1 through 63-16.

Nor gate 425 has three inputs to receive $\overline{TA}$, $\overline{\phi 2}$ and TB. The output of 425 is put through an inverter-push/pull driver combination 491 whose output is control signal 63-12 (Bus→B). Nor gate 426 has three inputs to receive $\overline{TA}$, $\overline{\phi 2}$, and TB. The output of NOR gate 426 passes through an inverter-push/pull driver combination 492 to yield control signal 63-13 (ALU→BUS). The input of inverter 427 receives control signal $\overline{CALU09}$. The output of inverter 427 passes through an inverter-push/pull driver combination 490 to yield two control signals on lines 63-10 (B→ALU) and 63-11

(B→ALU). NOR gate 428 has five inputs to receive $\overline{TA}$, $\overline{\phi 2}$, TB, $\overline{CALU05}$, and $\overline{CALU11}$. The output of NOR gate 428 passes through an inverter-push/pull driver combination 493, the output of which is control signal 63-8 (C·CI→ST). NOR gate 429 has four inputs to receive $\overline{TA}$, $\overline{\phi 2}$, TB and $\overline{CALU11}$. The output of NOR gate 429 passes through an inverter-push/pull driver combination 494, the output of which is control signal 63-9 (Z·N→ST). NOR gate 430 has four inputs to receive TA, $\overline{\phi 2}$, TB and $\overline{CALU01}$. The output of NOR gate 430 passes through an inverter-push/pull driver combination 495, the output of which is control signal 63-6 (ST→A). NOR gate 431 has three inputs to receive TA, $\overline{\phi 2}$, and $\overline{TB}$. The output of NOR gate 431 passes through an inverter-push/pull driver combination 496, the output of which is control signal 63-7 (O→A). Nor gate 432 has four inputs to receive TA, $\overline{\phi 2}$, TB, and $\overline{CALU04}$. The output of NOR gate 432 passes through an inverter-push/pull driver combination 497, the output of which is control signal 63-5 (T→A). Nor gate 433 has four inputs to receive $\overline{TA}$, $\overline{\phi 2}$, TB, and $\overline{CALU00}$ after it passes through an inverter-push/pull driver combination 502. The output of NOR gate 433 passes through an inverter-push/pull driver combination 498, the output of which is control signal 63-1 (BUS→$ST_o$). NOR gate 434 has five inputs to receive $\overline{TA}$, $\overline{\phi 2}$, TB, and $\overline{CALU13}$ and the output of NOR gate 434 passes through an inverter-push/pull driver combination 499, the output of which is control line 63-2 (BUS→$ST_{1-6}$). NOR gate 435 has five inputs to receive $\overline{TA}$, $\overline{\phi 2}$, $\overline{TB}$, and $\overline{CALU13}$, and the output of the inverter in the inverter-push/pull driver combination 502. The output of NOR gate 435 passes through an inverter-push/pull driver combination 500 to yield a control signal on line 63-4 (BUS→T). NOR gate 436 has five inputs to receive TA, $\phi 2$, TB, $\overline{CALU03}$ after passing through an inverter-push/pull driver combination 503 and $\overline{CALU10}$ after passing through an inverter-push/pull driver combination 504. The output of NOR gate 436 passes through an inverter-push/pull driver combination 501 whose output is the control signal on line 63-3 (T→BUS).

The output of inverter-push/pull driver 503 also appears on line 441. The output of inverter-push/pull driver 404 appears on line 442. The output of the inverter in the inverter-push/pull driver combination 503 appears on line 440 and the output of the inverter in the inverter-push/pull driver combination 504 appears on line 443. The signals appearing on these lines will be explained hereinafter with reference to FIG. 26.

FIG. 25 illustrates the circuitry used to develop control signals for carrying out specific logic and arithmetic operations. In particular, the following operations are carried out by three control signals — OR, AND, ADD W/C (add with carry) and ADD. Two PLA control signals, $\overline{CALU05}$ and $\overline{CALU06}$, are received by the circuitry on lines 60-6 and 60-7, respectively, from PLA control 100. These signals are then each passed through an inverter 381 and 418 to produce the following signals; CALU05 on line 525, $\overline{CALU05}$ on line 526, $\overline{CALU06}$ on line 527, and CALU06 on line 528. These signals are then fed into four NOR gates 413 through 416 which, together, act as a one-of-four decoder. The outputs of the NOR gate 413 through 416 are fed into two NOR gates, 410 and 411, and an inverter 412. The output of NOR gate 410 is passed through an inverter-push/pull driver combination 505 to produce $\overline{Co}$ on line 63-14. The output of NOR gate 411 is put through an inverter-push/pull driver combination 506 to produce CN1 on line 63-15. The output of inverter 412 is put through an inverter-push/pull driver combination 507 to produce CN2 on line 63-16. In the preferred embodiment gates 410-416 are implemented through the use of a programmable logic array. By way of example, how the control signals on 63-14 through 63-16 are selected to carry out an "OR" operation in the ALU will be described. In order to carry out the "OR" operation, NOR gate 413 must have a high output and the remaining NOR gates 414-416 must have low outputs. This is the case when $\overline{CALU05}$ and $\overline{CALU06}$ are both high. Under these circumstances, the output of NOR gate 410 is high, the output of NOR gate 411 is high, and the output of inverter 412 is low. Thus, $\overline{CO}$ and CN1 are high while CN2 is low. These signals are received by the ALU where one skilled in the art can see that the "OR" function is carried out between the data originally contained in the B-operand registers and the A operand registers. The ALU 52 actually operates on the output of the MUX 74 which is the data content or its complement of the B-Reg.

Figure 27:
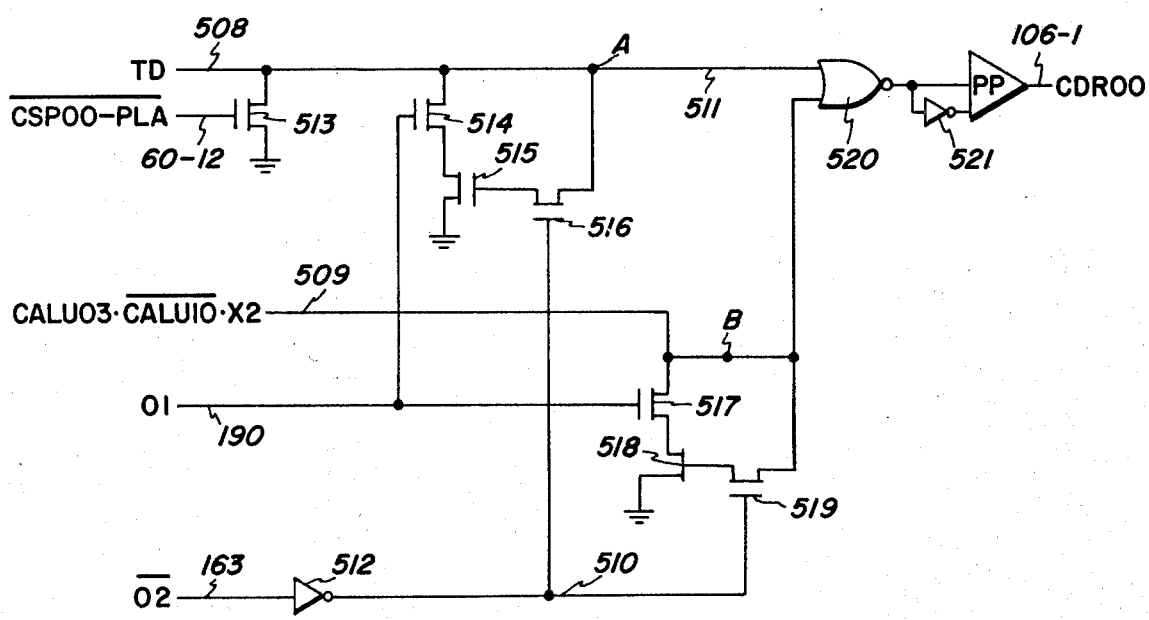
FIG. 27 is a detailed circuit schematic of a circuit employing the time slot end predictor.
Figure 26:
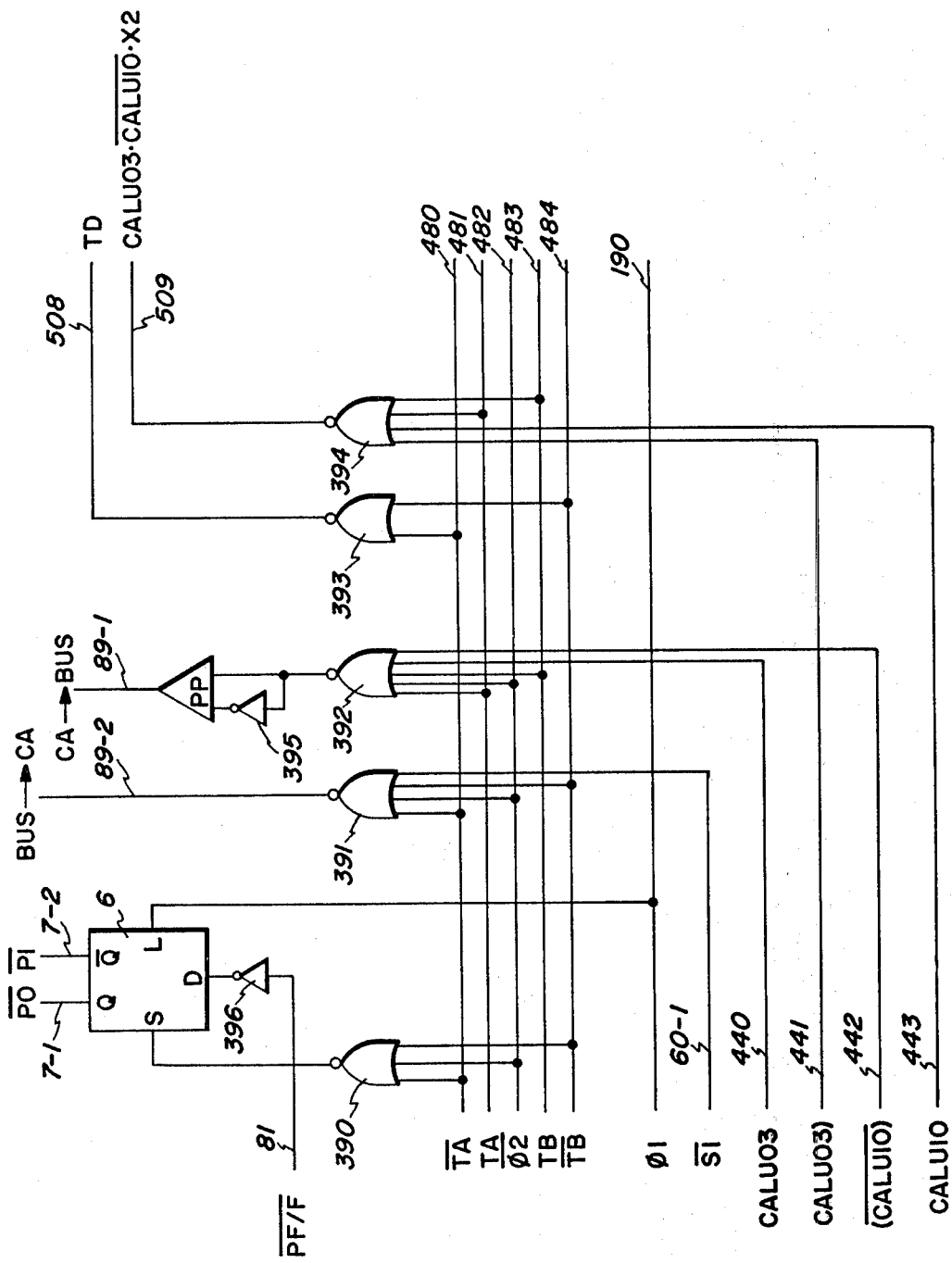
FIG. 26 is a detailed logic diagram of the remaining ALU control circuitry.

Associated with the ALU control 77 is additional circuitry for producing control signals for elements other than those contained in the ALU subsystem. This circuitry is illustrated in FIGS. 26 and 27. The timing signals for this circuitry appear on lines 480 and 484. The ALU control signals for this circuitry appear on lines 440 through 443. In addition, a control signal $\overline{S1}$ is received from the PLA control 100 via line 60-1. A $\phi 1$ signal is also supplied on line 190.

The page flip-flop 6 is a sample and latch device which has at its output the page 0 and page 1 control signals $\overline{P0}$ and $\overline{P1}$ appearing on lines 7-1 through 7-2. The sample and latch device 6 is latched at a rate $\phi 1$. The data to the device 6 eminates from the sample and latch device 57-2 via line 81. The signal is then placed through an inverter 396 and into the data input of the sample and latch device 6. This data is sampled at a rate determined by the output of NOR gate 390 which has as its inputs $\overline{TA}$, $\overline{\phi 2}$, and $\overline{TB}$.

Two signals, CA→BUS on line 89-1 and BUS→CA on line 89-2 are used with the CROM 85 as will be explained hereinafter. These signals are developed in the following way. A NOR gate 391 has four inputs comprising $\overline{TA}$, $\overline{\phi 2}$, $\overline{TB}$, and $\overline{S1}$. The output of NOR gate 391 appears on line 89-2 and is the BUS→CA control signal. A NOR gate 392 has five inputs comprising TA, $\overline{\phi 2}$, TB, the CLAU03 signal on line 440 and the $\overline{CALU10}$ signal on line 442. The output of NOR gate 392 passes through an inverter-push/pull driver combination 395 to produce on line 89-1 the CA→BUS control signal.

A timing signal TD is produced on line 508 and a controlled timing signal is produced on line 509. These two signals are used in a time slot end predictor which will be explained with reference to FIG. 27 hereinafter. The 508 signal TD, is produced by putting timing signals $\overline{TA}$ and $\overline{TB}$ through a NOR gate 393, the output of which is the TD signal. The 509 signal is produced by putting TA, TB, $\overline{CLAU03}$ on line 441 and CLAU10 on line 443 through a NOR gate 394, the output of which appears on line 509 and consists of the logic expression CALU03·CALU10·X2.

TIME SLOT END PREDICTOR

As stated before, the clocked logic for the microprocessor unit consists of four time slots — TD (FIG. 3j), X1 (FIG. 3k), X2 (FIG. 3l), and X3 (FIG. 3m).

These time slots are decoded from two timing signals TA (FIG. 3f) and TB (FIG. 3g). The four time slots are uniquely decoded from TA and TB by employing inverters and NOR gates. For example, in FIG. 24, timing signals TA and TB appear on lines 188 and 186 respectively. These signals are then placed through inverters 397 and 398 to produce two signals $\overline{TA}$ and $\overline{TB}$. Any one of these four timing signals, TA, $\overline{TA}$, TB, or $\overline{TB}$ is then placed into NOR gates to produce one of the four time slots. By way of example, the NOR gates used to produce the desired time slot may be any one of NOR gates 425 through 436. It should be pointed out that in other areas of the microprocessor unit the same means for locally decoding the time slot is presented through the use of inverters and NOR gates. In addition, some of the NOR gates also receive control signal inputs. For example, NOR gate 428 receives the $\overline{CALU05}$ and the $\overline{CALU11}$ control signals. NOR gate 435 receives a $\overline{CALU13}$ control signal.

An examination Also, FIG. 3 shows that the TA (FIG. 3f) and TB (FIG. 3g) signals change logic level when $\phi 1$ (FIG. 3c) is rising. In other words, TA and TB are switched by the $\phi 1$ clock. Alsok the decoded time slots TD, X1, X2, and X3 are sampled by the clock. It is also noted that $\phi 1$ and $\phi 2$ (FIG. 3d) are non-overlapping signals.

FIG. 27 discloses a circuit which predicts the end of a decoded time slot and deselects it with clock signal $\phi 1$, thus speeding up the deselection of the time slot and giving assurance that a time slot will not be falsely decoded.

FIG. 27 shows the circuitry used to develop a data register control signal $\overline{CDR00}$ on line 106-1. The purpose for this signal will be described hereinafter with reference to the data register 94. The two signals, TD and CALU03·$\overline{CALU10}$·X2 developed by the circuitry in FIG. 26 appear on lines 508 and 509 respectively. A control signal $\overline{CSP00-PLA}$ is received from the PLA control 100 on line 60-12. In addition, a clock signal is received on line 190 and a $\phi 2$ signal is received on line 163. The signal on line 508 is received at node A. The signal on line 60-12 is received at the gate enhancement-type field effect device 513 which has one of its regions tied to node A and its other region tied to ground. Also connected to node A is the first input or NOR gate 520. The circuitry comprising the time slot end predictor is coupled to node A. It consists of three enhancement-type field effect devices 514 through 516 which are configured as follows. Devices 514 and 515 are in series between node A and ground. Device 516 has one of its regions tied to node A and its other region tied to the gate of device 515. The gate of device 514 receive a $\phi 1$ signal on line 190 and the gate of device 516 receives a $\phi 2$ signal on line 510. The $\phi 2$ signal is obtained by taking the $\overline{\phi 2}$ signal on line 163 and passing it through an inverter 512.

A second time slot end predictor circuit appears at node B and comprises three enhancement-type field effect devices 517 through 519. Devices 517 and 518 are in series between node B and ground. Device 519 has one of its regions tied to node B and its other region tied to the gate of device 518. The gate of device 517 receives a $\phi 1$ signal on line 190 and the gate of device 519 receives a $\phi 2$ signal on line 510. The $\phi 2$ signal is obtained by taking the $\overline{\phi 2}$ signal on line 163 and passing it through an inverter 512.

The signals at nodes A and B are the input signals to NOR gate 520. The output of NOR gate 520 passes through an inverter-push/pull driver combination 521 whose output is a data register control signal $\overline{CDR00}$ which appears on line 106-1.

The control signal $\overline{CDR00}$ is made operative during the time slot TD and X2. As stated before, the TD and X2 time slots are produced by passing signals TA and TB through inverters and NOR gates. A time delay is experienced when a signal is passed through either an inverter or a NOR gate. In the preferred embodiment of the microprocessor chip, it was found that these time delays could be significant enough so that the control signal $\overline{CDR00}$ could be turned on a second time at X1 and at X3 because the nodes, A and B, will not have charged to a logic 1 fast enough. In order to compensate for this delay, the time slot end predictor circuitry is used. How the circuitry operates will be described with reference to node B with the realization that the same explanation applies to the circuitry at node A.

Figure 29:
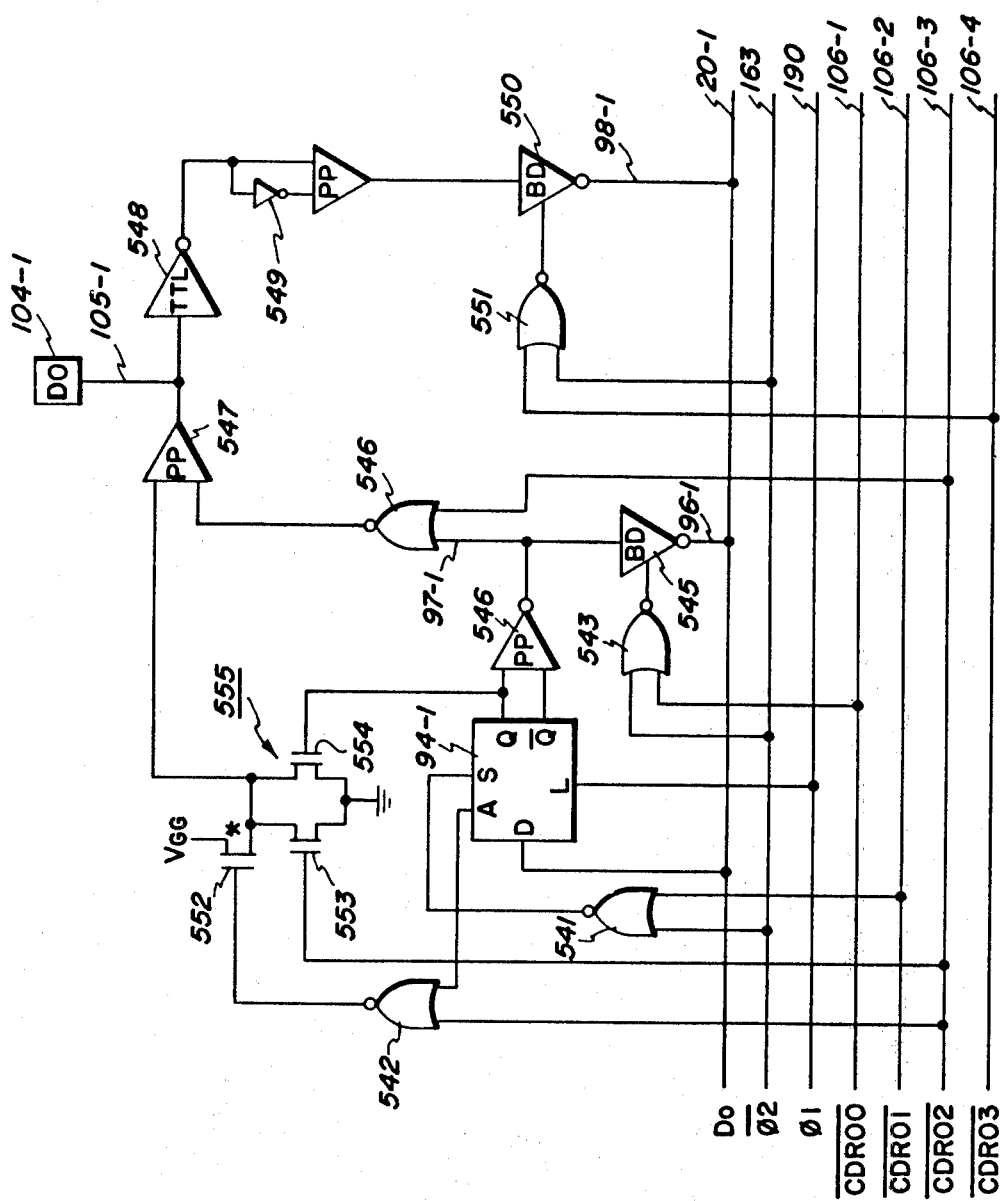
FIG. 29 is a detailed logic diagram of the input/output circuitry associated with the data pad and the data bus.

Signal $\overline{CDR00}$ is sampled during $\overline{\phi 2}$ as can be seen with reference to NOR gate 543 in FIG. 29. The circuitry in FIG. 29 will be explained in greater detail hereinafter. Suffice it to say at this point, time slot X2 on line 509 is caused to go high with the rising $\phi 1$. At the same time, $\phi 1$ causes device 517 to conduct. Device 518 does not conduct and, therefore, node B is fully charged to a logic 1. During $\phi 2$, device 519 is caused to conduct and, therefore, transfer charge from node B to the gate of device 518. At the next $\phi 1$ cycle, devices 517 and 518 are both conducting to draw off any charge at node B to ground. This will insure that even if there is a delay in the production of the X2 signal, all charge caused by the delay will be drawn off to end the time slot thus preventing a false decoding at time slot X3.

THE CONDITION DECODE ROM

The condition decode ROM, 28, is the structure used to decode the condition field of an instruction and comprises a CROM 85 which is essentially a 3-to-8 decoder and a CROM address register (CAR) 86. The CAR is made up of three sample and latch devices 86-1 through 86-3. These devices are latched at a rate $\phi$ as received from the clock 125. The three least significant bits of an instruction word are received from the data bus 20 via lines 87-1 through 87-3 and placed into the data inputs of the sample and latch devices 86. The input data is sampled at a rate determined by the signal received on line 89-2. The Q and $\overline{Q}$ outputs of the sample and latch devices are placed into the CROM 85 on lines 88-1 through 88-6. The output of the CROM appears on lines 90-1 through 90-8 and passes through inverting bus drivers 530 through 537 at a rate determined by the signal on line 89-1. The outputs of the bus drivers are then placed on the data bus 20 via lines 91-1 through 91-8. The operation of the condition decode ROM will be explained with respect to bit manipulation hereinafter.

BIT MANIPULATION SCHEME

In the preferred embodiment of the microprocessor chip, bit manipulation is performed directly and simply by the hardware. This decreases program memory requirements and increases processor performance. The bit manipulation scheme is concerned with three hardware structures or features of the microprocessor chip. The first hardware structure is the basic logic OR, logic AND, and logic complement functions of the ALU 52. The second basic structure is the branch-on-ALU-result-equals-zero and branch-on-ALU-results-notequal-zero capability of the PLA control unit 100. The third structure is the CROM structure illustrated in FIG. 28.

The bit manipulation hardware operates as follows. The least significant three bits of a given op-code which is assigned to bit manipulation is used as a bit number or bit mask field. That is, this field chooses one of eight bit-masks to be placed on the data bus 20 by the CROM 85. The contents of the bit-mask field together with the resulting bit mask is given in Table I. As can be seen from Table I, the CROM 85 generates a bit-mask in binary digits which is the complement of $2^i$ where i is the number in base 10 represented by the three least significant bits of a given op-code. For example, take the situation where the three least significant bits of a given op-code are 101. In base 10, binary 101 equals 5. Thus i=5 and $2^i$=32. Converting 32 to binary form yields 00100000. Taking the complement of this number yields 11011111, which is the bit-mask associated with the bit mask field 101. The bit-mask thus created is loaded into the B-Register 53 and operated upon as a normal eight bit operand into the ALU 52. A number of functions can now be performed using the bit mask in conjunction with the operands loaded from the RAM 3.

The following are some examples of bit manipulating operations.

Any bit in any register of the RAM 3, is reset to "zero" by loading the appropriate bit mask into the A-Register 54, loading the choosen RAM file register into the B-Register 53, performing the ALU operation of logic "AND" and storing the result back in the RAM 3.

Any bit in any register of the RAM 3 is set to "1" by loading the logic complement of the appropriate bit mask into the A-Register 54, loading the choosen RAM file register into the B-Register 53, performing the ALU operation of logic "OR," and storing the result back into the RAM 3.

Any bit in any register of the RAM 3 is tested for "zero" by loading the choosen RAM file register into the A-Register 54, loading the logic complement of the appropriate bit mask as the B-operand 53, performing the ALU operation of logic "AND" and branching on ALU result equal zero.

Any bit in any register of the RAM 3 is tested for "one" by loading the choosen RAM file register into the A-Register 53, loading the logic complement of the appropriate bit mask as the B-operand 53, performing the ALU operation of logical "AND" and branching on ALU result not equal zero.

Operations corresponding to those stated above with reference to the A-Register 53 may also be performed in a similar manner on individual bits in the T-Register 59 and the ST-Register 57.

DATA PAD INPUT/OUTPUT

FIG. 29 shows the circuitry involved in transmitting data from the data bus 20 to the data pad 104 and from the data pad to the data bus. The figure illustrates in logic form the circuitry associated with one data bit D0. It is to be understood that this circuitry is repeated for each of the data bits D0 through D7. The data pad carries the reference numeral 104-1 and the data bus carries the reference numeral 20-1. Two clock signals $\overline{\phi 2}$ on line 163 and $\phi 1$ on line 190 time the input/output operation. Four control signals $\overline{CDR00}$ through $\overline{CDR03}$ on lines 106-1 through 106-4, respectively, provide the control signals to the data I/O subsystem.

These signals are derived from the bus control 99 which will be described hereinafter. Data is received on the data bus by sample and latch device 94-1 via line 95-1. The sample and latch device is latched at a rate $\phi 1$ via line 190 and the data is sampled at a rate determined by the output of NOR gate 541 which receives its input from $\phi 2$ and $\overline{CDR01}$. The outputs of the sample and latch device pass through a push/pull driver 546 and appear on line 97-1. The signal appearing on 97-1 is then passed through a precharged data line driver 545 back to the data bus via line 96-1 at a rate determined by the output of NOR gate 543 which has as its inputs $\phi 2$ and $\overline{CDR00}$. The precharged data line driver 545 is illustrated in FIG. 46g, and will be explained in greater detail hereinafter. Alternatively, the signal on line 97-1 is supplied to one input of NOR gate 546 with $\overline{CDR02}$ providing the other NOR gate input. The output of NOR gate 456 is then placed into push/pull driver 547. The other input to the push/pull driver 547 is obtained as follows. NOR gate 542 has two inputs comprising the signal from node A of sample and latch device 94-1 and control signal $\overline{CDR02}$. See FIG. 46i for the location of node A in the circuitry comprising sample-and-latch device 94-1. At this point, reference is made to the NOR gate 555 which is shown as three field effect devices 552-554. This NOR gate provides a higher peak-to-peak output signal because the depletion field effect device 552 has one of its regions connected to voltage supply Vgg which is greater than that normally supplied to the other NOR gates. On the preferred embodiment Vgg is approximately 12 volts. Device 552 is driven by the output of NOR gate 542. Device 553 which provides one of the inputs to the NOR gate 555 is driven by $\overline{CDR02}$ and device 554 which provides the other input to the NOR gate 555 is driven by the Q output of sample and latch device 94-1. The output of the NOR gate 555 appears on line 556 and provides the other input to the push/pull driver 547. The output of the push/pull driver appears on line 105-1 which provides the signal to the data pad 104-1.

A signal appearing on the data pad may be placed onto the data bus in the following manner. An external signal applied to the data bus pad 104-1 appears on line 105-1 and provides an input signal into a TTL cpompatible input buffer 548. The output of the buffer passes through an inverter-push/pull driver combination 549 and then to a precharged data line driver 550 which is clocked at a rate determined by the output of NOR gate 551. The precharged data line driver 550 is illustrated in FIG. 46g, and will be explained in greater detail hereinafter. This NOR gate has two inputs comprising $\phi 2$ and $\overline{CDR03}$. The output of the bus driver 550 is placed on the data bus 20-1 via line 98-1.

PRECHARGED DATA LINE DRIVERS

As stated before all of the bus or line drivers are used in conjunction with precharged data lines. While any type of line driver known to those skilled in the art may be employed, the line driver as shown in FIG. 46g has been used in the preferred embodiment. How this line driver is configured and how it operates will be explained with reference to line driver 550 with the realization that the same explanation applies to the remaining line drivers.

As shown in FIG. 46g line driver 550 comprises three field effect devices 900-902. Two enhancement-type field effect devices 901 and 902 are connected in series with the drain of device 901 being connected to a precharged data line marked BUS. The source of device 902 is connected to ground. The gate of device 902 provides an input for data signals at point D. In the case of line driver 550 the data signals are received from the output of inverter-push/-pull driver combination 549. The gate of device 901 provides an input for timing-/control signals at point 5. For line driver 550 the timing/control signal is the output of NOR gate 551 which is $\phi 2 \cdot CDR03$. A depletion-type field effect device 900 has its drain coupled to a voltage source Vcc, and its source coupled to the series junction of devices 901 and 902. The gate of device 900 is tied to the source of device 900.

For line driver 550, the data line 20-1 is unconditionally charged to a logic 1 level. Thus, the line driver only has to conditionally discharge the line during data transmission. This operation is carried out by the two series devices 901 and 902. Device 901 enables the operation and device 902 determines if the line 20-1 is to be discharged. Device 900 prevents the precharged line 20-1 from losing charge due to charge redistribution during a time interval when the line is supposed to remain charged. The line driver 550 will in fact add charge to the data line 20-1 in that case.

BUS CONTROL

The bus control controls the bidirectional data bus buffers and the enabling of internal ROM onto the data bus. The bus control will be described with reference to FIGS. 30–33.

Three control signals, $\overline{CBC00}$, $\overline{CBC01}$ and $\overline{CBC02}$, are supplied to the bus control from the PLA control 100 via lines 102-1 through 102-3, respectively. These signals are then placed through inverter-double-push-/pull driver combinations 560 through 562 to yield six control signals CBC00, $\overline{CBC00}$, CBC01, $\overline{CBC01}$, CBC02, $\overline{CBC02}$ on lines 563–568. The signals appearing on lines 563–568 provide inputs to a series of NOR gates 569–574, the outputs of which are internal bus control signals. NOR gate 569 has as its input CBC02, CBC01, CBC00. The output of NOR gate 569 is internal bus control signal $\overline{CEXT00}$. NOR gate 570 has as its inputs $\overline{CBC02}$, CBC01, and $\overline{CBC00}$ to provide internal bus control signal CEXT03. NOR gate 571 has as its input CBC02, CBC01, and $\overline{CBC00}$ to provide internal bus control signal CEXT01. NOR gate 572 has as its input $\overline{CBC00}$, $\overline{CBC01}$, and CBC02 to provide internal bus control signal CEXT05. NOR gate 573 has as its input CBC00, CBC01 and $\overline{CBC02}$ to provide internal bus control signal CSP00. NOR gate 574 has as its input CBC00, $\overline{CBC01}$, and CBC02 to provide an internal bus control signal NULL. NOR gate 581 has as its input the following signals. CEXT05. CSP00, and NULL, to provide an output CBUS04-D on line 590 which is the output of inverter-push/pull driver combination 582. In the preferred embodiment gates 569–574 and 579–581 are implemented through the use of a programmable logic array. The purpose of this signal will be described with reference to FIG. 35 hereinafter.

Four signals are carried on lines 587–589 and 602. The signal on line 602 is called IOWR-D and represents the output of NOR gate 570. The signal on line 587 is called CSP00 and represents the output of NOR gate 573. The signal on line 588 is called $\overline{CBUS07-D}$ and is the output of inverter 579 which has as its input control signal CEXT01. The signal on line 589 is called $\overline{CBUS05-D}$ and is the output of NOR gate 580 which has as its inputs $\overline{CEXT00}$, CEXT01 and CEXT05. The purpose of these four signals will be described hereinafter with reference to FIG. 32. Control signal $\overline{CEXT00}$ is placed through an inverter-push/pull driver combination 575 to provide signal NMENRD-PLA on line 583. Control signal CEXT03 goes through inverter-push-/pull driver combination 576 (containing the same elements as 575) and appears as signal NIOWR-PLA on line 584. CEXT01 goes through combination 577 and appears as signal NIORD-PLA on line 585. CEXT05 goes through combination 578 providing output signal NINTA-PLA on line 586. The purpose of the signals appearing on line 583–586 will be described hereinafter with reference to FIG. 31.

Figure 30:
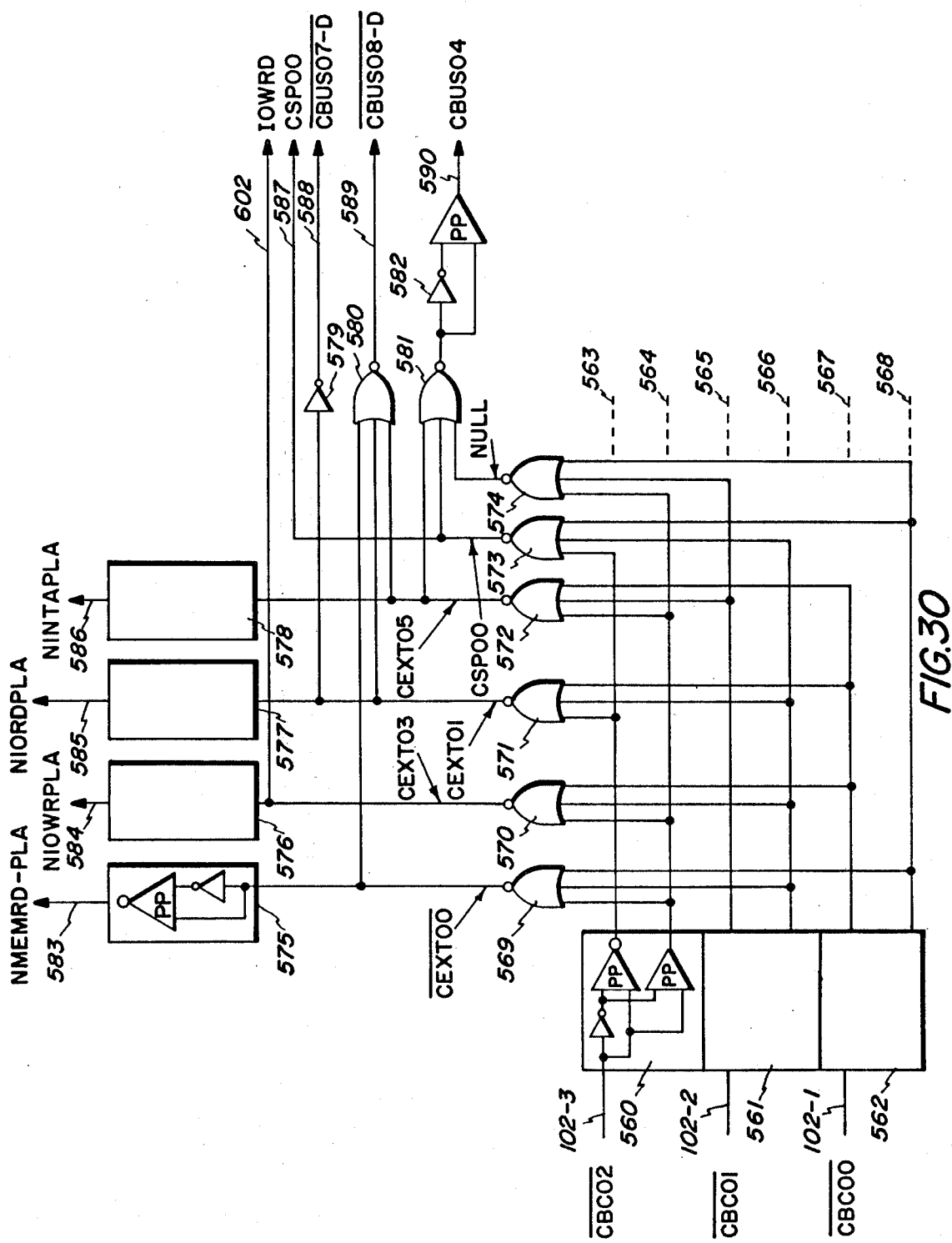
FIG. 30 is a detailed logic diagram of the bus control circuitry.
Figure 31:
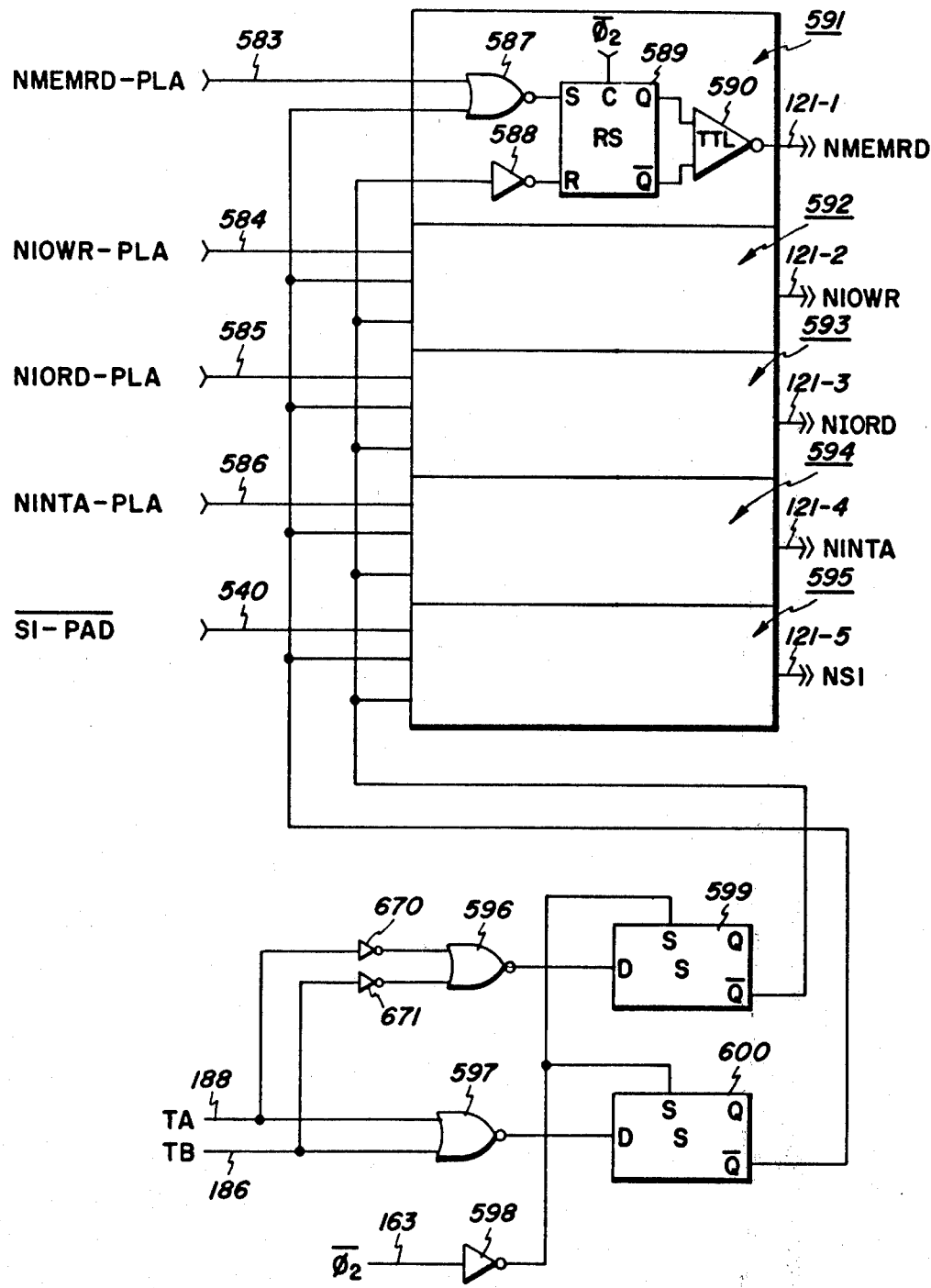
FIG. 31 is a detailed logic diagram of the circuitry associated with one of the test pads.

With reference to FIG. 31, the signals provided by the circuitry of FIG. 30 appear on lines 583 through 586. The NMEMRD-PLA signal on line 583 is placed into flip-flop circuitry 591 which has as its output the signal NMEMRD which appears on an output pad via line 121-1. The flip-flop circuitry 591 comprises a RS flip-flop 589, which is clocked at a rate $\phi 2$. The set signal input for the RS flip-flop is the output of NOR gate 587 which has as its input the signal on line 583 and the $\overline{Q}$ output of sample device 599. The reset signal for flip-flop 589 is the output of inverter 588 which has as its input the $\overline{Q}$ output of sample device 600. The Q and $\overline{Q}$ outputs of flip-flop 589 are fed into inverting TTL compatible output buffer 590 to produce the signal NMEMRD on line 121-1. Sample device 599 has as its data input the output of NOR gate 596 which has as its inputs the signals $\overline{TA}$ and $\overline{TB}$. These two signals are derived by passing timing signals TA and TB through inverters 670 and 671. Sample device 600 has as its data input the output of NOR gate 597, which has as its input the signals TA and TB. The sampling devices 599 and 600 are sampled at a rate $\phi 2$, which is the output of inverter 598 which has as its input the timing signal $\overline{\phi 2}$.

The signal NIOWR-PLA is placed into flip-flop circuitry 592, which has the same circuit elements as flip-flop circuitry 591, on line 584 to produce on an output pad via line 121-2 the signal NIOWR. The signal NIORD-PLA is placed into flip-flop circuitry 593, which has the same circuit elements as flip-flop circuitry 591, on line 585 to produce on an output pad via line 121-3 the signal NIORD. The signal NINTA-PLA is placed into flip-flop circuitry 594, which has the same circuit elements as flip-flop circuitry 591, on line 586 to produce on an output pad via line 212-4 the signal NINTA. The signal S1-PAD is placed into flip-flop circuitry 595, which has the same circuit elements as flip-flop circuitry 591, on line 540 to produce on an output pad via line 212-5 the signal NS1.

Figure 32:
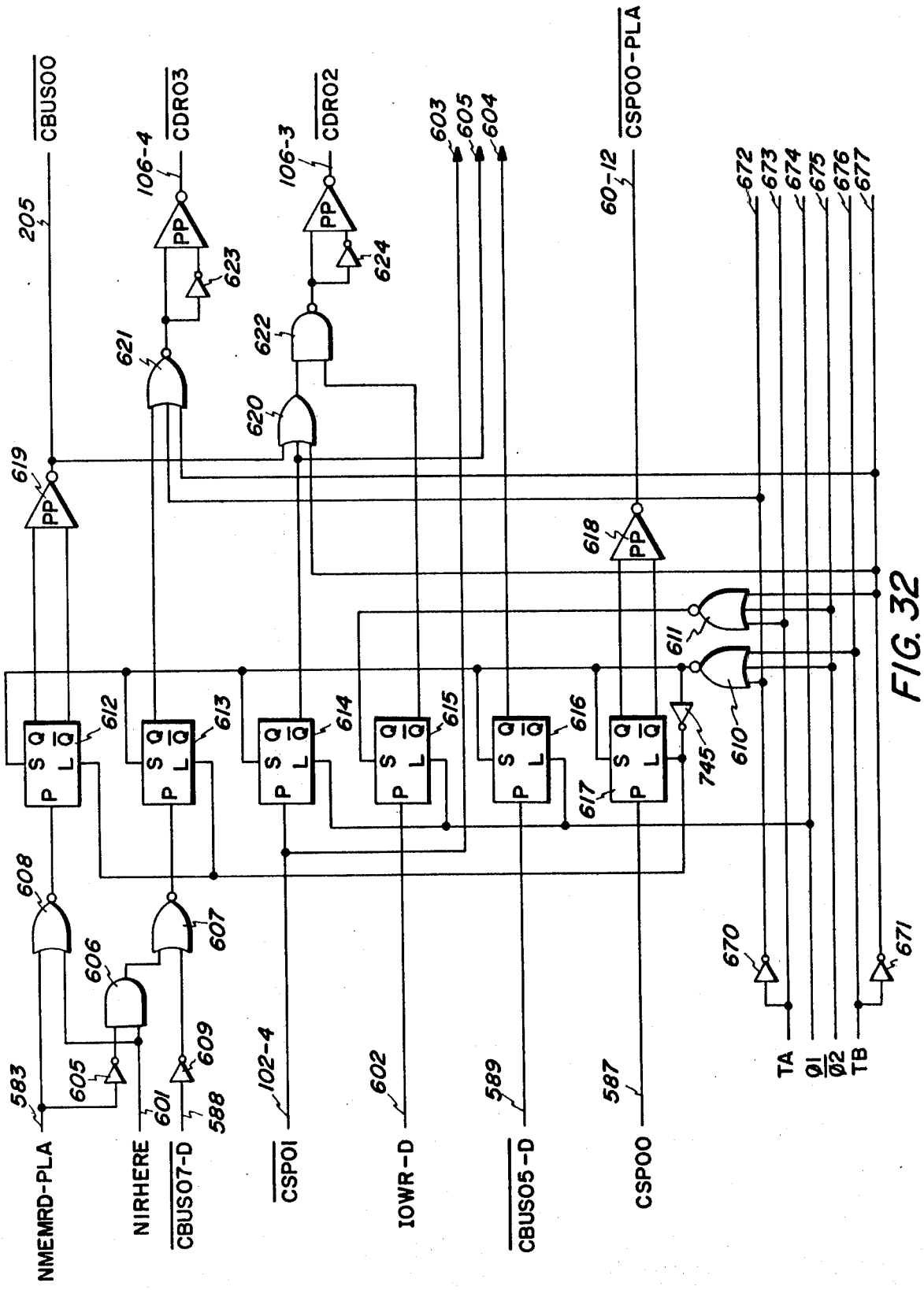
FIG. 32 is a detailed logic diagram of a portion of the bus control circuitry.

FIG. 32 shows additional circuitry used in developing bus control signals. The NMEMRD-PLA signal developed in FIG. 30 appears on line 583 and the NIRHERE signal which is developed by circuitry in FIG. 35 appears on line 601. These two signals are received by NOR gate 608, the output of which is placed into the data input of sample and latch device 612. Device 612, as well as the remaining sample and latch devices 613 through 617, sample data at a rate determined by the output of NOR gate 610 which has as its input $\overline{TA}$, $\phi 2$ and TB. These input signals are developed on lines 672 through 677 by taking the four timing signals TA, TB, $\phi 1$, and $\phi 2$ on line 673 through 676 and passing TA and TB through inverters 670 and 671 to develop the $\overline{TA}$ and $\overline{TB}$ on lines 672 and 677. The sample and latch device 612 is latched at a rate determined by the signal at the output of inverter 745 which has as its input and output signal of NOR gate 610. The Q and $\bar{Q}$ outputs of device 612 are placed into an inverter-push/pull driver combination 619 to produce the $\overline{CBUS00}$ control signal on line 205.

The $\overline{CBUS07\text{-}D}$ signal from FIG. 30 appears on line 588 and is placed into inverter 609 whose output is placed into NOR gate 607. The signal on line 583 passes through inverter 605 and into AND gate 606. Likewise, the signal on line 601 is placed into AND gates 606. The output of this AND gate supplies the additional input to NOR gate 607. The output of NOR gate 607 provides the data input to sample and latch devices 613 which is latched at the same rate as device 612. The Q output of device 613 is placed into NOR gate 621 which has additional inputs comprising $\overline{TA}$ and $\overline{TB}$ obtained from lines 672 and 677. The output of NOR gate 621 passes through inverter-push/pull driver combination 623. The output of this combination provides bus control signal $\overline{CDR03}$ on line 106-4.

Figure 41:
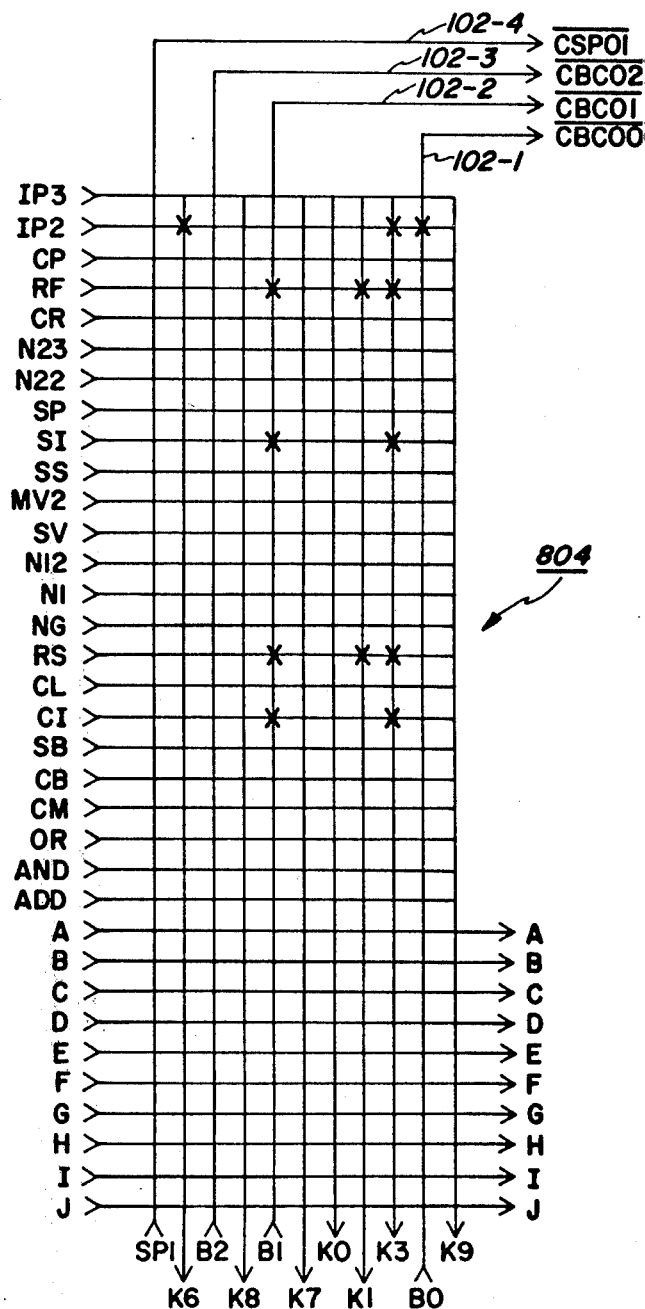
Figure 42:
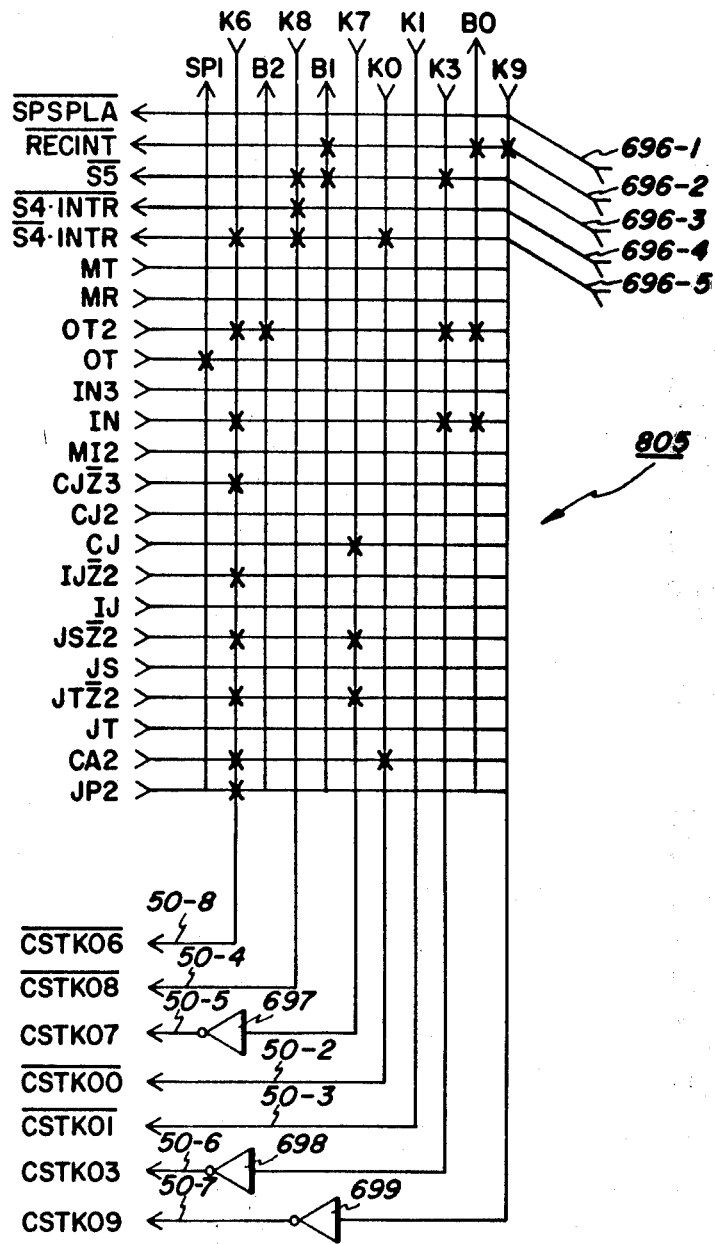

The $\overline{CSP01}$ signal from FIG. 41 appears on line 102-4 and provides the input to sample and latch device 614. This device is latched at a rate $\phi1$ which is obtained from line 674. The $\bar{Q}$ output of device 614 provides an input signal to OR gate 620. The additional inputs to the OR gate are provided by the signal on line 205 and the $\overline{TB}$ signal on line 677. The IOWR-D signal from FIG. 30 appears on line 602 and is placed into sample and latch device 615. This device is latched at a rate $\phi1$ in the same manner as device 614. The $\bar{Q}$ output of device 615 provides an input signal signal to NAND gate 622. The other input to the NAND gate is provided by the output of OR gate 620. The output of NAND gate 622 is passed through an inverter-push/pull driver combination 624 whose output provides bus control signal $\overline{CDR02}$ on line 106-3.

the CSP00 signal rom FIG. 30 appears on line 587 and provides the input to sample and latch device 617 which is latched in the same manner as devices 612 and 613. The Q and $\bar{Q}$ outputs of device 617 are placed into inverter-push/pull driver combination 618 to produce control signal $\overline{CSP00\text{-}PLA}$ on line 60-12 for use in FIG. 27.

The $\overline{CBUS05\text{-}D}$ signal from FIG. 30 appears on line 589 as the data input to sample and latch device 616. This device is latched in the same manner as devices 614 and 615. The Q output of device 616 provides a signal on line 604. In like manner, the $\bar{Q}$ output of device 614 provides a signal on line 605. The signal $\overline{CSP01}$ on line 102-4 provides a signal on line 603. The signals appearing on line 603 through 605 will be explained hereinafter with reference to FIG. 33.

Figure 33:
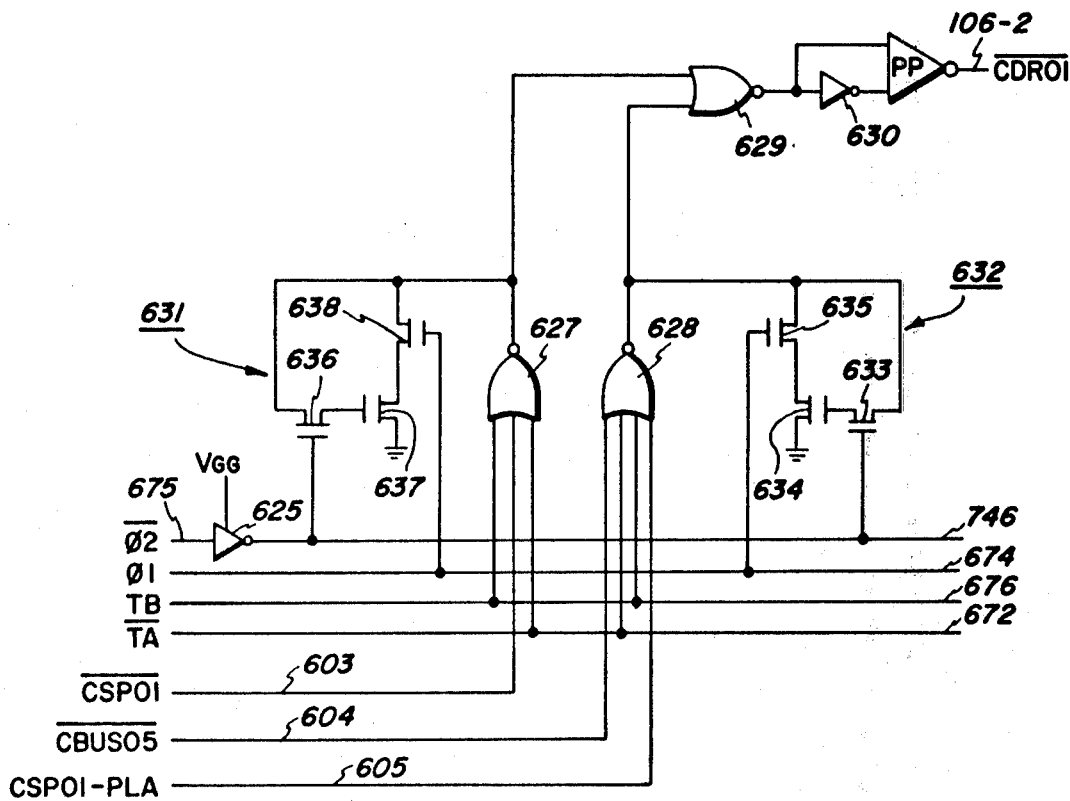
FIG. 33 is a detailed logic diagram of a portion of the bus control circuitry employing the time end predictor.

FIG. 33 shows additional circuitry used in developing a particular bus control signal. The signals from FIG. 32 appear on lines 603 through 605. In addition, the previous timing signals appear as follows; $\overline{TA}$ on line 672, TB on line 676, $\phi1$ on line 675 and $\bar{\phi}2$ on line 675. In this case, the $\bar{\phi}2$ signal is inverted by inverter 625 which obtains its power from voltage source Vgg to produce a $\phi2$ signal on line 746. NOR gate 627 receives from the aforementioned lines the following signals: TB, $\overline{TA}$, and $\overline{CSP01}$. The output of NOR gate 627 is connected to the following additional circuitry noted as 631. The 631 circuitry comprises two enhancement field effect devices 637 and 638 in series between ground and the output of NOR gate 627. The gate of device 638 receives the $\phi1$ signal from line 674. The gate of device 637 is connected to one region of device 636. The other region of device 636 is connected to the output of NOR gate 627. The gate of device 636 receives the $\phi2$ signal from line 746. NOR gate 628 receives from the aforementioned lines the following signals: TB, $\overline{TA}$, CBUS05 and CSP01-PLA. the output of NOR gate 628 is connected to the following additional circuitry noted as 632. The 632 circuitry comprises two enhancement field effect devices 635 and 637 in series between ground and the output of NOR gate 628. The gate of device 635 receives the $\phi1$ signal from line 674. The gate of device 634 is connected to one region of device 633. The other region of device 633 is connected to the output of NOR gate 628. The gate of device 633 receives the $\phi2$ signal from line 746. The 631 circuitry and the 632 circuitry each form a time slot end predictor, the operation of which was previously described with reference to FIG. 27.

The output of NOR gates 627 and 628 are placed into NOR gate 629, the output of which passes through inverter-push/pull driver combination 630 to provide as its output control signal $\overline{CDR01}$ on line 106-2.

TEST CIRCUITRY

Figure 34:
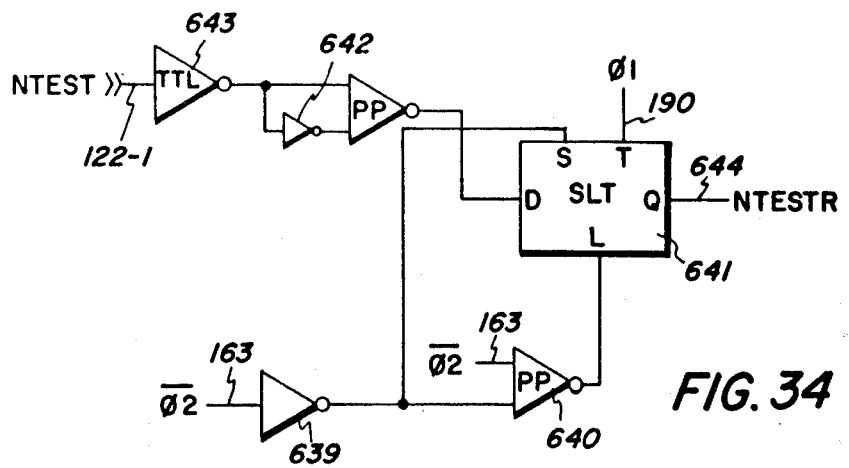
FIG. 34 is a detailed logic diagram of the circuitry associated with one of the test pads.

FIG. 34 shows the circuitry used to receive and synchronize the NTEST signal. An external signal NTEST is received on line 122-1 and passes through TTL compatible input buffer 643 and then through an inverter-push/pull driver combination 642 to provide an input to sample-latch-and-transfer device 641. The timing signals for the sample-latch-and-transfer device are provided as follows. A $\bar{\phi}2$ signal from clock 125 on line 163 is passed through inverter 639, the output of which is used to determine the sampling rate for the data in device 641. The output of inverter 639 is placed into an inverter-push/pull driver combination 640 along with the original $\bar{\phi}2$ signal. The output of the driver 640 provides the latch signal to device 641. The transfer signal is provided by $\phi1$ from clock 125 on line 190. The output of the device 641 provides the NTESTR signal on line 644.

Figure 35:
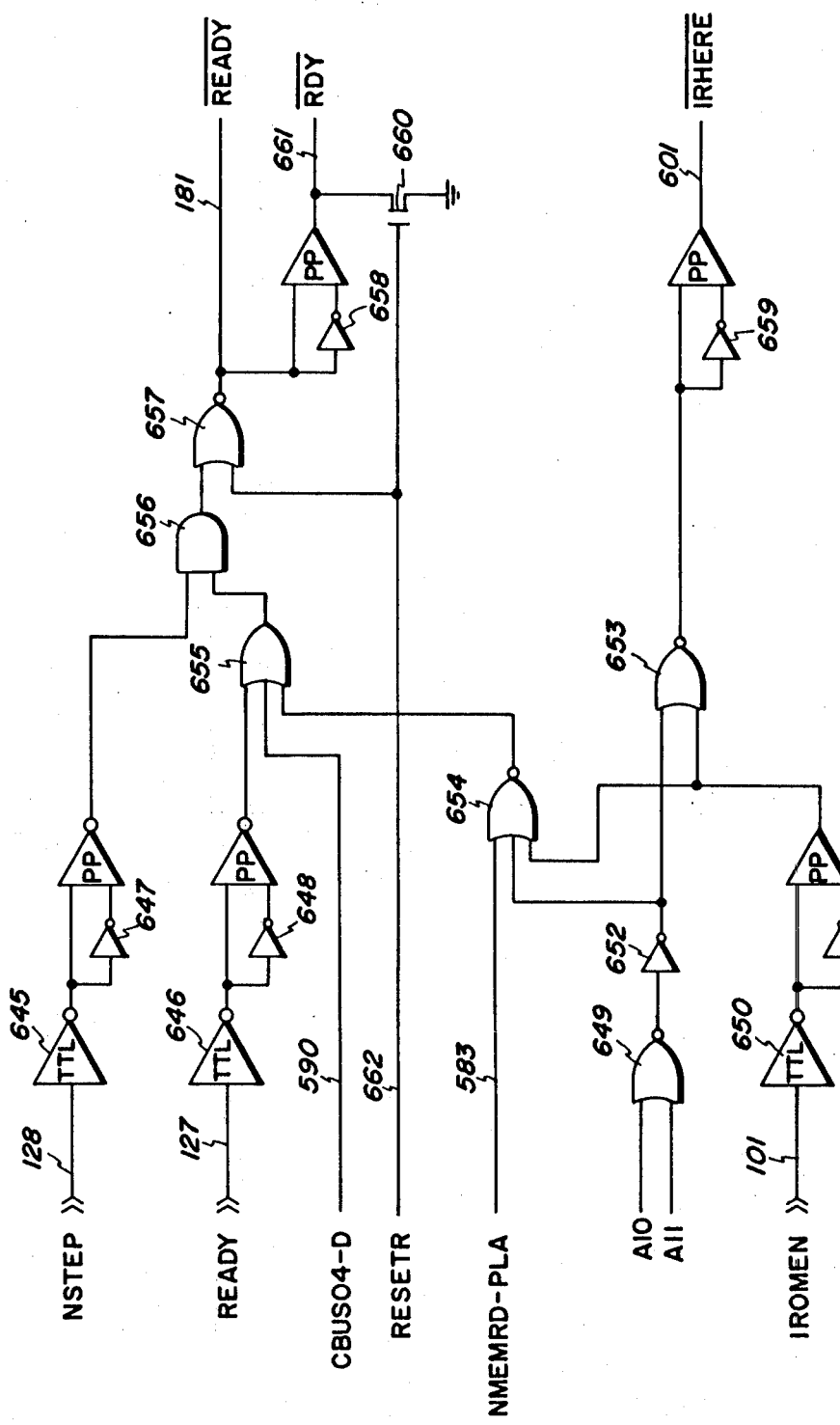
FIG. 35 is a detailed logic diagram of the circuitry responsive to STEP, READY, and IROM enable signals.

Additional test signals, as well as signals for use with slower external devices are provided by the circuitry shown in FIG. 35. The NSTEP signal appears on line 128 and passes through TTL compatible input buffer 645 and inverter-push/pull driver combination 647. The NSTEP signal is used to step the microprocessor through internal machine states. The condition NSTEP = 0 prevents the microprocessor from proceeding to its next machine state. In similar manner, the READY signal appears on line 127 and passes through TTL compatible input buffer 646 and then through inverter-push/pull driver combination 648. As explained previously, the READY signal is used to synchronize the microprocessor with slower external memory or I/O devices. The CBUS04-D signal from FIG. 30 is supplied on line 590 as an input to OR gate 655. The NMEMRD-PLA signal on FIG. 30 appears on line 583 as an input to NOR gate 654. The IROMEN signal appears on line 101 and passes through TTL compatible input buffer 650 then through inverter-push/pull driver combination 651 to provide an input signal to NOR gate 654 and NOR gate 653. The IROMEN signal is used to disable internal ROM thereby following external memory to be substituted in the O-IK (1024) address range. Address bit A10 and A11 from the memory address register appears as inputs to NOR gate 649, the output of which passes through inverter 652 and then into NOR gates 653 and 654.

The output of NOR gate 653 passes through inverter-push/pull driver combination 659, the output of which is the $\overline{\text{IRHERE}}$ signal appearing on line 601 and previously explained with reference to FIG. 32.

The output of NOR gate 654 provides an input to OR gate 655. The remaining input to OR gate 655 is supplied by the output of inverter-push/pull driver combination 648. The output of OR gate 655 provides an input to AND gate 656, the other input to this AND gate being supplied by the output of inverter-push/pull driver combination 647. The output of AND gate 656 provides an input to NOR gate 657. The other input to NOR gate 657 is provided by the RESETR signal appearing on line 662. The output of NOR gate 657 provides the $\overline{\text{READY}}$ signal on line 181. The signal on line 181 is additionally passed through inverter-push/pull driver combination 658 to provide the $\overline{\text{RDY}}$ signal on line 661 which is pulled down by enhancement field effect device 660 at a rate determined by the signal on line 662 which provides the control to the gate of device 660.

PLA CONTROL

Figure 36:
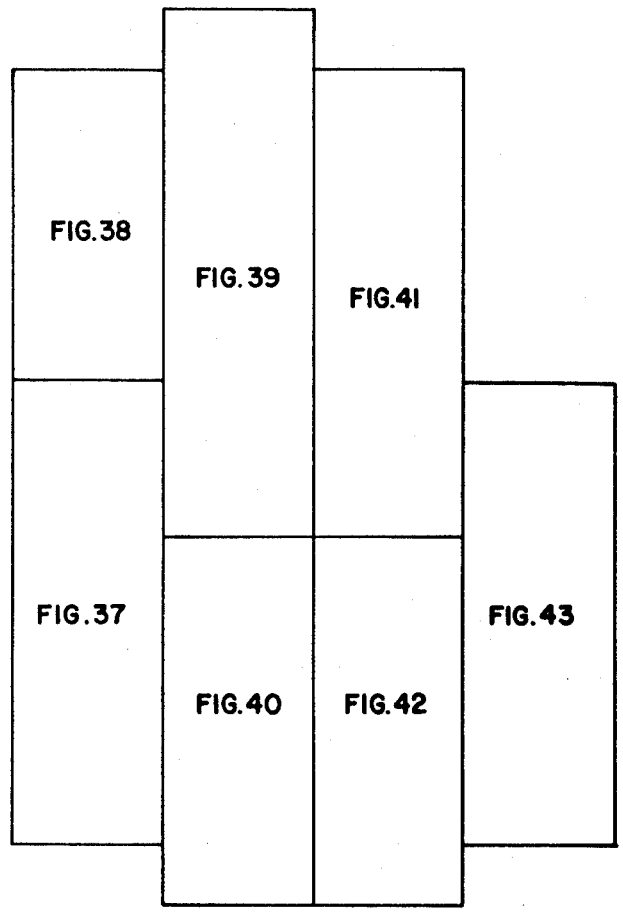
FIG. 36 is a block diagram showing how portions of the split PLA control are assembled.
Figure 37:
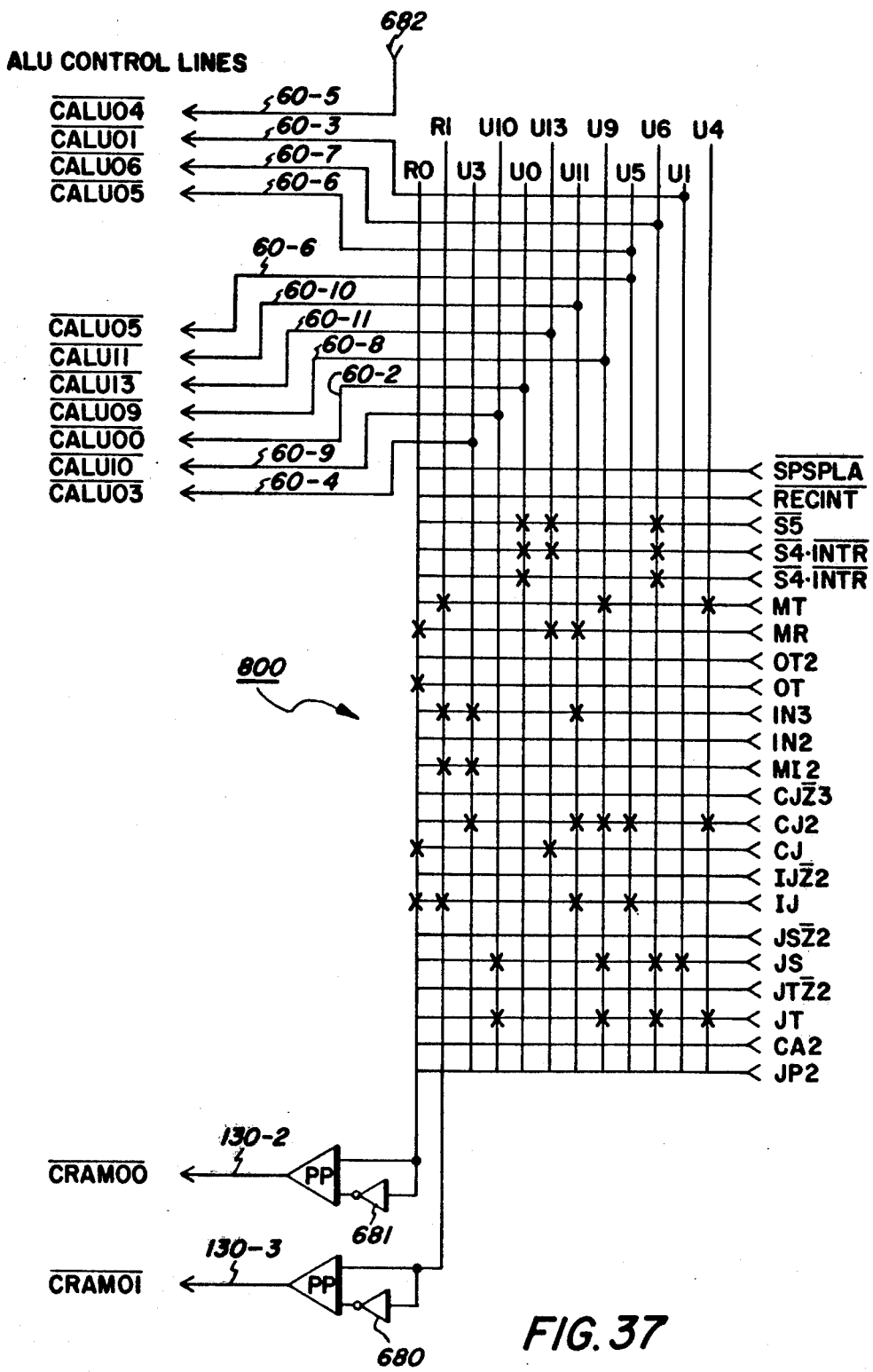
FIGS. 37-43 constitute detailed logic diagrams of the split PLA control.
Figure 38:
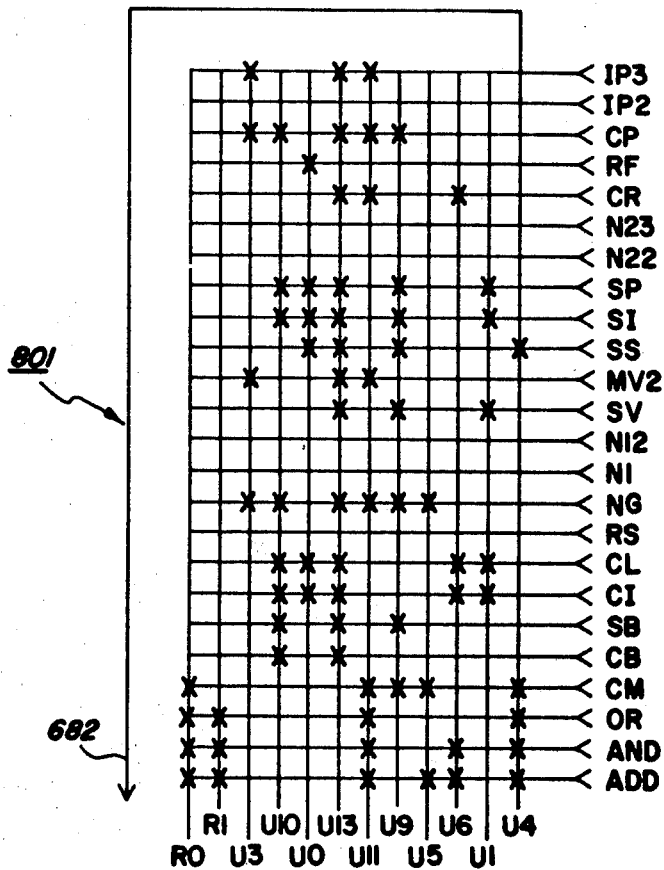

The control section is that portion of the microprocessor chip that generates internal commands, external interface commands and next-state feedback information to the S-counter. FIG. 36 illustrates the FIG. blocks 37 through 43 which make up the control.

The heart of the control is composed of a series of programmable logic arrays (PLA) that are implemented using NOR-NOR logic. IN discussing the PLA's, use will be made of the industry convention of AND-OR even though in the preferred embodiment, these functions are implemented using NOR-NOR logic.

It should be pointed out at this point that mask programmable logic arrays are used in the preferred embodiment.

Figure 39:
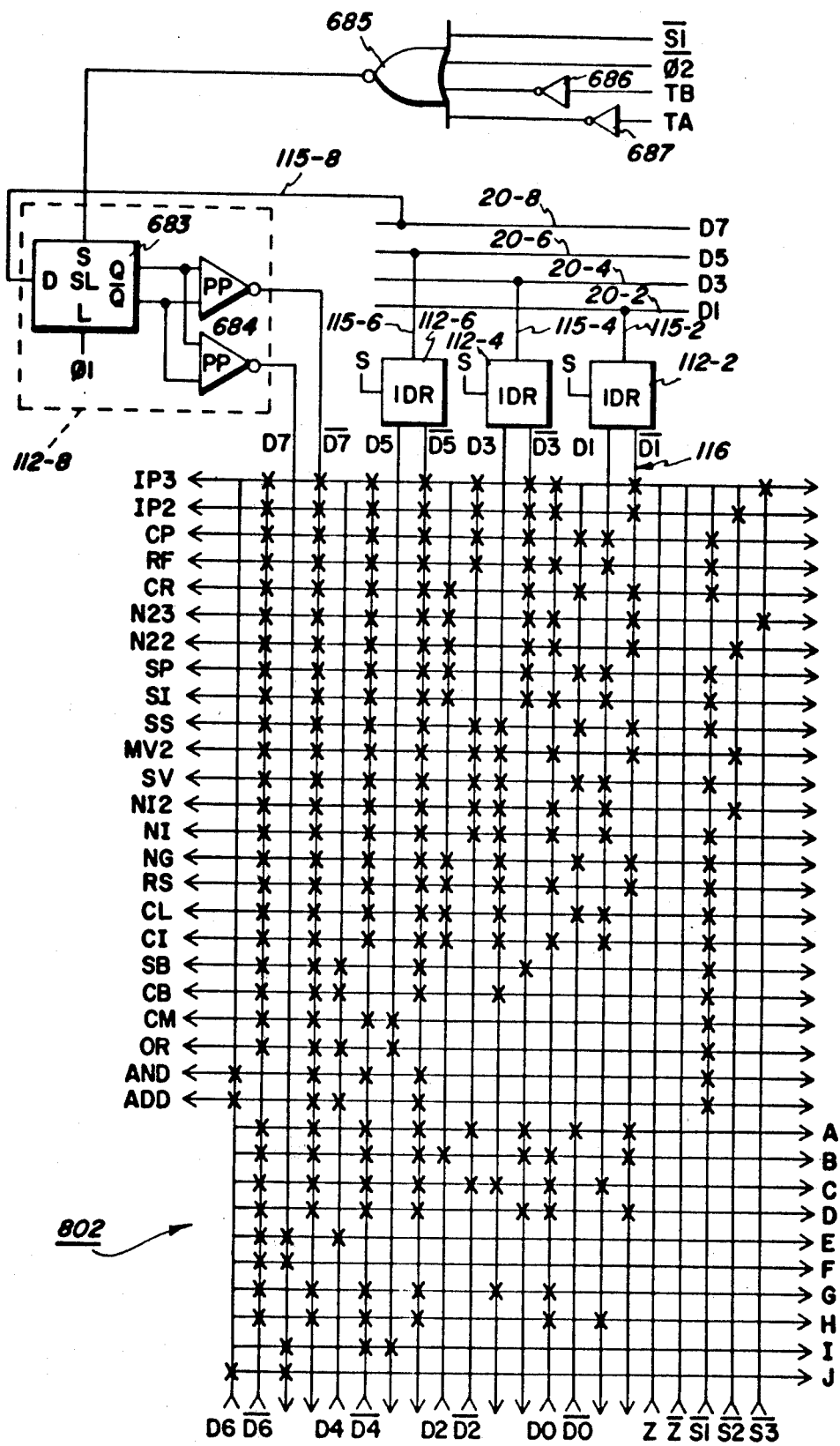
Figure 40:
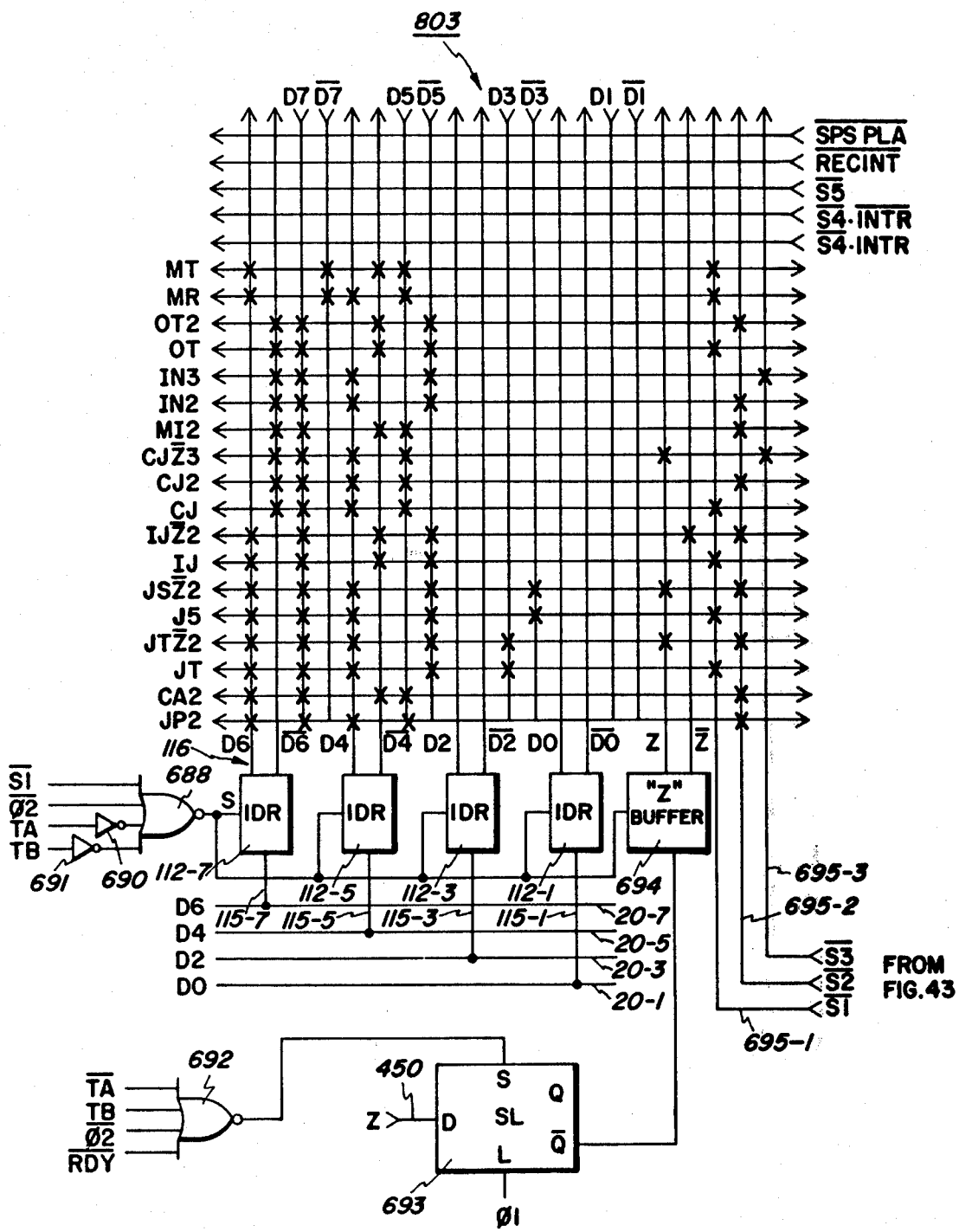

The main PLA is composed of the sections 800–805 which are illustrated in FIGS. 37 through 42. Sections 802 and 803 form the AND section of the PLA while sections 800, 801, 804, and 805 form the OR section of the PLA. The cross points within the various PLA sections show transistor connection points as will be described in detail hereinafter. With reference to FIGS. 39 and 40, data from the data bus 20 enters the AND PLA section via lines 115-1 through 115-8. Signals on these lines are placed into input data registers 112-1 through 112-8. A sample input data register is illustrated with respect to register 112-8. This instruction decode register comprises sample and latch device 683 which receives as its input data from the data bus line 20-8 via line 115-8. This device is latched at a rate $\phi 1$ and the data is sampled at a rate determined by the locally decoded output of NOR gate 685 which has as its input $\overline{S1}$, $\overline{\phi 2}$, $\overline{TA}$, and $\overline{TB}$. The $\overline{TA}$ and $\overline{TB}$ signals are received from the outputs of inverter 686 and 687. The Q and $\overline{Q}$ output of device 683 passes through double-push/pull drivers 684 to produce input signals to the AND PLA portion 802 on the lines marked D7 and $\overline{D7}$. IDR 112-2, 112-4, and 112-6 are configured in the same way as 112-8. IDR 112-1, 3, 5, and 7 are configured and operate in the same manner as the previously mentioned IDR's. However, for these IDR's, the sampling signal is locally decoded from the output of NOR gate 688 which derives its input signals in the same manner as NOR gate 685. As can be seen, the TA and TB input signals for NOR gate 688 are locally decoded through the use of inverters 690 and 691. Two additional input signals, Z and $\overline{Z}$, are derived from the Z buffer 694 which has the same circuit configuration as any one of the IDR's. the signal input to the Z buffer is obtained in the following manner. A sample and latch device 693 is provided to receive a signal from the ALU control on line 450. The device 693 latches at a rate $\phi 1$ and samples the input signal at a rate determined by the output of NOR gate 692. This NOR gate has as its input $\overline{TA}$, TB, $\overline{\phi 2}$, and $\overline{RDY}$. The Q output of the device 693 provides the input signal to the Z buffer 694.

Three additional signals $\overline{S1}$, $\overline{S2}$, and $\overline{S3}$, which appear on lines 695-1 through 695-3 are generated by the S-counter 113. How these signals are generated by the S-counter will be explained hereinafter. All of the aforementioned signals provide inputs to the AND section of the PLA. The outputs for the AND section are noted by the alphanumeric combinations on the left and right-hand sides of FIGS. 39 and 40. These illustration notations or terms are the instruction signals generated by the AND section. See Table II for the translation of the illustration notions into their instruction terms nmemonics. The meaning of the instruction command MNEMONIC will be explained hereinafter with reference to the explanation of the instruction set. However, at this point by way of example to show how the AND section of the PLA operates, consider the ADD illustration notation in FIG. 39. This notation represents the output of a NOR gate which has as its inputs the following signals — $\overline{D7}$, D6, $\overline{D5}$, D4 and $\overline{S1}$. As will be explained hereinafter, the OP-code for the command ADD is 1010XXXX (where X means don't care). Thus the four most significant bits of an instruction word provide the inputs to the AND section. Therefore, D7 = 1, D6 = 0, D5 = 1, and D4 = 0. Thus the input to the NOR gate formed by the PLA array is $\overline{D7}$ = 0, D6 = 0, $\overline{D5}$ = 0, and D4 = 0. In addition, since this operation is to be carried out during machine state S1 = 1, $\overline{S1}$ = 0. Thus the output of the NOR gate is 1 and ADD = 1 while all the instruction terms equal 0. These instruction terms are fed through the OR sections of the PLA to provide command signals to the various control lines. In order to conserve silicon real estate, the OR section has been split into two sections, the first comprising portions 800 and 801 and the second comprising portions 804 and 805. With reference to portions 800 and 801, the RAM control signals and the ALU control signals are generated. Within the OR sections 804 and 805 the bus control and stack control signals are generated. Thus, as can be seen in FIG. 41 for the ADD operation, none of the bus control or stack lines are used while on the remaining portions of the OR sections 800 and 801, $\overline{\text{CRAM00}}$ is logic 0, $\overline{\text{CRAM01}}$ is logic 0, ALU control lines $\overline{\text{CALU04}}$, $\overline{\text{CALU05}}$, $\overline{\text{CALU06}}$ and $\overline{\text{CALU11}}$ are logic 0 while the remaining ALU lines are logic 1. These control lines provide the signals to the various portions of the RAM and the ALU, as has been previously described, in order to carry out the ADD operation in combination with the timing signals generated by the clock and T counter 125.

Figure 43:
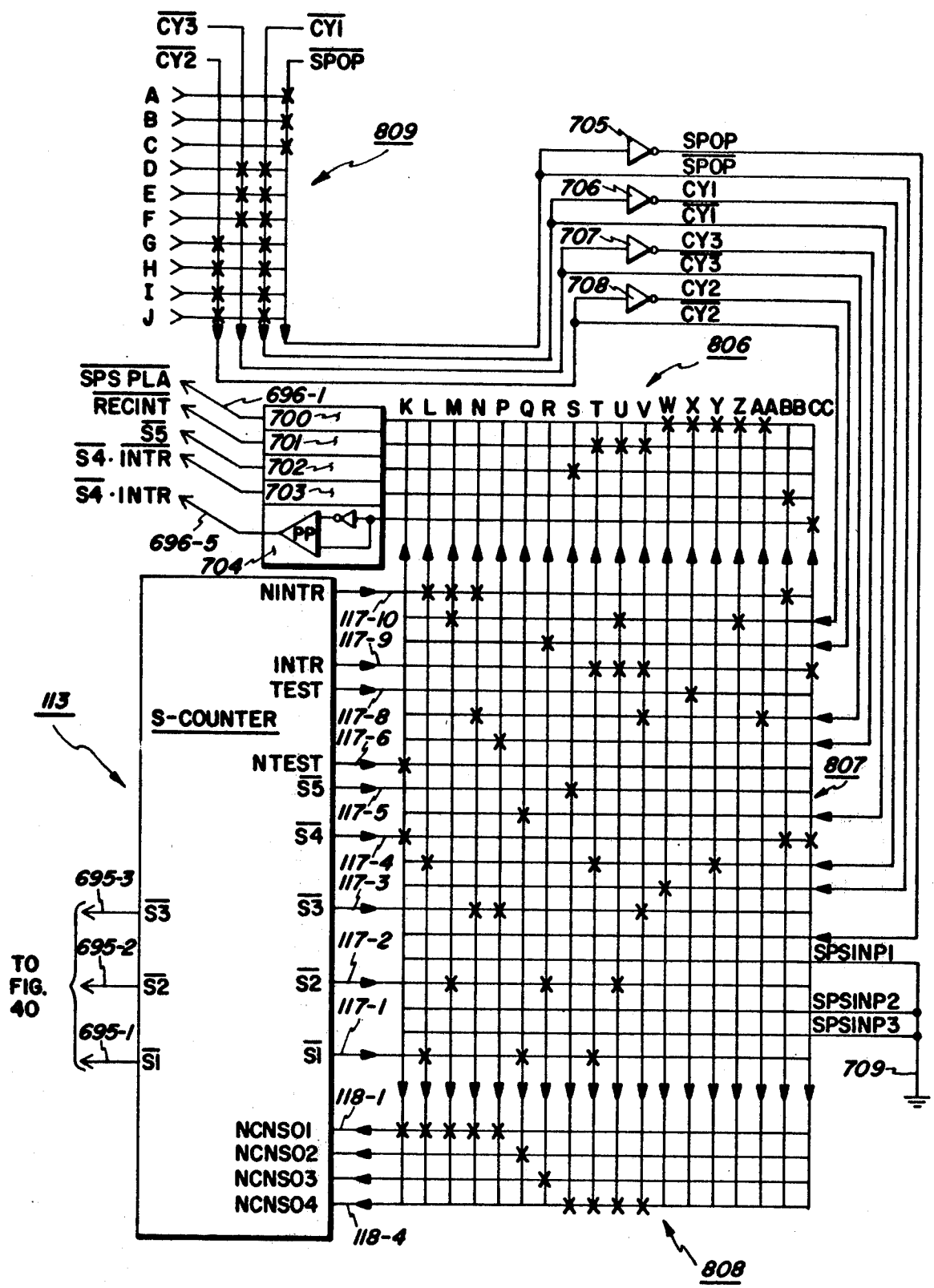

With reference to FIG. 43, there is shown an additional PLA array having AND section 807 and two OR sections, 806 and 808, each section located on either side of the AND section. This PLA is referred to as the sub-PLA and is associated, from a logic design point of view, with the S-counter 113. The sub-PLA operates in the same manner as that previously described with respect to the larger PLA, and receives as its inputs the outputs of the S-counter 113 on lines 117-1 through 117-10 as well as grounding inputs SPSINT1–SPINT3. These lines are connected to ground 709. Additional inputs are provided to the AND section of the PLA 807 in the following manner. A decoder 809 receives outputs from the AND PLA section 802 on lines A through J. These signals are decoded into four signals, $\overline{CY1}$, $\overline{CY2}$, $\overline{CY3}$, and $\overline{SPOP}$. These signals are then placed through inverters 705 through 708 to yield the following set of signals: SPOP, $\overline{SPOP}$, CY1, $\overline{CY1}$, CY3, $\overline{CY3}$, CY2, $\overline{CY2}$, which form the additional inputs to the AND section 807. The outputs of the AND section are provided on lines K through CC. The first OR section 806 takes these outputs and produces five signals on line 696-1 through 696-5 after passing through inverter-push/pull driver combinations 700 through 704. These signals are as follows: $\overline{SPSPLA}$, $\overline{RECINT}$, $\overline{S5}$, $\overline{S4\cdot INTR}$ and $\overline{SR\cdot INTR}$. These signals provide additional inputs to OR portions 804 and 805. Feedback from the PLA control is provided by the signals generated by OR section 808. These signals appear on line 118-1 through 118-4 and enter the S-counter as $\overline{CNS01}$ through $\overline{CNS04}$. The signals provided by the S-counter to AND section 803 appear on lines 695-1 through 695-3 and the S-counter 113. How the S-counter generates machine state signals and how it handles the feedback on lines 118 will be described in greater detail hereinafter.

THE S-COUNTER

Figure 44:
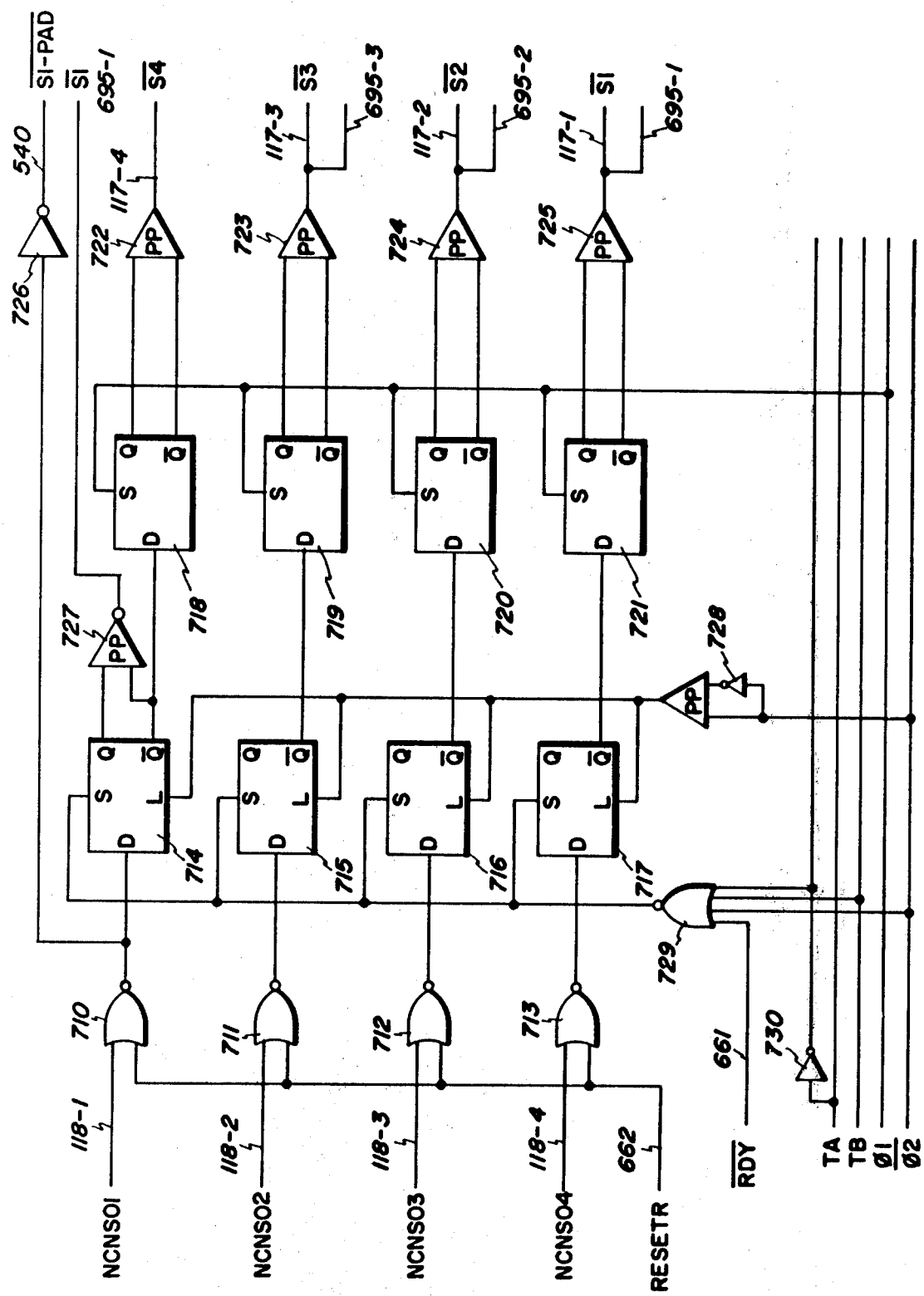
FIGS. 44-45 constitute a detailed logic diagram of the S-counter.

FIG. 44 illustrates the portion of the S-counter which receives the feedback signals from the sub-PLA control on lines 118-1 through 118-4. These signals are passed through logic circuitry within the S-counter to produce machine state signals on lines 117-1 through 117-4. How these signals are produced will be described as follows.

The signals NCNS01 through NCN204 on lines 118-1 through 118-4 are provided as input signals to NOR gates 710 through 713 respectively. The other inputs to these NOR gates comprise the signal RESETR on line 662. The output of NOR gate 710 is passed through inverter 726 to produce the $\overline{S1\text{-}PAD}$ signal on line 540. Four sample and latch devices 714 through 717 each receive one of the output signals from one of the NOR gates 710 through 713. The data is sampled by these sample and latch devices at a rate determined by the locally decoded output of NOR gate 729 which has as its input a $\overline{RDY}$ signal as well as $\overline{\phi 2}$, TB, and $\overline{TA}$, the $\overline{TA}$ signal being created locally by passing a TA signal through inverter 730. The sample and latch devices are latched at a rate $\phi 2$ after this signal has passed through inverter-push/pull driver combination 728.

The Q and $\overline{Q}$ outputs of device 714 are passed through inverting push/pull driver 727 which has as its output the S1 signal on line 695-1. The $\overline{Q}$ output of device 714 through 717 provide the inputs to sample devices 718 through 721, respectively. These devices sample data at a rate $\phi 1$. The Q and $\overline{Q}$ of the devices 718 through 721 are each connected to a push/pull driver 722 through 725 to produce machine state signals as follows. The output of driver 722 is the $\overline{S4}$ signal and appears on line 117-4. The output of driver 723 is the $\overline{S3}$ signal and appears on line 117-3. The output of driver 724 is the $\overline{S2}$ signal and appears on line 117-2. The output of driver 725 is the $\overline{S1}$ signal and appears on line 117-1. In addition, the $\overline{S2}$ also appears on line 695-2 and the $\overline{S3}$ signal appears on line 695-3 while the $\overline{S1}$ appears on line 695-1.

Figure 45:
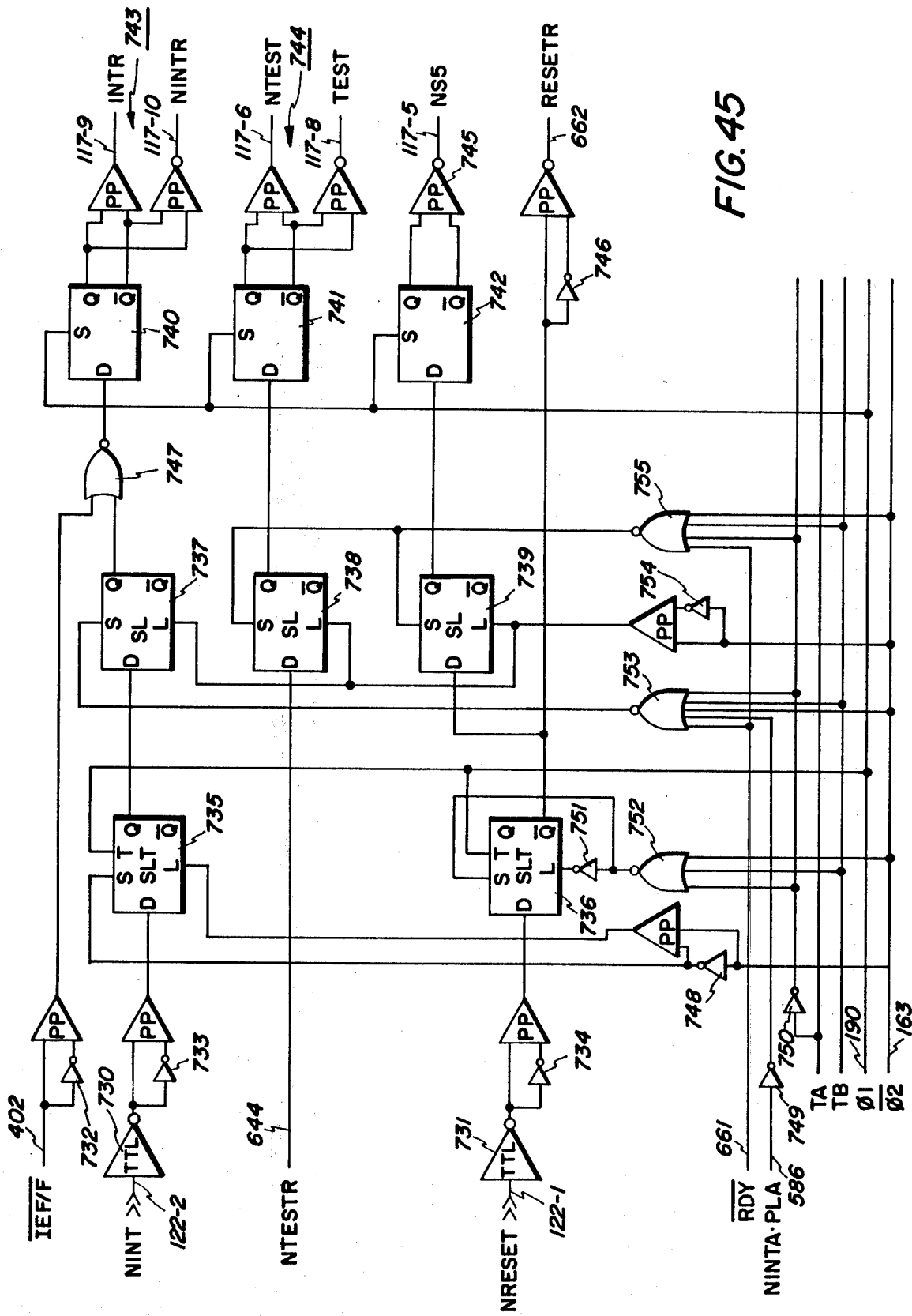

FIG. 45 shows the remaining circuitry of the S-counter. The remaining circuitry consists basically of the following elements. Two sample-latch-and-transfer devices 735 and 736 are provided. Device 735 samples data at a rate determined by the output of inverter 748 which has as its input $\phi 2$. In this device, data is latched at a rate $\phi 2$ after it passes through inverter-push/pull driver combination 748. The data is transferred at a rate $\phi 1$. In device 736, the data is sampled at a rate determined by the locally decoded output of NOR gate 752 which has as its input $\overline{TA}$, TB, and $\overline{\phi 2}$ with $\overline{TA}$ being decoded locally by passing TA through an inverter 750. The latch rate for device 736 is provided by the output of inverter 751 which inverts the output of NOR gate 752. Device 736 transfers data at a rate $\phi 1$. Three sample and latch devices 737 through 739 are provided. Device 737 latches data at a rate determined by the locally decoded output of NOR gate 753 which has as its input the $\overline{RDY}$ signal, $\phi 2$, $\overline{TA}$, TB, and the output of inverter 749 which has as its input NINTA-PLA, the signal received on line 586. The remaining devices 738 and 739 samples data at a rate determined by the locally decoded output of NOR gate 755 which has as its input $\overline{RDY}$, $\overline{TA}$, TB and $\overline{\phi 2}$. All of the devices 737–739 latch data at a rate $\overline{\phi 2}$ which is derived by taking $\phi 2$ from the timing bus, line 163, and passing it through inverter-push/pull driver combination 754. Three sample devices 740–742 are provided. All of these devices sample data at a rate $\phi 1$ taken from the timing bus, line 163.

The $\overline{IEF/F}$ signal appears on line 402 and passes through inverter-push/pull driver combination 732 to provide an input to NOR gate 747. An external signal NINT appears on line 122-2, passes through TTL input buffer 730, and then through inverter-push/pull driver combination 733 to appear as the data input into sample-latch-and-transfer device 737. The NINT signal, as explained before, is used to interrupt the normal operation of the microprocessor. The Q output of 735 is the data input to device 737. The Q output of device 737 is the second input into NOR gate 747. The output of NOR gate 747 is the data input to device 740. The Q and $\overline{Q}$ outputs of device 740 are connected to a double push-/pull driver combination 743 to provide the INTR signal on line 117-9 and the NINTR signal on 117-10.

The NTESTR signal is the data input to device 738. The Q output of device 738 is the data input to device 741. The Q and $\overline{Q}$ outputs of device 741 are connected to the double push/pull driver combination 744 to provide the NTEST signal on line 117-6 and the TEST signal on line 117-8.

An external NRESET signal appears on line 122-1, passes through TTL input buffer 731, and then inverter-push/pull driver combination 734. The NRESET signal forces the microprocessor into the reset state. The output of combination 734 is the data input to sample-transfer-and-latch device 736. The $\overline{Q}$ output of device 736 passes through inverter-push/pull driver combination 746 whose output is the RESETR signal on line 662. Likewise, the $\overline{Q}$ output of device 736 is the data input to device 739. The Q output of device 739 is the data input to device 742. The Q and $\overline{Q}$ outputs of device 742 are placed into an inverting push/pull driver 745 to produce the $\overline{S5}$ signal on line 117-5.

DETAILS OF LOGIC BLOCKS

In FIGS. 46a to 46n, the logic gates, inverters, etc. which are used in the system are shown in detail. Note that all of the devices with an asterisk (*) represent depletion field effect devices and those without an asterisk represent enhancement field effect devices.

THE MOS/LSI CHIP

The entire system described above is fabricated in a single MOS/LSI chip. An N-Channel silicon gate process is used, with ion-implant, for depletion loads. The chip contains 38 bonding pads, and is packaged in a conventional 40 pin, DIP package. Note that the ROM, RAM, and control PLA occupy the major part of the area of the chip. The chip is about 200 mills on a side.

THE CHIP TEST FUNCTIONS

The circuitry for operating the microprocessor chip in a test mode has been described in detail. The test mode would ordinarily be used in manufacture, either before or after the chips are sealed in the typical 40-pin package. The chips are made in batches of 145 at a time on a silicon slice of three-inch diameter; many slices would be processed at the same time. After all of the processing steps are complete, the slice is scribed and borken into individual chips as seen in FIG. 48. The yield of good devices from this process is always considerably less than 100 percent. Tests must be made to find out which slices are good, which chips on a slice are good, then which final packaged devices are good, since there can be attrition at each process step. This testing can become very time-consuming and expensive, because to be absolutely certain that every one of the approximately 18,000 transistors plus the assorted connections are all perfect, all of the routines of the microprocessor would have to be implemented. For this reason, the testing mode has been included to facilitate testing of the internal ROM. The procedure would be to directly check each of the 1,024 instruction words in the ROM, then exercise several thousand externally supplied instructions which are sufficient to check the remainder of the circuitry.

THE INSTRUCTION SET

Eight bit instruction words contained in the ROM 2 and read out onto the data bus 20 are of the format shown in FIGS. 47a–l, where each row in a block represents a word containing eight bits D0 to D7, D7 being the most significant bit, MSB. The word may be considered as having certain fields and subfields, which are different for various functions as shown in FIG. 47. The instruction set has 12 basic formats as shown in FIG. 47. Formats a, b, c, an d are used with branch and call instructions. Formats e, f, g, and h are used with move immediate and input/output instructions. Formats i and j are used for ALU instructions. Formats j, K, and l are used for NO OPERATION instructions. In addition, Format j is used for return instructions and control instructions.

A detailed description of one instruction set is set forth in Table III. Other instruction sets are possible by reprogramming the PLA control. The one described in Table III is used ful for machine control.

Although the invention has been described with reference to a specific embodiment, this description is not meant to be construed in a limiting sense. Various modifications of the disclosed embodiment, as well as other emboiments of the invention will become apparent to persons skilled in the art upon reference to the description of the invention. It is therefore contemplated that the appended claims will cover any such modifications or embodiments as fall within the trun scope of the invention.

TABLE I

| BIT-MASK FIELD | BIT-MASK (OUTPUT OF CROM) | $2^i$ |
|---|---|---|
| 000 | 11111110 | $2^0$ |
| 001 | 11111101 | $2^1$ |
| 010 | 11111011 | $2^2$ |
| 011 | 11110111 | $2^3$ |
| 100 | 11101111 | $2^4$ |
| 101 | 11011111 | $2^5$ |
| 110 | 10111111 | $2^6$ |
| 111 | 01111111 | $2^7$ |

TABLE II

| Illustration Notation | Instruction Command Mnemonic | Illustration Notation | Instruction Command Mnemonic |
|---|---|---|---|
| NT | S1.MOVr,T | IP3 | S3.INPT,a |
| MR | S1.MOVT,r | IP2 | S2.INPT,a |
| QT2 | S2.OUTa,r | CP | S1.CPL |
| QT | S1.OUTa,r | RF | S1.RFI |
| IN3 | S3.INPr,a | CR | S1.CLR |
| IN2 | S2.INPr,a | N23 | S3.NOP2 |
| MI2 | S2.MVIr,i | N22 | S2.NOP2 |
| COZ3 | Z.S3.LCJr,i,a | SP | S1.STP |
| CJ2 | S2.LCJr,i,a | SI | S1.STI |
| CJ | S1.LCJr,i,a | SS | S1.RSS |
| IJ22 | Z.S2.IJZr,a | MV2 | S2.MVIT,i |
| IJ | S1.IJZr,a | SV | S1.SVS |
| JSZ2 | Z.S2.JXXS | N12 | S2.NOP1 |
| JS | S1.JXXS | N1 | S1.NOP1 |
| JTZ2 | Z.S2.JXXT | NG | S1.NEG |
| JT | S1.JXXT | RS | S1.RFS |
| CA2 | S2.CALa | CL | S1.CLP |
| JP2 | S2.JMPa | CI | S1.CLI |
|  |  | SB | S1.STBb |
|  |  | CB | S1.CLBb |
|  |  | CM | S1.CMPr,T |
|  |  | OR | S1.IORr,T |
|  |  | AND | S1.ANDr,T |
|  |  | ADD | S1.ADDr,T |

TABLE III

INSTRUCTION SET

Figure 47:
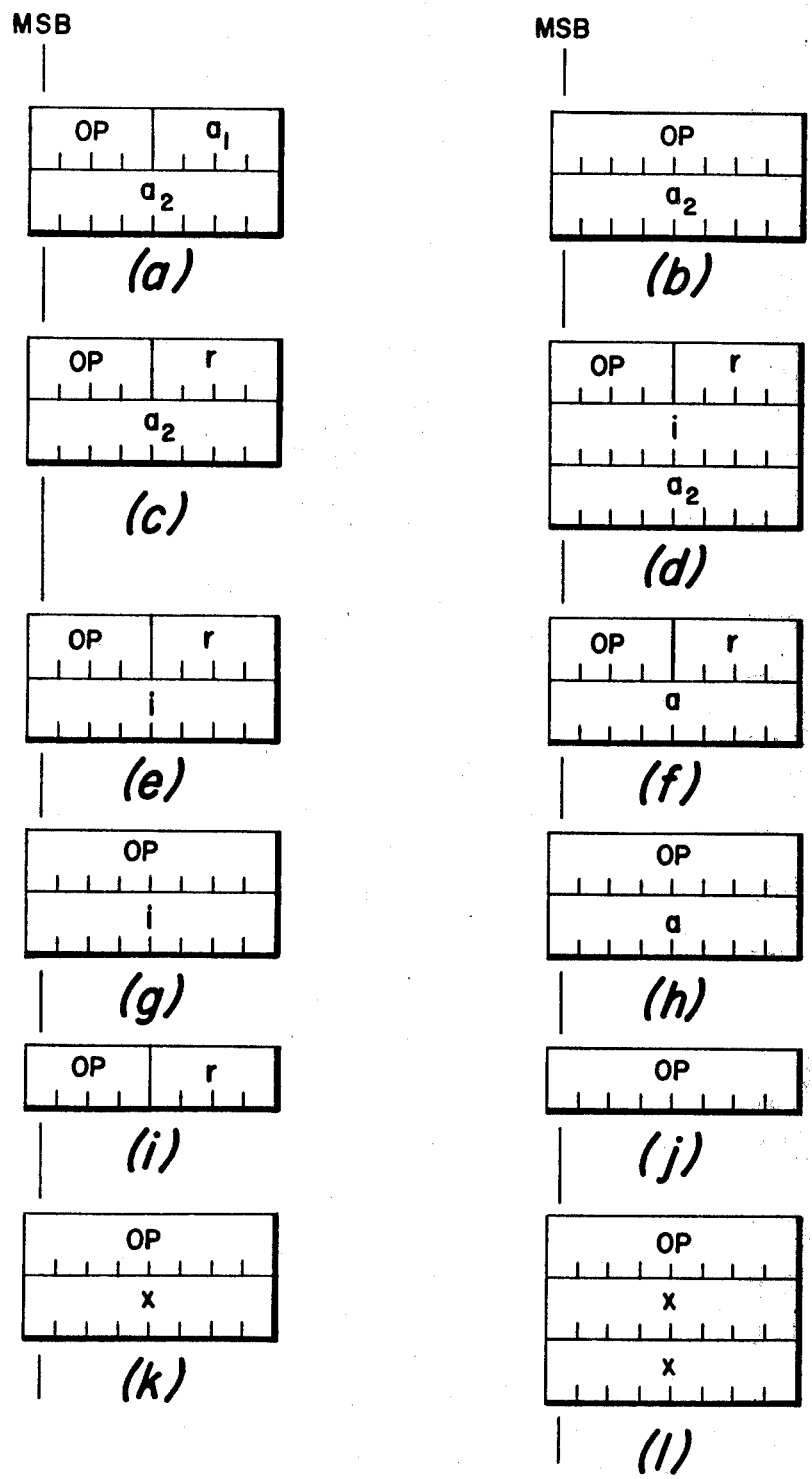
FIGS. 47a-l constitute block diagrams showing the various data formats of the instruction set.

| HEX OP-CODE | MNEMONIC | DESCRIPTION AND SEQUENCE | FLAGS AFFECTED | FORMAT FIGURE 47 |
|---|---|---|---|---|
| 0X | JMP a | JUMP TO ADDRESS a<br>a = a1 . a2→MA | NONE | (a) |
| 1X | CAL a | CALL SUBROUTINE AT a; PUT RETURN ADDRESS IN STACK.<br>a = a1 . a2→MA;MA #2→STACK | NONE | (a) |
| 20 | JT0 a | JUMP TO ADDRESS a IF BIT 0 of T IS TRUE.<br>IF T0 = 1, MA11-8 . a2→MA | NONE | (b) |
| 21 | JT1 a | JUMP TO ADDRESS a IF BIT 1 of T IS TRUE.<br>IF T1 = 1, MA11-8 . a2→MA | NONE | (b) |
| 22 | JT2 a | JUMP TO ADDRESS a IF BIT 2 of T IS TRUE.<br>IF T2 = 1, MA11-8 . a2→MA | NONE | (b) |
| 23 | JT3 a | JUMP TO ADDRESS a IF BIT 3 of T<br>IF T3 = 1, MA11-8 . a2→MA | NONE | (b) |

TABLE III-continued
INSTRUCTION SET

| HEX OP-CODE | MNEMONIC | DESCRIPTION AND SEQUENCE | FLAGS AFFECTED | FORMAT |
|---|---|---|---|---|
| 24 | JT4 a | JUMP TO ADDRESS a IF BIT 4 of T IS TRUE. IF T4 = 1, MA11-8 . a2→MA | NONE | (b) |
| 25 | JT5 a | JUMP TO ADDRESS a IF BIT 5 of T IS TRUE. IF T5 = 1, MA11-8 . a2→MA | NONE | (b) |
| 26 | JT6 a | JUMP TO ADDRESS a IF BIT 6 of T IS TRUE. IF T6 = 1, MA11-8 . a2→MA | NONE | (b) |
| 27 | JT7 a | JUMP TO ADDRESS a IF BIT 7 of T IS TRUE. IF T7 = 1, MA11-8 . a2→MA | NONE | (b) |
| 28 | JIF a | JUMP TO ADDRESS a IF INTERRUPT ENABLE FLIP-FLOP = 1. IF IE = 1, MA11-8 . a2→MA | NONE | (b) |
| 29 | JPF a | JUMP TO ADDRESS a IF PAGE FLIP-FLOP = 1. IF P = 1, MA11-8 . a2→MA | NONE | (b) |

| HEX OP-CODE | MNEMONIC | DESCRIPTION AND SEQUENCE | FLAGS AFFECTED | FORMAT |
|---|---|---|---|---|
| 2A | JCI a | JUMP TO ADDRESS a IF CARRY INTERMEDIATE FLAG = 1. IF CI = 1, MA11-8 . a2→MA | NONE | (b) |
| 2B | JZ a | JUMP TO ADDRESS a IF ZERO FLAG = 1. IF Z = 1, MA11-8 . a2→MA | NONE | (b) |
| 2C | JNZ a | JUMP TO ADDRESS a IF NOT ZERO FLAG = 1. IF NZ = 1, MA11-8 . a2→MA | NONE | (b) |
| 2D | JN a | JUMP TO ADDRESS a IF NEGATIVE FLAG = 1. IF N = 1, MA11-8 . a2→MA | NONE | (b) |
| 2E | JC a | JUMP TO ADDRESS a IF CARRY FLAG = 1. IF C = 1, MA11-8 . a2→MA | NONE | (b) |
| 2F | JNC a | JUMP TO ADDRESS a IF NOT CARRY FLAG = 1. IF NC = 1, MA11-8 . a2→MA | NONE | (b) |
| 3X | IJZ r,a | INCREMENT r AND JUMP TO ADDRESS a IF Z = 1. MA #1→MA; R#1→R; Z. (MA11-8,a2) + $\overline{Z}$ . MA#1→MA | Z,N,C,CI | (c) |
| 4X | LCJ r,i,a | LOAD T WITH R (R): COMPARE T TO I; JUMP ON NOT ZERO TRUE TO ADDRESS A. MA#2→MA; R (R)→T; T-I; Z. (MA11-8 . A2) + Z. MA#1→MA | Z,N,C,CI | (d) |
| 5X | MVI r,i | MOVE IMMEDIATE VALUE TO r (r) i→r (r) | NONE | (e) |
| 6X | INP r,a | LOAD R (R) WITH DATA OF INPUT DEVICE ADDRESSED BY A. INP (A)→R (R) | Z,N | (f) |
| 7X | OUT a,r | LOAD OUTPUT DEVICE ADDRESSED BY a FORM R (R) R (R)→OUT (A) | NONE | (f) |
| F6 | MVI T,i | MOVE IMMEDIATE VALUE TO T i→T | Z,N | (g) |
| FE | INP T,A | LOAD T WITH DATA FROM INPUT DEVICE ADDRESSED BY A. INP (A)→T | Z,N | (h) |
| 8X | MOV T,R | MOVE R (R) TO T R (R)→T | Z,N | (i) |
| 9X | MOV R,T | MOV T TO R (R) T→R (R) | NONE | (i) |
| AX | ADD R,T | ADD T TO R (R), RESULTS TO R (R) T#R (R)→R (R) | Z,N,C,CI | (i) |
| BX | AND R,T | LOGICAL AND T WITH R (R) RESULTS TO R (R) T . R (R)→R (R) | Z,N | (i) |
| CX | IOR R,T | LOGICAL INCLUSIVE-OR T WITH R (R), RESULTS TO R (R) T + R (R)→R (R) | Z,N | (i) |
| DX | CMP R,T | COMPARE T TO R (R) T − R (R) | Z,N,C,CI | (i) |
| E0 | CLB 0 | CLEAR BIT ZERO IN T, SET OTHER BITS TO "1" | NONE | (j) |
| E1 | CLB 1 | CLEAR BIT 1 IN T, SET OTHER BITS TO "1" | NONE | (j) |
| E2 | CLB 2 | CLEAR BIT 2 IN T, SET OTHER BITS TO "1" | NONE | (j) |
| E3 | CLB 3 | CLEAR BIT 3 IN T, SET OTHER BITS TO "1" | NONE | (j) |
| E4 | CLB 4 | CLEAR BIT 4 IN T, SET OTHER BITS TO "1" | NONE | (j) |
| E5 | CLB 5 | CLEAR BIT 5 IN T, SET OTHER BITS TO "1" | NONE | (j) |
| E6 | CLB 6 | CLEAR BIT 6 IN T, SET OTHER BITS TO "1" | NONE | (j) |

TABLE III-continued
INSTRUCTION SET

| | | | | |
|---|---|---|---|---|
| E7 | CLB 7 | CLEAR BIT 7 IN T, SET OTHER BITS TO "1" | NONE | (j) |
| E8 | STB 0 | SET BIT ZERO IN T, CLEAR OTHER BITS TO "0" | NONE | (j) |
| E9 | STB 1 | SET BIT 1 IN T, CLEAR OTHER BITS TO "0" | NONE | (j) |
| EA | STB 2 | SET BIT 2 IN T, CLEAR OTHER BITS TO "0" | NONE | (j) |
| EB | STB 3 | SET BIT 3 IN T, CLEAR OTHER BITS TO "0" | NONE | (j) |
| EC | STB 4 | SET BIT 4 IN T, CLEAR OTHER BITS TO "0" | NONE | (j) |
| ED | STB 5 | SET BIT 5 IN T, CLEAR OTHER BITS TO "0" | NONE | (j) |
| EE | STB 6 | SET BIT 6 IN T, CLEAR OTHER BITS TO "0" | NONE | (j) |
| EF | STB 7 | SET BIT 7 IN T, CLEAR OTHER BITS TO "0" | NONE | (j) |
| FD | CPL | COMPLEMENT T (ONE'S COMPLEMENT) $\bar{T} \rightarrow T$ | Z,N | (j) |
| F3 | NEG | NEGATE T (TWO'S COMPLEMENT) $-T \rightarrow T$ | Z,N,C,CI | (j) |
| FB | CLR | CLEAR T $0 \rightarrow T$ | Z,N | (j) |
| F2 | RFS | RETURN FROM SUBROUTINE; POP RETURN ADDRESS FROM STACK STACK$\rightarrow$MA | NONE | (j) |
| FC | RFI | RETURN FROM INTERRUPT; POP RETURN ADDRESS FROM STACK STACK$\rightarrow$MA | NONE | (j) |
| F0 | CLI | CLEAR INTERRUPT ENABLE FLIP-FLOP $0 \rightarrow IE$ | NONE | (j) |
| F8 | STI | SET INTERRUPT ENABLE FLIP-FLOP $1 \rightarrow IE$ | NONE | (j) |
| F1 | CLP | CLEAR PAGE FLIP-FLOP $0 \rightarrow P$ | NONE | (j) |
| F9 | STP | SET PAGE FLIP-FLOP $1 \rightarrow P$ | NONE | (j) |
| F5 | SVS | SAVE STATUS REGISTER ST$\rightarrow$T | NONE | (j) |
| F7 | RSS | RESTORE STATUS REGISTER T$\rightarrow$ST | Z,N,C,CI | (j) |
| F4 | NOP1 | NO OPERATION MA#2$\rightarrow$MA | NONE | (k) |
| FA | NOP2 | NO OPERATION MA#3$\rightarrow$MA | NONE | (l) |
| FF | NOP3 | NO OPERATION MA#1$\rightarrow$MA | NONE | (j) |

What is claimed is:

1. A circuit responsive to a timing signal and a data signal for discharging a precharged data line to correspond to the data to be transmitted on the data line comprising:
   (a) first and second enhancement-type field effect devices connected in series with the drain of said first device being connected to said data line and the source of said second device being connected to ground;
   (b) the gate of one of said devices providing an input for said timing signal;
   (c) the gate of the remaining device providing an input for said data signal; and
   (d) means coupled to the series connection point of said devices for charging said point when said second device is not conducting.

2. The circuit of claim 1 wherein said charging means comprises a depletion-type field effect device having its source and gate coupled to said series connection point and its drain connected to a drain voltage.

3. The circuit of claim 1 further comprising means for generating said timing signal.

4. The circuit of claim 3 wherein said generating means comprises a NOR gate having at least one input, said timing signal appearing as the output of said NOR gate.

5. The circuit of claim 1 wherein said data line is a data bus.

6. The circuit of claim 2 wherein said data line is a bit sense line.

7. The circuit of claim 1 further comprising means for precharging said data line to a referenced potential.

8. The circuit of claim 7 wherein said precharging means comprises a depletion-type field effect device having its source and gate coupled to said data line and its drain connected to a drain voltage.

9. The circuit of claim 7 further being responsive to a second timing signal and wherein said precharging means comprises an enhancement-type field effect device having its source coupled to said data line, its drain connected to a drain voltage, and its gate providing an input for said second timing signal.

* * * * *